United States Patent [19]

Kanai et al.

[11] Patent Number: 5,520,740
[45] Date of Patent: May 28, 1996

[54] PROCESS FOR CONTINUOUSLY FORMING A LARGE AREA FUNCTIONAL DEPOSITED FILM BY MICROWAVE PCVD METHOD AND APPARATUS SUITABLE FOR PRACTICING THE SAME

[75] Inventors: Masahiro Kanai, Tokyo; Jinsho Matsuyama, Nagahama; Katsumi Nakagawa, Nagahama; Toshimitsu Kariya, Nagahama; Yasushi Fujioka, Nagahama; Tetsuya Takei, Naghama; Hiroshi Echizen, Tokyo, all of Japan

[73] Assignee: Canon Kabushiki Kaisha, Tokyo, Japan

[21] Appl. No.: 459,485

[22] Filed: Jun. 2, 1995

Related U.S. Application Data

[63] Continuation of Ser. No. 302,221, Sep. 7, 1994, abandoned, which is a continuation of Ser. No. 140,971, Oct. 25, 1993, abandoned, which is a continuation of Ser. No. 834,852, Feb. 13, 1992, abandoned, which is a division of Ser. No. 543,499, Jun. 26, 1990, Pat. No. 5,130,170.

[30] Foreign Application Priority Data

Jun. 28, 1989 [JP] Japan ............................ 64-166231
Aug. 14, 1989 [JP] Japan ............................ 64-207850

[51] Int. Cl.[6] ............................................. C23C 16/00
[52] U.S. Cl. ..................... 118/718; 118/723 MW; 118/723 ME; 204/298.24; 204/298.38
[58] Field of Search ............... 118/723 MW, 118/723 ME, 723 MR, 723 MA, 725, 730, 729, 718, 719; 204/298.24, 298.38

[56] References Cited

U.S. PATENT DOCUMENTS

| | | | |
|---|---|---|---|
| 3,814,983 | 6/1974 | Weissfloch et al. | 315/39 |
| 4,441,974 | 4/1984 | Nishikawa et al. | 204/192 R |
| 4,515,107 | 5/1985 | Fournier et al. | 118/723 |
| 4,521,717 | 6/1985 | Kieser | 315/39 |
| 4,566,403 | 1/1986 | Fournier et al. | 118/718 |
| 4,619,729 | 10/1986 | Johncock et al. | 156/106 |
| 4,729,341 | 3/1988 | Fournier et al. | 118/723 |
| 4,893,584 | 1/1990 | Doehler et al. | 118/723 |
| 4,933,065 | 6/1990 | Seiler | 294/298.06 |
| 4,951,602 | 8/1990 | Kanai | 118/719 |
| 4,995,341 | 2/1991 | Matsuyama | 118/723 |
| 5,030,476 | 7/1991 | Okamura et al. | 118/723 X |

FOREIGN PATENT DOCUMENTS 61-288074  12/1986  Japan.

OTHER PUBLICATIONS

Gardiol, Introduction to Microwaves, 1984, pp. 34–35.
Translation of Japanese Application JP 61288074.

*Primary Examiner*—R. Bruce Breneman
*Assistant Examiner*—Joni Y. Chang
*Attorney, Agent, or Firm*—Fitzpatrick, Cella, Harper & Scinto

[57] ABSTRACT

A method for continuously forming a large area functional deposited film by a microwave plasma CVD process, said method comprises: continuously moving a substrate web in the longitudinal direction; establishing a substantially enclosed film-forming chamber having a film-forming space by curving and projecting said moving substrate web to form a columnar portion to be the circumferential wall of said film forming chamber on the way moving; introducing a film-forming raw material gas through a gas feed means into said film-forming space; at the same time, radiating or propagating microwave energy into said film-forming space by using a microwave applicator means capable of radiating or propagating said microwave energy with a directivity in one direction of microwave energy to propagate to generate microwave plasma in said film-forming space, whereby continuously forming a functional deposited film on the inner face of said continuously moving circumferential wall to be exposed to said microwave plasma.

An apparatus suitable for practicing said method.

12 Claims, 28 Drawing Sheets

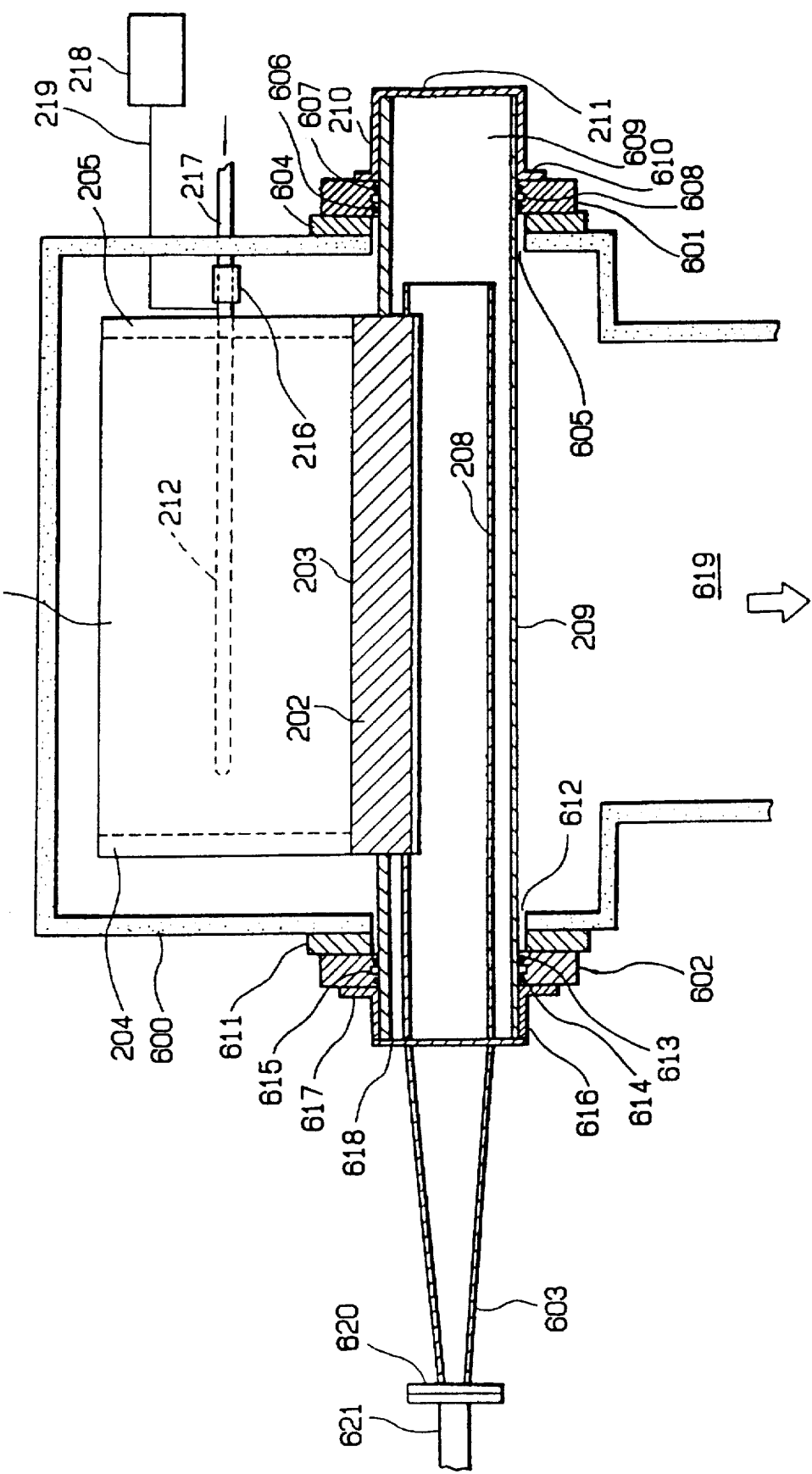

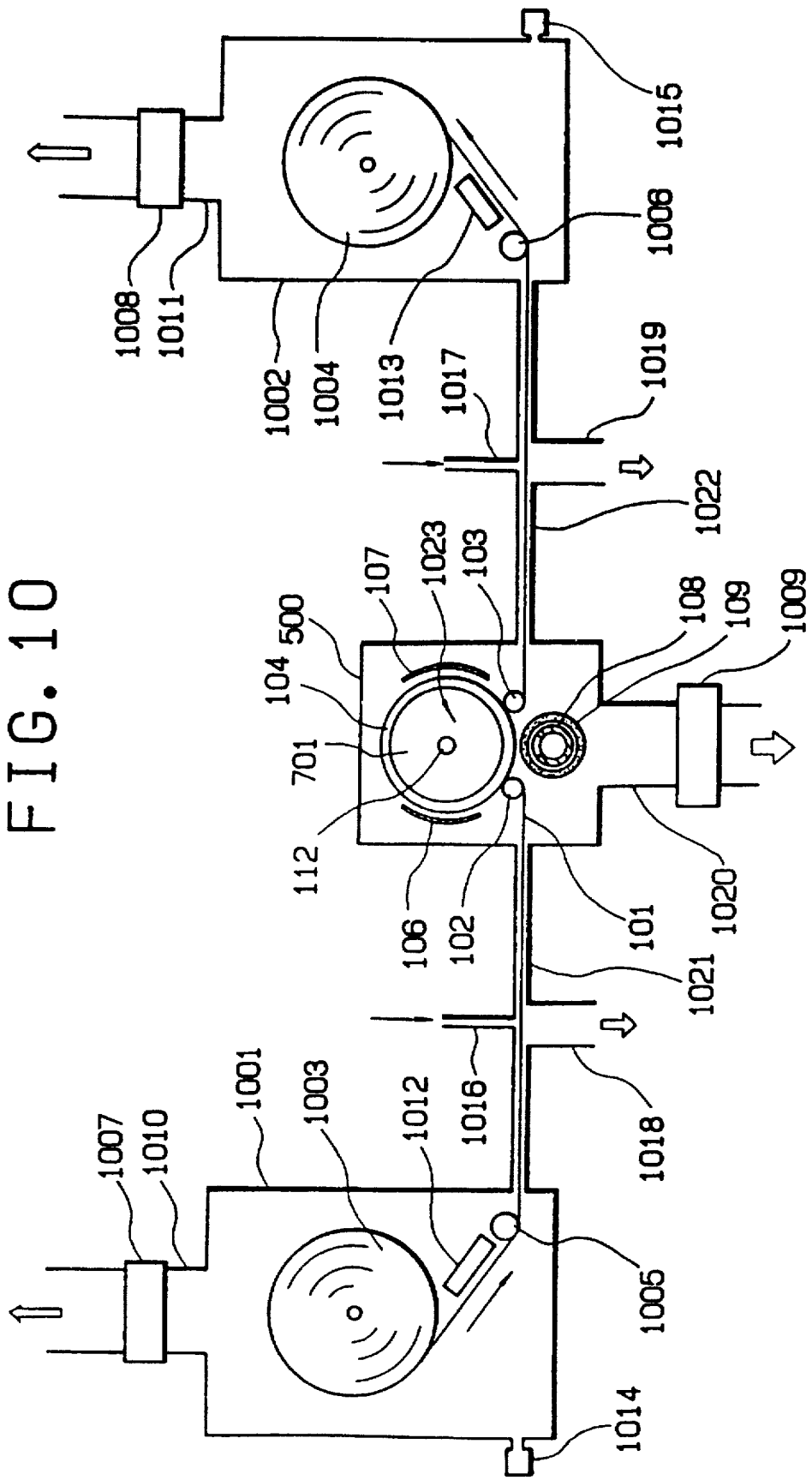

PROCESS FOR CONTINUOUSLY FORMING A LARGE AREA FUNCTIONAL DEPOSITED FILM BY MICROWAVE PCVD METHOD AND APPARATUS SUITABLE FOR PRACTICING THE SAME

This application is a continuation of application Ser. No. 08/302,221 filed Sep. 7, 1994, now abandoned, which is a continuation of application Ser. No. 08/140,971, filed Oct. 25, 1993 which is a continuation of application Ser. No. 07/834,852 filed Feb. 13, 1992, both abandoned, which is a division of application Ser. No. 07/543,499 filed Jun. 26, 1990 issued as U.S. Pat. No. 5,130,170 on Jul. 14, 1992.

BACKGROUND OF THE INVENTION

1. Field of the Invention

The present invention relates to a process for continuously forming a large area functional deposited film by sustaining a substantially uniform microwave plasma over a large area to cause plasma reactions by which a film-forming raw material gas is excited and decomposed, and to an apparatus suitable for practicing said process. More particularly, the present invention relates to a process for continuously forming a large area functional deposited film of uniform thickness with a markedly improved gas utilization efficiency of a film-forming raw material gas and at a high deposition rate by microwave PCVD method and to an apparatus suitable for practicing said process. The process and the apparatus enable one to mass-produce large area thin film semiconductor devices such as photovoltaic devices at a reduced cost.

2. Background of the Invention

Along with a marked increase of power generation in order to meet an increased demand for a means of power supply in recent years, problems of environmental pollution have become serious in the world.

In fact, for the atomic power generation system which has been anticipated as a power generation system capable of replacing the steam-power generation system and which has been operated in some places of the world, there occurred events in which the systems were broken down to cause radioactive contamination of living things including human. Because of this, there is a fear for further development of the atomic power generation system and there are some countries that already prohibit to newly establish an atomic power plant.

Now, in the case of the steam-power generation, the amount of a fossil fuel represented by coal or petroleum to be consumed for power generation in order to comply with a societal demand for increased power supply has been continuously increased and along with this, the amount of exhaust fumes from the steam-power generation plants has been continuously increased accordingly to raise the content of gases to cause a greenhouse effect such as carbon dioxide gas in the air. This results in providing an earth-warming phenomenon. In fact, the annual average temperature of the earth has been increased in recent years. In order to prevent said earth-warming phenomenon from further developing, the international Energy Agency has proposed to reduce the amount of carbon dioxide to be exhausted from the steam-power generation plant as much as 20% of the current level by the year 2005.

Against this background, there is a situation that the populations of developing countries will continue to increase and along with this, demand for power supply will be further increased. In addition to this, it is expected that the manner of living in the developed countries will be further modernized with further developments in electronic instruments and along with this, the amount of power consumption per person will be eventually increased.

In view of the above, the matter of power supply is now the subject to be internationally discussed in terms of the earth.

Under this circumstance, public attention has now focused on and various studies have been made on the power generation system using a solar cell since it has various advantages: it is a clean power generation system which is free of the foregoing problems relating to the radioactive contamination, earth-warming and environmental pollution; the sunlight to be used as its energy source reaches everywhere on the earth and there is not a problem that the energy source be localized; and the power generation equipment can be simplified and a relatively high power generation efficiency can be attained.

Now, in order for the solar cell power generation system to be made such that it can supply power in a quantity to satisfy the social demand, it is basically required that the solar cell to be used provide sufficiently high photoelectric conversion efficiency, it can stably exhibit solar cell characteristics and it can be mass-produced.

In order to provide the average family with the power to be consumed, a solar cell capable of outputting a power of about 3 KW is necessary. In this case, the photoelectric conversion efficiency of the solar cell should be about 10%. The solar cell is required to have an area of about 30 m$^2$ in order to provide said power. In the case where it is intended to satisfy the demands for power supply for 100,000 families, the solar cell is required to have an area of 3,000,000 m$^2$.

In view of this, the public attention has been focused on an amorphous silicon solar cell which is prepared by depositing a semiconductor film such as an amorphous silicon semiconductor film on a relatively inexpensive substrate such as glass or metal sheet wherein glow discharge is caused in a film-forming raw material gas such as silane gas, with the viewpoint that it can be mass-produced and it can be provided at a lower cost in comparison with a single crystal silicon solar cell. Various proposals have been made already on the amorphous silicon solar cells.

In the case of the power generation system using a solar cell, there is usually employed a system in which a plurality of unit modules are connected in series or in a row to be a unit from which a desired current or voltage can be obtained. For each of the plurality of modules, it is required that neither disconnection nor short circuits occur. It is further required that each of said plurality modules stably outputs an even current or voltage. In order to satisfy these requirements, it is necessary to prepare each unit such that its constituent semiconductor layer as a most important element be ensured to stably exhibit uniform characteristics required thereof.

Further, from the viewpoint of making it easy to design the module and also from the viewpoint of simplifying the process for assembling a plurality of unit modules into a unit, it is essential to provide a large area semiconductor film having uniformity not only in the thickness but also in quality and which is capable of exhibiting uniform semiconductor characteristics. These lead to enabling the mass-production of a solar cell and to extreme reduction in the production cost.

Now, in the solar cell, its constituent semiconductor layers, which are basically important constituent elements thereof, are conjugated to form semiconductor junctions, such as pn junctions or pin junctions. These semiconductor junctions can be attained by stacking different semiconductor layers respectively having a different conduction type one from another, or by ion-implanting or thermally diffusing a dopant of a different conduction type into one of the constituent semiconductor layers of the same conduction type.

This situation will be described in more detail in the case of the foregoing amorphous silicon solar cell. It is known that glow discharge is caused in a gas mixture composed of a film-forming raw material gas such as silane gas ($SiH_4$) and a raw material gas capable of supplying an element to be a dopant such as phosphine ($PH_3$) or diborane ($B_2H_6$) to form a semiconductor film having a desired conduction type. When a plurality of semiconductor films respectively having a different conduction type are formed successively on a substrate in this manner, these semiconductor films are conjugated to form desired semiconductor junctions. In view of this, there have been made various proposals that respective constituent semiconductor layers are separately formed in the respective independent film-forming chambers to stack them on a substrate to form a desired semiconductor junction between each pair of the semiconductor layers stacked, whereby obtaining an amorphous silicon solar cell.

For instance, the specification of U.S. Pat. No. 4,400,409 discloses a continuous plasma CVD apparatus wherein a so-called roll-to-roll system is employed. The continuous plasma CVD apparatus comprises a plurality of RF glow discharge regions through each of which regions a substrate web on which a film is to be formed is moved. The specification describes that said apparatus makes it possible to prepare an element having one or more semi-conductor junctions by forming a semiconductor film of a desired conduction type on said substrate web in each of said plurality of RF glow discharge regions while moving said substrate web. The specification describes that a gas gate is provided between the adjacent glow discharge regions in order to prevent a raw material gas used in one glow discharge region from entering into other glow discharge regions. In more detail in this respect, said plurality of glow discharge regions are isolated one from the other by an isolation passageway provided with means for forming a cleaning gas stream of Argon, $H_2$, etc. It can be said that this roll-to-roll plasma CVD apparatus will be suitable for the mass-production of a semiconductor device. However, this roll-to-roll plasma CVD apparatus is problematic in the case of mass-producing a semiconductor device with a plurality of semiconductor junctions in that, since each of the constituent semiconductor layers is formed by the plasma CVD method using RF energy, there is a limit for continuously forming those constituent semiconductor layers at a high deposition rate while maintaining the characteristics desired for each of those constituent semiconductor layers. That is, even in the case of forming a thin semiconductor layer of, for example, about 5000 Å, it is necessary to always sustain a substantially uniform plasma over a large area. However in this roll-to-roll plasma CVD apparatus, there are many correlated film-forming parameters which are difficult to be generalized and well-skilled technicians are required to do so. In addition to this, there are still other unresolved problems for the roll-to-roll plasma CVD apparatus in that the decomposition rate and the utilization efficiency of a film-forming raw material gas are not sufficient and thus the product becomes unavoidably costly.

Japanese Unexamined Patent Publication Sho. 61(1986)-288074 discloses a roll-to-roll film-forming apparatus comprising a reaction chamber containing a hood-like shaped curtaining portion of a flexible substrate web which is delivered by a pay-out mechanism and taken up by a take-up mechanism, said reaction chamber having a reaction space circumscribed by said hood-like shaped curtaining portions, and said reaction chamber being provided with at least an activation chamber isolated from said reaction chamber. The film formation by this apparatus is carried out by introducing active species formed in said activation chamber and if necessary, other film-forming raw material gas into said reaction space, wherein they are chemically reacted by the action of a heat energy to form a deposited film on the inner surface of said hood-like shaped curtaining portion positioned in said reaction chamber. This roll-to-roll film-forming apparatus is advantageous from the viewpoint that the apparatus can be relatively compact and the deposition rate of a film to be formed may be improved because of using an active species in comparison with the known plasma CVD apparatus.

The film formation by this roll-to-roll film-forming apparatus utilizes the chemical reaction to cause film formation with the aid of heat energy. Therefore, when the deposition rate of film to be formed is desired to be increased, it is necessary to increase not only the flow rate of an active species introduced into the reaction space but also the quantity of heat energy to be supplied thereto. However, it is extremely difficult to do so since there is a limit not only in the manner of generating a large amount of the active species in the activation chamber and sufficiently introducing the active species into the reaction space at a high flow rate without leakage but also for uniformly supplying a large quantity of the heat energy into the reaction space.

In recent years, a plasma CVD method using microwave glow discharge decomposition, namely, a microwave plasma CVD method (which will be hereinafter referred to as "MW-PCVD method") has been noticed on the industrial scale since the MW-PCVD method has various advantages, which cannot be attained by the RF glow discharge decomposition method, that it is possible to heighten the energy density, to effectively generate a plasma and to maintain the plasma in a desired state.

For instance, the specifications of U.S. Pat. Nos. 4,504,518 and 4,517,223 describe processes for forming deposited thin films on small area substrates in a microwave glow discharge plasma under a low pressure condition. These two patent specifications describe that because the processes are conducted under the low pressure condition, any of these processes makes it possible to obtain a high quality deposited film at a remarkably high deposition rate while eliminating not only polymerization of active species which gives negative effects to the characteristics of a film to be formed but also formation of powder such as polysilane in the plasma. However, neither of these two patent specifications mentions anything about uniform deposition of a film over large area.

The specification of U.S. Pat. No. 4,729,341 discloses a low pressure microwave plasma CVD method and an apparatus suitable for practicing the same, wherein a photoconductive semiconductor thin film is deposited on a large area cylindrical substrate using a pair of radiative waveguide applicators in a high power process. However, the principles of large area film deposition are limited to cylindrical substrates for electrophotographic photoreceptors, and the teachings described therein are not directly transferable to planar substrates of large area. Further, the film-forming process is to be practiced in a batch system and the amount of film products obtained by one batch is limited. The specification does not teach anything about continuous film deposition on a large area planar substrate.

Now, there are still left various problems to be solved for large area film deposition by the MW-PCVD method because non-uniformity of a microwave energy is apt to occur in microwave plasma due to the wavelength of a microwave being short. For instance, in this respect, there is an attempt to use a slow microwave structure in order to provide uniformity of the microwave energy. However, there is an inherent problem in the slow microwave structure, that is the very rapid fall-off of microwave coupling into the plasma as a function of distance transverse to the microwave applicator. In order to solve this problem, it has been proposed that the spacing of the slow microwave structure from a substrate to be processed be varied to thereby make the energy density at the surface of the substrate uniform along the direction of movement of the substrate.

For example, such proposal can be found in the specification of U.S. Pat. No. 3,814,983 or the specification of U.S. Pat. No. 4,521,717. More particularly, the former patent specification discloses that it is necessary to incline the slow wave structure at a certain angle with respect to the substrate. However, inclination of the slow wave structure reversely leads to an insufficient coupling of a microwave energy into the plasma.

The latter patent specification discloses the use of two slow wave structures in an anti-parallel arrangement but in parallel to the substrate. More particularly, the latter patent specification discloses: that it is desired to set the two slow wave applicators at an angle to each other that the planes normal to the medians of the applicators intersect at a straight line which extends parallel to the surfaces of the substrate to be processed and at right angles to the travel direction of the substrate; and that in order to avoid structive interference between the two slow wave applicators, it is desired to displace the two slow wave applicators from each other traversely of the travel direction of the substrate by a distance equal to half of the space between the crossbars of the waveguide.

Several proposals have been made in order to provide plasma uniformity and more particularly, energy uniformity as found, for example, in J. Vac. Sci. Tech. B-4 (January--February 1986) pp. 126-130 and pp. 295-298. These reports describe a microwave reactor called a microwave plasma disc source (MPDS) and that the plasma is in the shape of a disc or tablet, with a diameter that is a function of microwave frequency. More particularly, the reports describe that: the plasma disc source can be varied with the frequency of microwave; however, in the case of a microwave plasma disc source which is designed for operation at the normal microwave frequency of 2.45 GHz, the plasma confined diameter is about 10 centimeters at the most and the plasma volume is about 118 $cm^3$ at the most, thus this is far from a large surface area; in the case of a system designed for operation at the lower frequency of 915 MHz, the lower frequency source would provide a plasma diameter of approximately 40 cm with a plasma volume of 2000 $cm^3$; and the microwave plasma disc source can be scaled up to discharge diameters in excess of 1 cm by operating at still lower frequencies, for example 40 MHz, however extreme expenses are required to establish such an apparatus which can perform this.

In order to effectively provide high density plasma using microwave, there have been proposed methods to establish the electron cyclotron resonance condition (namely, the ECR condition) by arranging electromagnets around the cavity resonator as found in Japanese Unexamined Patent Publications Sho. 55(1980)-141729 and Sho. 57(1982)-133636. And at academic meetings, etc., there have been reported methods of forming various semiconductor thin films by utilizing high density plasma and some microwave ECR plasma CVD apparatus capable of performing such methods have been commercialized.

However, it has been generally recognized in the technical field to which the invention pertains that it is technically difficult to form a deposited film uniformly over a large area substrate because of non-uniformity of plasma caused by the wavelength of microwave and also because of non-uniformity of magnetic field distribution due to the use of the magnets for the control of plasma.

In the case where the microwave ECR plasma CVD apparatus is intended to scale up so that film deposition over a large area can be done, there are such various problems to be solved beforehand that electromagnets to be used are necessary to be also scaled up; means for preventing the apparatus from overheating is necessary to be provided; a special DC high power regulated supply is necessary to be provided; and the like.

Further, the deposited film obtained by the known microwave ECR plasma CVD method is usually inferior to the deposited film obtained by the known RF plasma CVD method with respect to film property. Further, in addition, in the case of forming a deposited film on a substrate by the microwave ECR plasma CVD method, there is a distinguishable difference with respect to the film deposition rate and the film property between the film formed in the space where the ECR condition is established and the film formed in the space where the ECR condition in not established, in the dispersed magnetic field space in other words. In view of this, the microwave ECR plasma CVD method is not suitable for the preparation of a semiconductor device required to excel in quality and in uniformity with respect to the characteristics to be provided.

The foregoing U.S. Pat. Nos. 4,517,223 and 4,729,341 describe the necessity of maintaining very low pressures in order to provide high density plasmas. That is, they describe that the use of low pressures is necessary in order to obtain high film deposition rates and/or high gas utilization efficiency.

However, any of the foregoing slow wave structure and electron cyclotron resonance methods is not sufficient in order to maintain the relationships among high film deposition rate, high gas utilization efficiency, high power density and low pressure.

In view of what is described above, there is an increased demand for eliminating the foregoing problems of the known microwave plasma CVD method and providing an improved microwave plasma CVD process which is free of such problems.

There is also other demand for providing a large area or lengthy thin semiconductor film excelling in quality and uniformity of characteristics which is desirably usable in not only solar cells but also in semiconductor devices such as TFTs, photoelectric conversion elements for contact image sensors, switching elements, image input line sensors, etc. at a reduced cost.

SUMMARY OF THE INVENTION

The principal object of the present invention is to eliminate the foregoing problems of the known microwave plasma CVD method and apparatus and to provide an improved microwave plasma CVD method and apparatus which enable to continuously deposit a semiconductor film uniformly over a large area substrate at a high deposition rate and which satisfies the foregoing demands.

Another object of the present invention is to provide an improved microwave plasma CVD method and apparatus which enable to continuously deposit a high quality semiconductor film on a large area substrate web.

A further object of the present invention is to provide an improved microwave plasma CVD method and apparatus which enable to mass-produce a thin film semi-conductor device with a high gas utilization efficiency and at a reduced cost.

A further object of the present invention is to provide an improved microwave plasma CVD method and apparatus which enable to provide uniform microwave plasma over a large area and volume and to continuously form a high quality large area semiconductor film having a uniform thickness, which stably exhibits the characteristics as desired and is usable in various semiconductor devices.

A further object of the present invention is to provide an improved microwave plasma CVD method and apparatus which enable to continuously and stably form a photovoltaic element on a lengthy substrate of relatively large width which provides a high photoelectric conversion efficiently with a high yield.

A further object of the present invention is to provide an improved method and apparatus which enable to stably and repeatedly maintain the potential of microwave plasma to be formed over a large area and volume in a uniform state.

A further object of the present invention is to provide an improved method and apparatus which enable to properly control the potential of microwave plasma in a desired state to continuously form a high quality semiconductor film which uniformly exhibits the characteristics as desired.

The present invention attains the above objects and includes an improved microwave plasma CVD method ("micro-wave plasma CVD method" will be hereinafter referred to as "MW-PCVD method") and an apparatus suitable for practicing said MW-PCVD method.

The MW-PCVD method according to the present invention comprises: continuously moving a substrate web delivered from a pay-out mechanism in the longitudinal direction toward a take-up mechanism; establishing a columnar film-forming space by curving said moving substrate web to form its circumferential wall as said substrate web is moving toward said take-up mechanism; introducing a film-forming raw material gas through a gas feed means into said film-forming space; simultaneously, radiating or propagating a microwave energy into said film-forming space by a microwave applicator means capable of radiating or propagating a microwave energy with a directivity in one direction perpendicular to the direction of microwave to propagate, thereby generating microwave plasma in said film-forming space, whereby forming a deposited film on the inner wall face of said continuously moving circumferential wall which is exposed to said microwave plasma.

The MW-PCVD apparatus according to the present invention is suitable for practicing the above MW-PCVD method and it comprises: a substantially enclosed columnar film-forming chamber having a curved circumferential wall formed by curving and projecting a substrate web which is delivered by a pay-out mechanism and is moving in longitudinal direction toward a take-up mechanism as said substrate web is moving toward said take-up mechanism by a pair of means for curving said substrate web; a microwave applicator means capable of radiating a microwave energy into said film-forming chamber with a directivity in one direction perpendicular to the direction of microwave to propagate; an isolating means which serves to transmit into said film-forming chamber said microwave energy radiated with a directivity in one direction perpendicular to the direction of microwave to propagate and also serves to isolate said microwave applicator means from microwave plasma to be generated in said film-forming chamber; means for evacuating the inside of said film-forming chamber; means for supplying a film-forming raw material gas into said film-forming chamber; and means for controlling the temperature of said substrate web constituting said circumferential wall on the inner surface of which a film is to be formed.

In the present invention, a substrate on which a film is to be formed comprises a large area and lengthy substrate web which is delivered by a pay-out mechanism, continuously moved in the longitudinal direction toward a take-up mechanism, and taken up by said take-up mechanism, and said substrate web constitutes the circumferential wall of the film-forming space. In the film-forming space, a film-forming raw material gas is supplied and a microwave energy is applied in the width direction of said circumferential wall comprising said moving substrate web by means of the foregoing microwave applicator means capable of radiating or propagating a microwave energy with a directivity in one direction perpendicular to the direction of microwave propagation to thereby generate microwave plasma. The microwave plasma generated is confined within the film-forming space. Thus, a desirable high quality semiconductor film is uniformly and continuously formed on a large area and lengthy substrate.

Further, in the present invention, microwave plasma is stably and repeatedly generated in a desired state, and the microwave plasma as generated is confined in a stable state within the film-forming space. Because of this, the gas utilization efficiency is markedly heightened.

According to the present invention, it is possible to uniformly and continuously form a high quality semiconductor film having a thickness as desired over a large area by varying the shape of the curved portion comprising the moving substrate web to be the circumferential wall of the film-forming space or the length of said curved portion of the moving speed of the substrate web.

According to the present invention, it is possible to continuously form a desirable high quality film having a uniform thickness and which stably exhibits the characteristics desired therefor on a large area and lengthy web substrate. Thus, it is possible to mass-produce a large area solar cell at a reduced cost.

According to the present invention, as a high quality semiconductor film can be continuously formed without suspending discharge, it is possible to mass-produce a multi-layered semiconductor device excelling in interface characteristics.

According to the present invention, film formation can be achieved under a low pressure condition while eliminating powder and polymeric formations in the microwave plasma. Thus, remarkable reduction in defects and extreme improvements in the film property and in the stability of said film property can be attained for a semiconductor film to be obtained. And the rate of operation and the yield are heightened. As a result, it becomes possible to mass-produce an inexpensive solar cell having a high photoelectric conversion efficiency.

BRIEF DESCRIPTION OF THE DRAWINGS

FIG. 6 is a schematic cross-section view of the MW-PCVD apparatus shown in FIG. 2.

FIG. 10, FIG. 11, FIG. 12, FIG. 13, FIG. 14 and FIG. 15 are schematic explanatory views respectively for illustrating the entire constitution of the MW-PCVD apparatus according to the present invention.

DETAILED DESCRIPTION OF THE INVENTION

Figure 1:
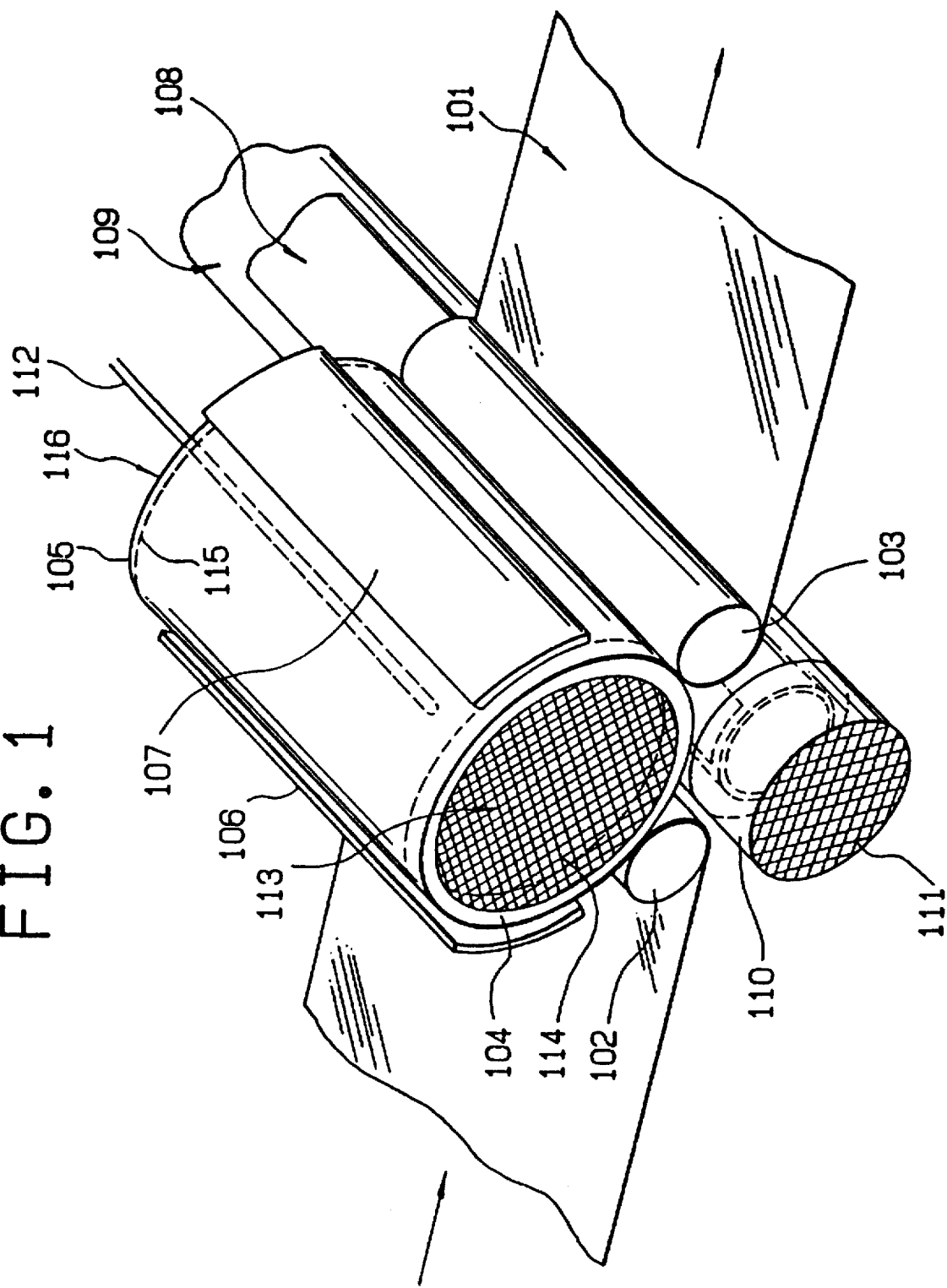
FIG. 1 is a schematic diagram illustrating the constitution of a first representative embodiment of the MW-PCVD apparatus according to the present invention.

The present inventors have made earnest studies for overcoming the foregoing various problems in the known MW-PCVD process and MW-PCVD apparatus for forming a deposited film and for attaining the objects of the present invention, and as a result, have obtained a knowledge that uniform microwave plasma can be provided in the width direction over a large area and lengthy substrate on which a film is to be formed.

In the experimental studies, the present inventors have made a film-forming chamber having a circumferential wall comprising a web member which is longitudinally moving between a pay-out mechanism and a take-up mechanism. That is, there was provided a SUS 430 BA (stainless steel) web member reeled on the pay-out mechanism. The web member was paid out from the pay-out mechanism, longitudinally moved toward the take-up mechanism and taken up by the take-up mechanism.

As the web member from the pay-out mechanism was moving toward the take-up mechanism, the web member was curved to project a columnar portion so as to form a columnar chamber circumscribed by the curved web member of said columnar portion as the circumferential wall by using a first supporting and conveying roller which also serves to make the web member curved in the side of the pay-out mechanism, a pair of rotary rings each of which being capable of serving to support one side end of the curved web member and convey said web member and a second supporting and conveying roller which also serves to make the web member curved in the side of the take-up mechanism. Then, there was provided a microwave applicator means capable of radiating or propagating a microwave energy with a directivity in the direction perpendicular to the microwave propagating direction, which is enclosed by a microwave transmissive member such that said microwave applicator means is not contacted to the inner wall face of said microwave transmissive member. The microwave applicator means thus structured was plunged into the columnar space of the columnar chamber. Then, a film-forming raw material gas was introduced into the columnar space of the columnar chamber. The inside of the columnar space was evacuated through the spacing between the foregoing two rollers and was maintained at a predetermined vacuum.

A microwave power source connected to the microwave applicator means was actuated to apply a microwave energy through the microwave applicator means into the columnar space. As a result, it was found that uniform microwave plasma was provided in the width direction of the web member constituting the circumferential wall of the columnar chamber.

As a result of further studies, the present inventors have obtained a further finding.

That is, a predetermined bias voltage was applied into the columnar space by a bias voltage applying means in the above case. As a result, it was found that uniform microwave plasma was provided as well as in the above case and the potential of the microwave plasma could be properly controlled.

The present invention has been accomplished as a result of further studies based on these findings by the present inventors.

The present invention includes, as previously described, an improved MW-PCVD process for continuously forming a semiconductor deposited film on a large area and lengthy substrate and an improved MW-PCVD apparatus suitable for practicing said MW-PCVD process.

A first embodiment of the MW-PCVD process according to the present invention comprises: continuously moving a substrate web delivered from a pay-out mechanism in the longitudinal direction toward a take-up mechanism; establishing a columnar film-forming space by curving said moving substrate web to form its circumferential wall as the substrate web is moving toward said take-up mechanism; introducing a film-forming raw material gas through a gas feed means into said film-forming space; simultaneously radiating or propagating a microwave energy into said film-forming space by a microwave applicator means capable of radiating or propagating microwave energy with a directivity in one direction perpendicular to the direction of microwave to propagate, to thereby generate microwave plasma in said film-forming space, whereby forming a deposited film on the inner wall face of said continuously moving circumferential wall which is exposed to said microwave plasma.

In the MW-PCVD process of the present invention, at the time of curving and projecting the moving substrate web to form the columnar portion, there are used a first supporting and curving means and a second supporting and curving means. That is, the moving substrate web is curved while being supported by said first supporting and curving means while being moved in the upward direction in the side of the pay-out mechanism and is again curved by said second curving means while being supportingly moved toward the take-up mechanism in the side of the take-up mechanism, to thereby establish a projected columnar portion to be the circumferential wall of the film-forming chamber while leaving a spacing with a predetermined width in the longitudinal direction between the first curved portion formed by the first supporting and curving means and the second curved portion formed by the second supporting and curving means. The both side ends of the columnar portion are supported on respective rotary rings so as to establish and maintain a desired shape of the columnar portion whereby always providing a desirable columnar chamber having a columnar film-forming space.

The application of microwave energy into the film-forming space upon film formation is carried out by using the foregoing microwave applicator means in such a manner that microwave energy is radiated or propagated through the foregoing spacing into the film-forming space from said microwave applicator means, or microwave energy is radiated or propagated into the film-forming space from said microwave applicator means plunged into said film-forming space through one of the two side faces of the columnar chamber (film-forming chamber). In any of these two cases, the radiation or propagation of said microwave energy into the film-forming space from the microwave applicator means is conducted through a microwave transmissive member which is hermetically provided between the microwave applicator means and the film-forming space so as to isolate one from the other, wherein the microwave applicator means is arranged in parallel to the width direction of the circumferential wall comprising the substrate web of the film-forming chamber and in vicinity to the inner face of said circumferential wall. It is necessary for the microwave applicator means to be in contact with the microwave transmissive member.

Upon applying microwave energy into the film-forming space in this way, it is necessary to design the system such that the microwave energy is radiated or propagated uniformly in the range of the width along the substrate web in the film-forming space.

In any case, the columnar chamber (film-forming chamber) is so structured that the microwave energy applied into the film-forming space by the microwave applicator means is not leaked out therefrom.

The evacuation of the film-forming space is carried out through the foregoing spacing by an exhaust means.

As the substrate web on which a film is to be formed to be used in the MW-PCVD method of the present invention, electroconductive substrate webs or other substrate webs applied with electroconductive treatment to their surfaces on which a film is to be formed may be optionally used.

A second embodiment of the MW-PCVD process of the present invention is that the above first embodiment further includes the step of controlling the potential of microwave plasma generated it the film-forming space as desired upon film formation by applying a bias voltage of DC, AC or pulsating current (hereinafter called "PC") into the film-forming space through a bias voltage applying means. The bias voltage applying means is mounted on the columnar chamber (film-forming chamber) such that at least a part thereof is in contact with microwave plasma generated in the film-forming space.

At least said part of the bias voltage applying means is desired to be electroconductive.

The bias voltage applying means may be a single bias bar or a plurality of bias bars. The bias voltage applying means may be configured to also serve as a film-forming raw material gas introducing means.

Further, in the MW-PCVD process of the present invention, the potential of microwave plasma generated in the film-forming space may be controlled by a bias voltage applied through the substrate web constituting the circumferential wall of the columnar chamber. In this case, the gas introducing means comprising, for instance, a gas feed pipe is installed in the film-forming space while being electrically grounded such that at least a part thereof is in contact with microwave plasma generated in the film-forming chamber.

As described above, the present invention also provides a MW-PCVD apparatus suitable for practicing the above MW-PCVD process.

A first embodiment of the MW-PCVD apparatus of the present invention comprises: at least a substantially enclosed columnar film-forming chamber having a curved circumferential wall formed by curving and projecting a substrate web as said substrate web is moving in the longitudinal direction from a pay-out mechanism toward a take-up mechanism by a pair of rollers for curving said substrate web, said pair of rollers being arranged in parallel to each other while leaving a predetermined spacing between them in the longitudinal direction; a microwave applicator means capable of radiating microwave energy into said film-forming chamber with a directivity in one direction perpendicular to the direction of microwave to propagate; an isolating means which serves to transmit said microwave energy radiated from said microwave applicator means into said film-forming chamber and also serves to isolate said microwave applicator means from microwave plasma to be generated in said film-forming chamber; means for evacuating the inside of said film-forming chamber; means for supplying a film-forming raw material gas into said film-forming chamber; and means for controlling the temperature of said substrate web constituting said circumferential wall on the inner surface of which a film is to be formed.

A second embodiment of the MW-PCVD apparatus is that the above first apparatus embodiment further comprises means for applying a bias voltage into the film-forming chamber.

In the MW-PCVD apparatus of the present invention, said pair of rollers for curving the substrate web while supporting it comprise a first supporting and curving roller and a second supporting and curving roller. The substrate web which is delivered by the pay-out mechanism and is being moved in the longitudinal direction toward the take-up mechanism, during which said substrate web is curved and projected while being supported by the first roller as said substrate web is being moved upward in the side of the pay-out mechanism and is again curved while being supported by the second roller as said substrate web is being moved toward the take-up mechanism, to thereby establish a projected columnar portion to be the circumferential wall of the film-forming chamber while leaving a spacing with a predetermined width in the longitudinal direction between the first curved portion formed by the first roller and the second curved portion formed by the second roller. With each of the two open side faces of the curved and projected columnar portion, there is provided a rotary ring such that the respective side ends of the columnar portion are supported on the respective rotary rings to establish and maintain a desired shape of the columnar portion to be the columnar film-forming chamber having a film-forming space.

The foregoing isolating means in the MW-PCVD apparatus is desired to be arranged such that it is situated in parallel to and in vicinity to the foregoing spacing providing between the two rollers. In this case, said isolating means may be provided in the outside of the film-forming chamber. In an alternative, the isolating means may be plunged into the film-forming chamber through one of the two sides faces thereof such that it is situated in parallel to the width direction of the substrate web constituting the circumferential wall of the film-forming chamber.

The isolating means may be cylindrically or hemicylindrically shaped.

The microwave applicator means is encapsuled in such isolating means in the way that it is enclosed therein while being apart from the circumferential wall thereof.

The isolating means is desired to include an applicator cooling means. The cooling means may be a flux of air adapted to flow about the interior of the isolating means. In a preferred embodiment, the cooling means may include a concentric enclosure formed interiorly of and shaped similarly to said isolating means so as to define a conduit between said isolating means and said concentric enclosure. Into said conduit, there is adapted a cooling fluid such as water, oils or freon to flow.

The microwave applicator means in the MW-PCVD apparatus of the present invention preferably takes the form of an elongated waveguide extending from a microwave power source. The waveguide is provided with at least one substantially rectangular shaped aperture formed through one face thereof such that microwave energy is allowed to radiate into the film-forming space with a directivity in one direction perpendicular to the direction of microwave to propagate and substantially uniformly in the elongated direction of said waveguide.

In the case where the waveguide is provided with a plurality of substantially rectangular shaped apertures, it is necessary for those apertures to be disposed spacedly with a predetermined distance.

In the case where the waveguide is provided with a single substantially rectangular shaped aperture, said aperture is desired to take the form of a rectangular shape which is relatively large in the ratio of the length to the breadth. The size thereof is desired to be greater than one wavelength of the microwave radiated and substantially equivalent to the entire breadth and length of the waveguide in the longitudinal direction. Further, it is necessary for the structure of this part to be designed such that microwave energy is allowed to radiate uniformly with a length exceeding one wavelength of the microwave from said rectangular shaped aperture in the elongated direction of the waveguide.

In a preferred embodiment, the rectangular shaped aperture is provided with an appropriate shutter means capable of ensuring radiation of microwave energy with a substantially uniform density from the rectangular shaped aperture along the entire length of the microwave applicator means.

In the MW-PCVD apparatus of the present invention, the microwave applicator means may be a slow wave microwave structure instead of the foregoing elongated waveguide. In this case, the microwave applicator means comprises a slender slow-wave circuit waveguide and takes a ladder-like structure which allows evanescent microwave energy to propagate in a substantially uniform state in the elongated direction thereof into the film-forming space. The length of said ladder-like structure is necessary to be substantially equivalent to the width of the substrate web constituting the circumferential wall of the film-forming chamber.

The structure of this sequence is necessary to be made such that allows evanescent microwave energy, which is greater than one wavelength of the microwave propagated in the elongated direction of the ladder-like structure, to propagate uniformly. The applicator means comprising the foregoing slender slow-wave circuit waveguide is encapsulated in the foregoing isolating means in the same way as in the case of the foregoing elongated waveguide.

The evacuating means is provided for the columnar film-forming chamber such that the film-forming space thereof can be evacuated through the spacing provided between the foregoing pair of rollers.

In the second apparatus embodiment of the present invention, the bias voltage applying means is provided for the columnar film-forming chamber such that at least a part thereof is in contact with microwave plasma generated in the film-forming space. Said part of the bias voltage applying means to be in contact with the microwave plasma is desired to be such that has been applied with electroconductive treatment. The bias voltage applying means may be one that can apply a bias voltage of DC, AC or PC. The bias voltage applying means can be designed such that it serves also as the means for introducing film-forming raw material gas into the film-forming space.

The bias voltage applying means may be a single bar or a plurality of bias bars.

In an alternative, it is possible to install the gas introducing means comprising one or more gas feed pipes in the film-forming chamber while being electrically grounded, wherein a bias voltage is applied onto the substrate web constituting the circumferential wall of the film-forming chamber.

In the following, explanation will be made about the experiments which were carried out by the present inventors in order to attain the foregoing object of the present invention.

The following experiments were made aiming at finding out desirable conditions for providing uniform microwave plasma over a large area in order to form a desirable large area semiconductor film.

Experiments 1 to 9

In these experiments, there were observed mainly about the stability of microwave plasma in various cases, using the MW-PCVD apparatus shown in FIG. 1 which will be later detailed in Apparatus Embodiment 1 wherein the film-forming space was evacuated through an exhaust pipe (not shown) provided between a pair of supportingly transporting rollers 102 and 103 by actuating a vacuum pump (not shown) connected to said exhaust pipe. In each case, there was used a microwave applicator means as shown in Table 1. The discharge conditions in each case were made as shown in Table 2. In Table 2, spacing $L_1$ means the width of the spacing provided between the initial supportingly transporting roller 102 and the exterior of a cylindrical isolating means 109, spacing $L_2$ means the width of the spacing provided between the terminal supportingly transporting roller 103 and said exterior of the cylindrical isolating means 109, and spacing $L_3$ means the width of the spacing provided between said pair of the rollers 102 and 103 (see FIG. 7(a)).

There were obtained the results shown in Table 3.

The discharge experiments were carried out in the case where the substrate web was not moved and also in the case where the substrate web was moved at a transportation speed of 1.2 m/min. There was not found a distinguishable difference with respect to the stability of discharge between the two cases.

Experiments 10 to 18

Figure 7A:
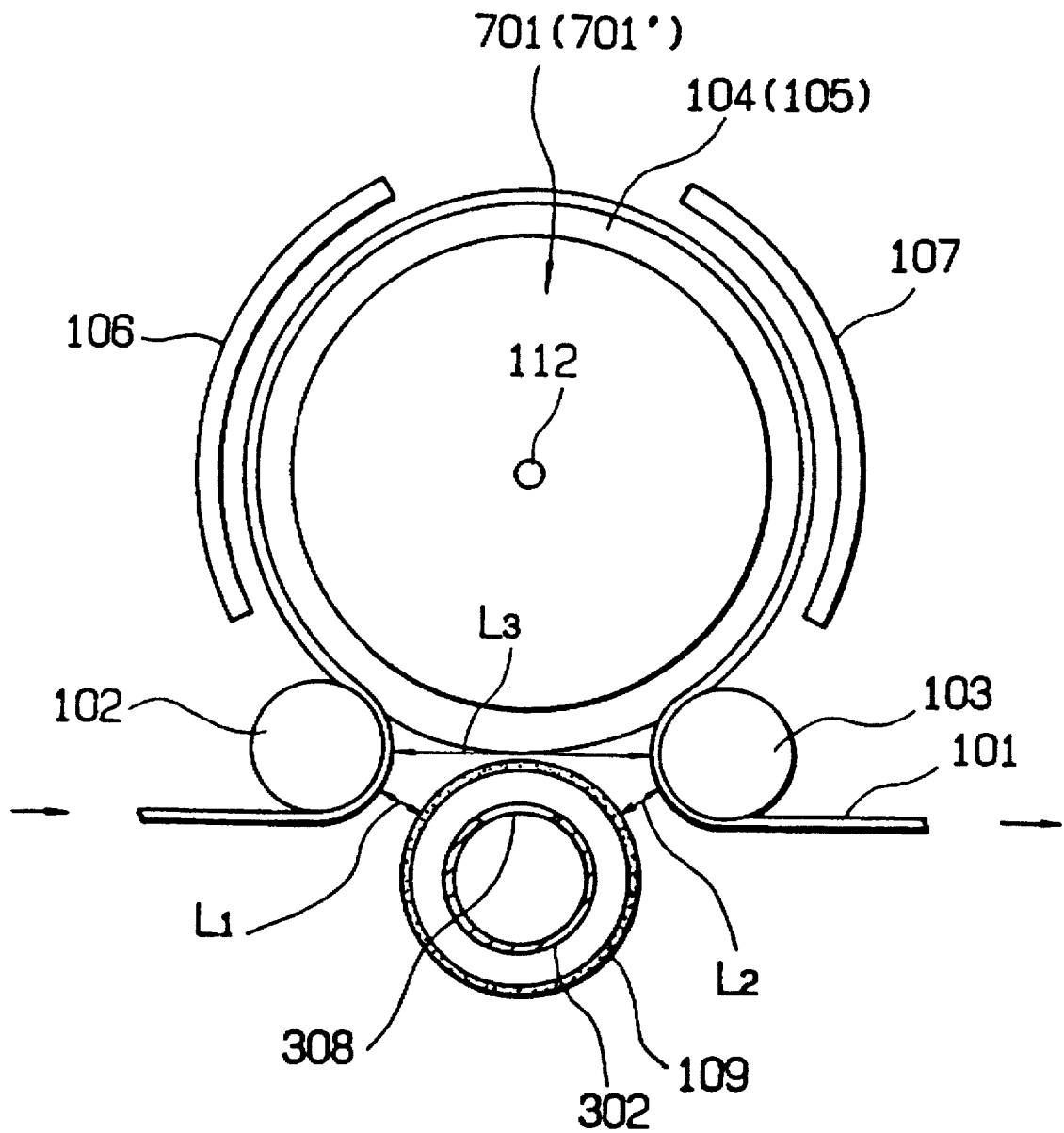
FIGS. 7(a) and 7(b) are schematic explanatory views respectively of a mechanism for transporting a substrate web in the present invention.
Figure 7B:
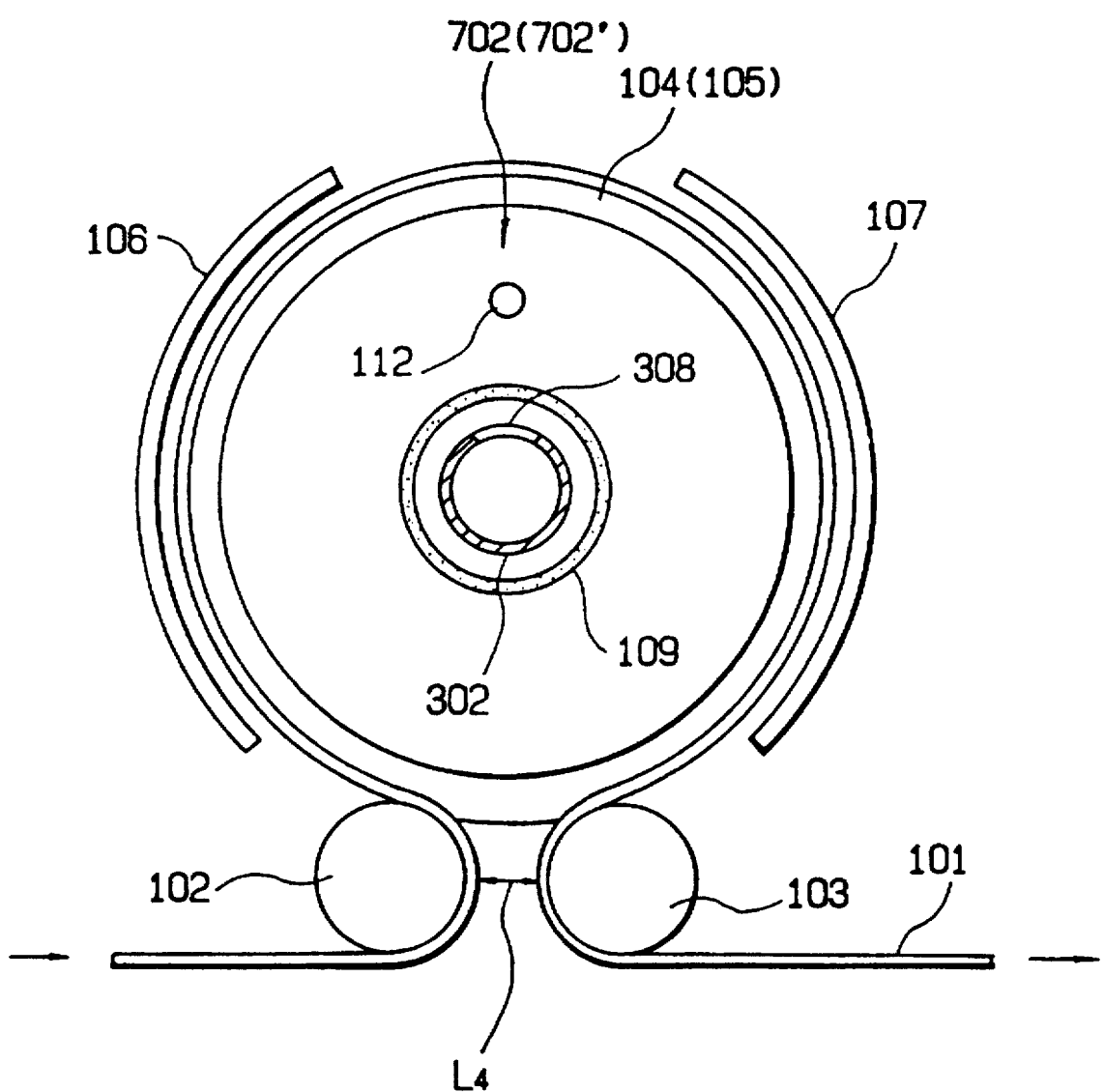

In these experiments, there were observed mainly about the stability of microwave plasma in various cases, using the MW-PCVD apparatus which will be later detailed in Apparatus Embodiment 5 wherein the substrate web and the microwave applicator means were arranged as shown in FIG. 7(b). There was used a microwave applicator means shown in Table 1 in each case. The discharge conditions in each case were made as shown in Table 4. In Table 4, spacing $L_4$ means the width of the spacing provided between the pair of the supportingly transporting rollers 102 and 103 (see FIG. 7(b)).

There were obtained the results shown in Table 5.

The discharge experiments were carried out in the case where the substrate web was not moved and also in the case where the substrate web was moved at a transportation speed of 1.2 m/min. There was not found a distinguishable difference with respect to the stability of discharge between the two cases.

Experiments 19 to 28

In these experiments, there were observed mainly about the stability of microwave plasma in various cases, using the MW-PCVD apparatus which will be later detailed in Apparatus Embodiment 3 wherein the film-forming space was evacuated through an exhaust pipe (not shown) provided between a pair of supportingly transporting rollers 102 and 103 by actuating a vacuum pump (not shown) connected to said exhaust pipe. In each case, there was used a microwave applicator means as shown in Table 6. The discharge conditions in each case were made as shown in Table 2.

There were obtained the results shown in Table 7.

The discharge experiments carried out in the case where the substrate web was not moved and also in the case where the substrate web was moved at a transportation speed of 1.2 m/min. There was not found a distinguishable difference with respect to the stability of discharge between the two cases.

Experiments 29 to 38

In these experiments, there were observed mainly about the stability of microwave plasma in various cases, using the MW-PCVD apparatus which will be later detailed in Apparatus Embodiment 7. In each case, there was used a microwave applicator means as shown in Table 6. The discharge conditions in each case were made as shown in Table 4.

There were obtained the results shown in Table 8.

The discharge experiments were carried out in the case where the substrate web was not moved and also in the case where the substrate web was moved at a transportation speed of 1.2 m/min. There was not found distinguishable difference with respect to the stability of discharge between the two cases.

Experiment 39

In this experiment, using the MW-PCVD apparatus having the constitution shown in FIG. 11 which is explained in Apparatus Embodiment 30 which will be later described, having a bias voltage applying means of the constitution shown in FIG. 19(a) in the isolating vessel 600, studies were made about the controllability of microwave plasma to be generated and influences caused on the potential cf the microwave plasma (the potential of plasma will be hereinafter referred to as "the plasma potential") and the quality of a film to be formed upon carrying out film formation onto a SUS 430 BA substrate web while changing the DC bias voltage applied onto a nickel-made bias voltage applying pipe 1903 which is capable of serving also as the gas feed pipe (see FIG. 19(a)).

The DC bias voltage was varied with an interval of 10 V in the range of from −300 V to +300. In each case, discharge was carried out for 10 minutes under the conditions shown in Table 2, wherein the surface of the substrate web situated in the film-forming space was controlled to 250° C. and the substrate web was moved at a transportation speed of 60 cm/min. As the microwave applicator means, there was used the applicator No. 11 shown in Table 6.

Firstly, there was observed the current-voltage characteristic between the bias voltage applying pipe and the substrate web by a conventional method.

Figure 20:
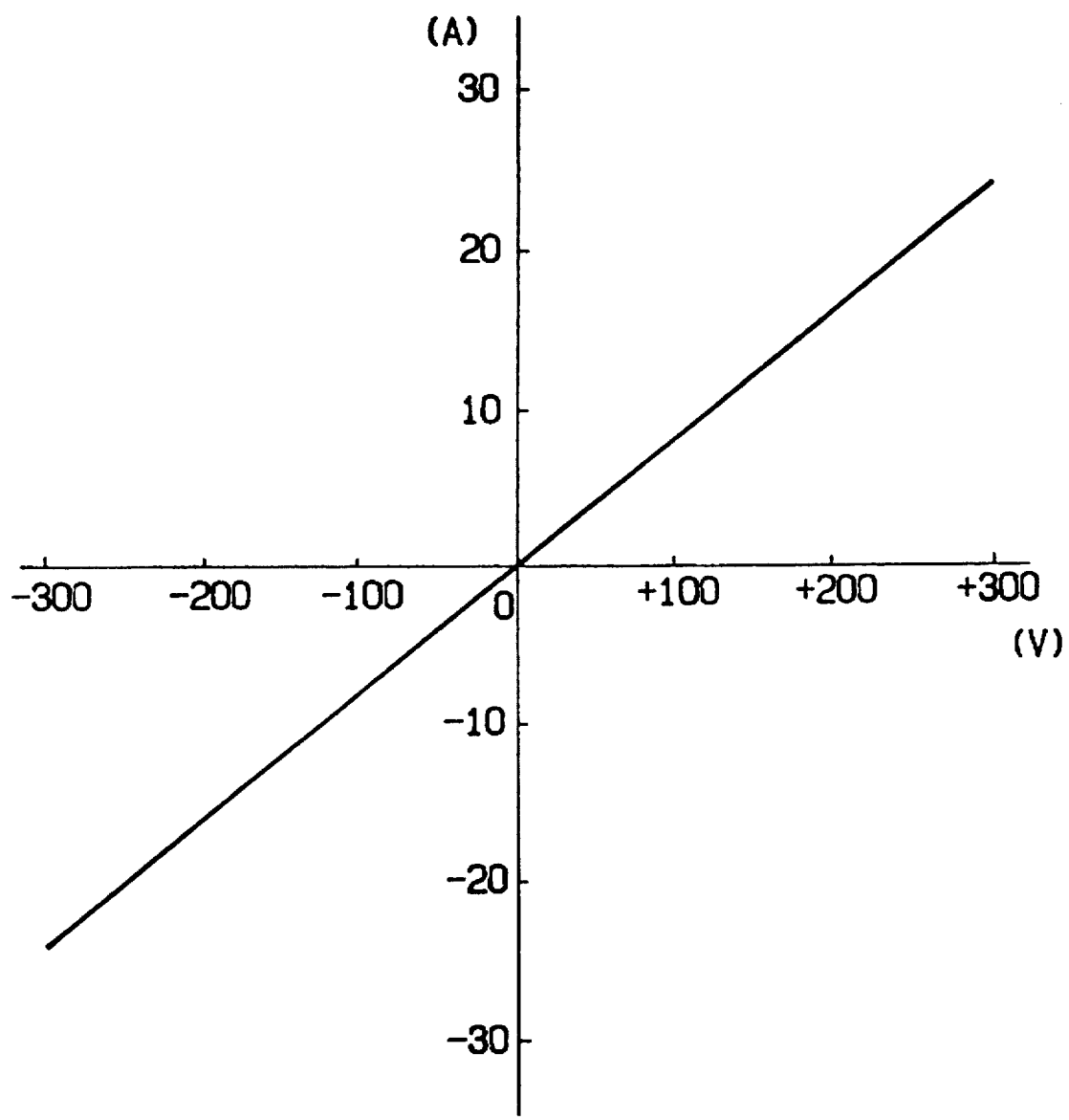
FIG. 20 is a graph of current-voltage characteristics at the time of applying a bias voltage which was obtained in the experiment of the present invention, which will be later described.

As a result, there was obtained the results expressed by a graph shown in FIG. 20. In FIG. 20, the X-axis shows the value of a bias voltage applied and the Y-axis shows the value of a bias current caused.

Figure 21:
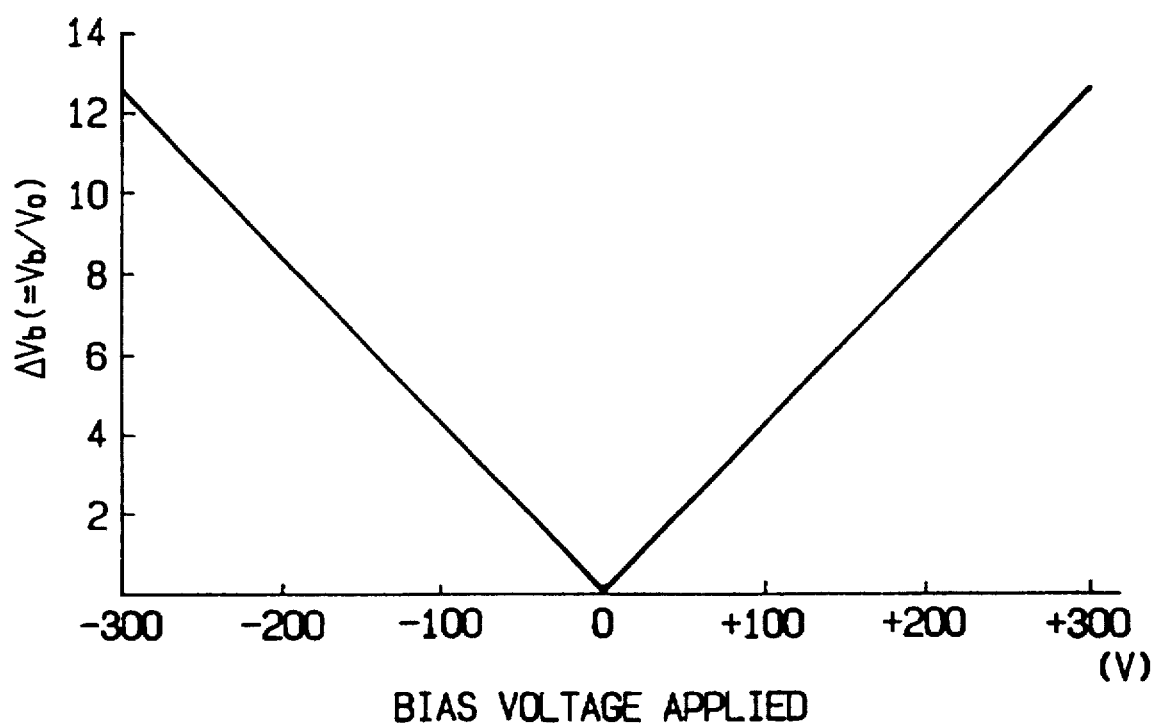
FIG. 21 is a graph of the rates of change in the plasma potential which was obtained in the experiment of the present invention, which will be later described.

Then, in accordance with a probing method using a single probe comprising a tungsten line of 0.3 mm in diameter and 3 mm in length (open part), there was measured a plasma potential Vb upon application of a bias voltage to obtain the rate of change ΔVb (=Vb/Vo) of the plasma potential Vb versus the plasma potential Vo obtained when no bias voltage was applied. The results obtained were collectively shown by the graph described in FIG. 21. Said single probe was placed near the central position of the film-forming space which is apart by about 5 cm from the inner wall face of the circumferential wall comprising the moving substrate web.

From the experimental results obtained in this experiment, the following facts were found. That is, (i) although there are caused certain changes depending upon the kind of a raw material gas for discharge to be used and its flow rate, when a bias voltage of less than −200 V or more than 200 V is applied, abnormal discharge such as spark is caused in the film-forming space and it is difficult to maintain discharge in a stable state; (ii) however, when the discharge conditions are made constant, the current-voltage characteristic shows an increasing linear relationship as the bias voltage increases and the plasma potential shows an increasing linear relationship too; and (iii) it is possible to stably and repeatedly control the plasma potential in a desired state by properly varying the value of a bias voltage to be applied.

Several experimental specimens of 5 mm×5 mm in size were cut off from the substrate web having a deposited film formed thereon, and they were subjected to observation of their surface state with the use of a superresolution low-acceleration FE-SEM (trade name: S-900 type FE-SEM, product by Hitachi, Ltd.). As a result, the following facts were found. That is, as for the films formed with the application of a bias voltage in the range of from −300 V to +10 V, significant surface roughnesses of some hundreds to some thousands angstrom (Å) are found; as for the films formed with the application of a bias voltage in the range of from +10 V to 200 V, there is a tendency that the surface smoothness is improved as the value of the bias voltage to be applied is increased; as for the films formed with the application of a bias voltage exceeding +200 V, there is a tendency that the film surface starts roughening and the degree of the roughness is developed as the value of the bias voltage is increased; and as for the films formed with the application of a bias voltage exceeding +220 V, those films are accompanied with pin holes, and abnormal discharge is often caused during their formation.

In addition, the following facts were also found. That is, when the power of a microwave energy to be applied is maintained constant at a predetermined value, the inclination of the current-voltage characteristic becomes greater as the flow ratio of a raw material gas having a large ionization cross-section such as $SiH_4$ is increased, but said inclination becomes smaller as the flow ratio of a raw material gas having a small ionizing cross-section such as $H_2$ gas is increased.

Comparative Experiment 1

In this comparative experiment, the procedures of Experiment 39 were repeated, except for replacing the foregoing bias voltage applying pipe 1903 made of nickel by a newly provided bias voltage applying pipe made of aluminum which is capable of serving as a gas feed pipe.

The current-voltage characteristic was observed in the same manner as in Experiment 39. However, when the bias voltage was increased from zero vole to +70 V, the aluminum bias voltage applying pipe started deforming at the beginning stage and was finally melt-broken. Likewise, when a bias voltage applying pipe made of copper and a bias voltage applying pipe made of a brass were respectively used, the foregoing problem was also caused in any of the two cases.

Further, there were provided a plurality of bias voltage applying pipes respectively made of metals having a high melting point such as stainless steel, titanium, vanadium, niobium, tantalum, molybdenum, and tungsten and a bias voltage applying pipe made of alumina ceramic applied with an 800 μm thick nickel film to the surface thereof. And using each of them, the procedures of Experiment 39 were repeated. As a result, it was found in the case of using the stainless steel-made bias voltage applying pipe that said pipe started deforming with the application of a bias voltage exceeding +130 V and it was finally melt-broken.

As for the cases of the remaining bias voltage applying pipes, the measured results similar to those obtained in Experiment 39 were obtained in each of these cases without such problems as above described.

Comparative Experiment 2

The procedures of Experiment 39 were repealed, except that as the substrate web, polyethyleneterephthalate PET) sheet of 0.8 mm in-thickness was used instead of the SUS 430 BA thin sheet, to observe the current-voltage characteristic. As a result, it was found that the values of currents flown with the application of bias voltages either in the positive side or in the negative side were similar to those obtained in Experiment 39 but the voltage at which abnormal discharge started was near −110 V or +110. As a result of observing their states by eye, the following facts were found. That is, spark was generated between the bias voltage applying pipe and the supportingly transporting rollers for the substrate web; and this was caused by a so-called charge-up phenomenon not only because of substrate web but also because of the excessive current flown into said rollers being conductive.

In addition, the surface states of a plurality of film specimens formed on the foregoing insulating substrate web were observed in the same manner as in Experiment 39. As a result, it was found that any of the film specimens has a significant roughness of some hundreds to some thousands angstrom (Å) without depending upon difference in the bias voltage applied upon film formation.

Comparative Experiment 3

Figure 8A:
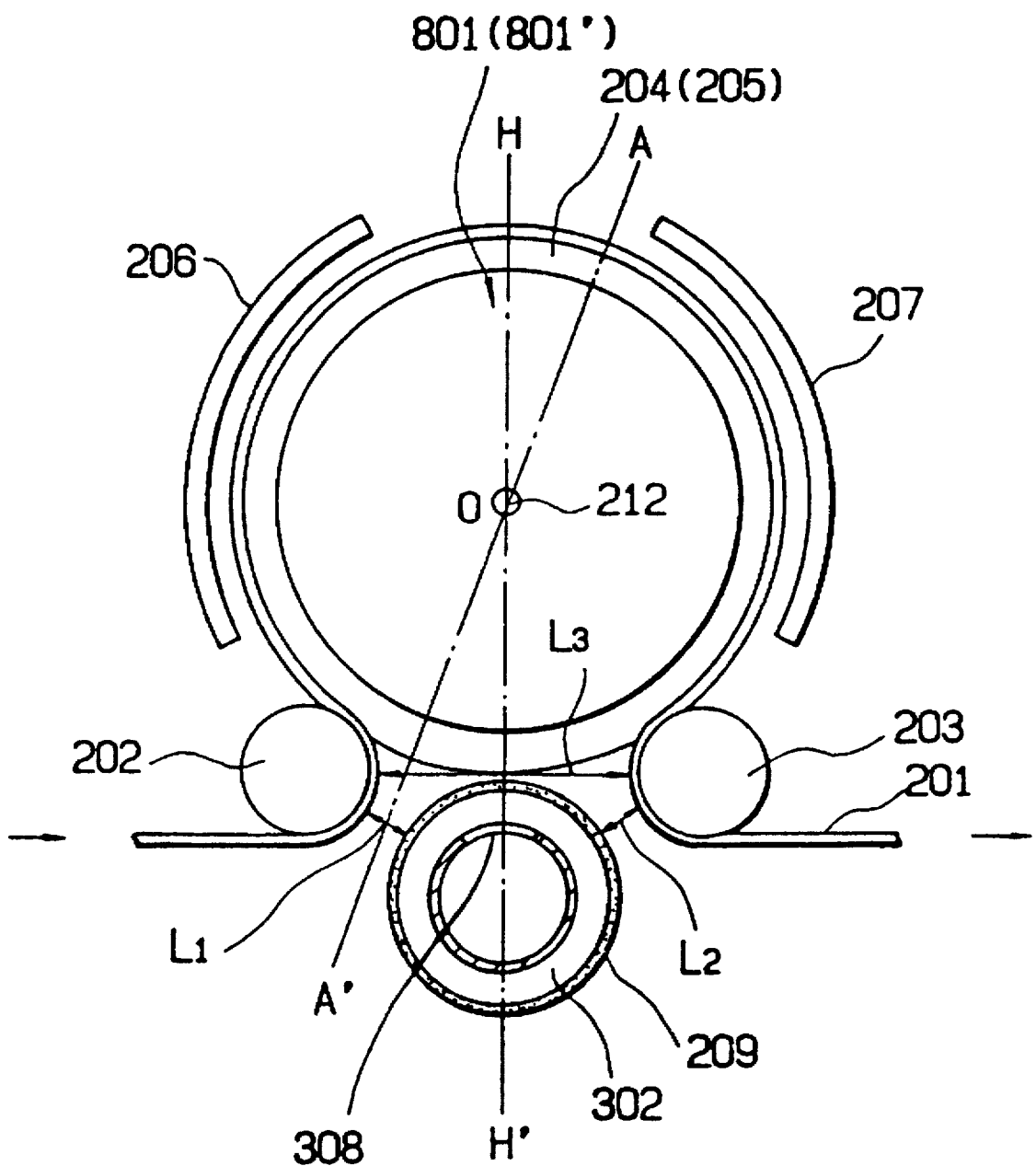
FIGS. 8(a) and 8(b) are schematic explanatory views respectively of another mechanism for transporting a substrate web in the present invention.

The procedures of Experiment 39 were repeated, except that the position for the bias voltage applying pipe 1903 to be arranged in the film-forming space (see FIG. 8(a)) was varied to the positions 30 mm, 60 mm and 90 mm distant from the position "O" in the direction O-H' in the direction O-H, in the direction O-A and in the direction O-A', respectively.

In each case, the current-voltage characteristic was observed.

For the direction O-A', the case of 120 mm and the case of 150 mm were observed in the same manner as the above.

As a result, there were obtained the results similar to those obtained in Experiment 39 in any of the cases of 30 mm and 60 mm in the directions O-H', O-H, O-A and O-A'. In the cases of 90 mm in said directions, although the voltage at which abnormal discharge commenced was somewhat different, but other than this, there were obtained the results similar to those obtained in Experiment 39. On the other hand, in any of the two cases of 120 mm and 150 mm in the direction O-A', a film-forming raw material gas was not sufficiently fed into the film-forming space and because of this, plasma was not stably generated. And no bias current was provided upon applying a bias voltage and it was impossible to control the plasma potential.

Experiment 40

In this experiment, using the same MW-PCVD apparatus as used in Experiment 39, studies were made about the controllability of microwave plasma to be generated and influences to be provided on the plasma potential and the quality of a film to be formed upon applying a bias voltage with a wave form and a frequency shown in Table 9 onto the bias voltage applying pipe 1903. The same conditions as employed in Experiment 39 were employed in order to perform microwave plasma discharge to form a deposited

19 film on the substrate web in the film-forming space.

As the bias voltage to be applied, these obtained by amplifying a variety of waveform outputs, which were provided by a function generation of HP 8116A (product by Hewlett-Packard Company), by a precision power amplifier (product by NF Circuit Design Block Co., Ltd.) or those outputted by a rectifying circuit device were applied onto the bias voltage applying pipe 1903 through a coaxial cable.

The discharge state, rate of change in the plasma potential and controllability of the plasma potential were evaluated. As a result, there were obtained the evaluated results shown in Table 9.

From the results, it was found that the application of a bias voltage with a frequency in the relatively wide range provides a distinguishable effect.

Further, as a result of varying the maximum amplitude voltage ($V_{p-p}$), there was found a tendency similar to that found in Experiment 39 wherein the DC voltage was varied. And abnormal discharge such as spark often occurred mainly because of increase of the maximum amplitude voltage ($V_{p-p}$).

From these experimental results, the following fact was found. That is, various kinds of bias voltages other than the DC bias voltage can be used for controlling the potential of microwave plasma to be generated in the film-forming space; and said plasma potential can be easily, stably and repeatedly controlled by applying such bias voltage onto the bias voltage applying pipe while properly varying the voltage thereof.

Experiment 41

Figure 19A:
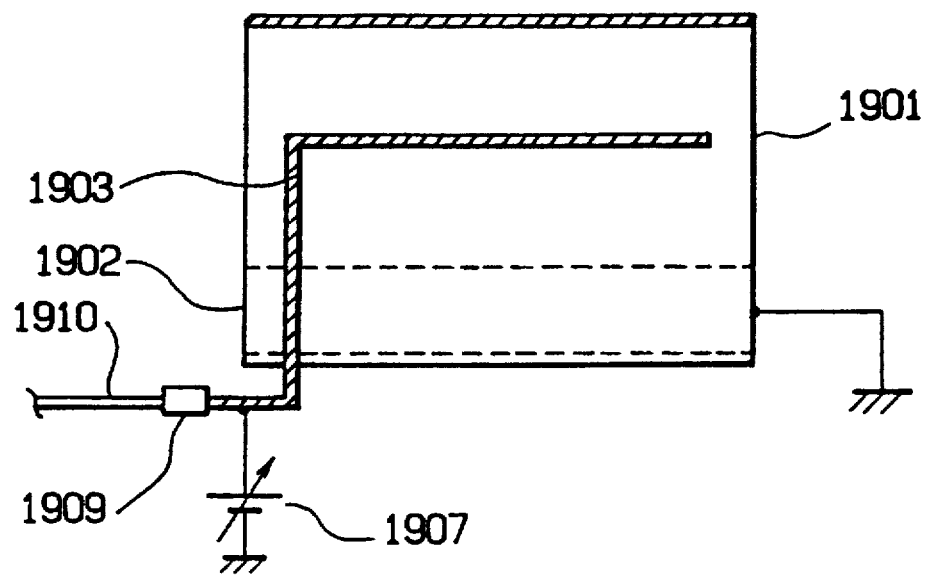
FIGS. 19(a) through 19(d) are schematic views respectively for illustrating a representative arrangement of the bias voltage applying means in the present invention.
Figure 19B:
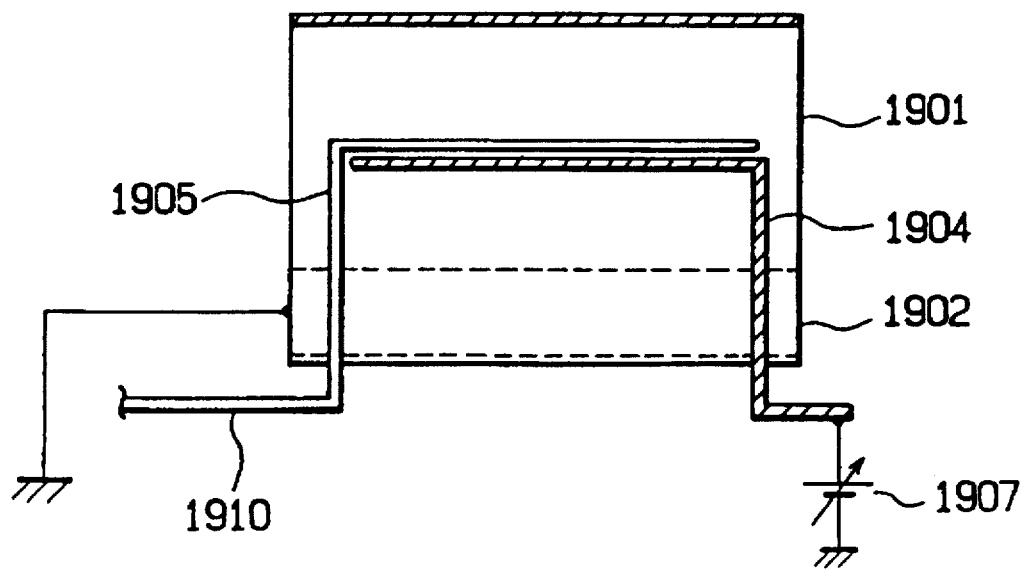

The procedures of Experiment 39 were repeated, except that the bias voltage applying means used in Experiment 39 was replaced by one shown in FIG. 19(b) which comprises a bias voltage applying bar 1904 independently provided in the film-forming chamber 1901, to examine the current-voltage characteristic.

As result, there were obtained the results similar to those obtained in Experiment 39.

And, the following fact was found. That is, even in the case where the bias voltage applying bar 1904 and a gas feed pipe 1905 are independently and separately provided in the film-forming chamber, it is possible to easily, stably and repeatedly control the potential of microwave plasma to be generated in the film-forming chamber by properly varying the bias voltage applied onto said bias bar.

Experiment 42

Figure 19C:
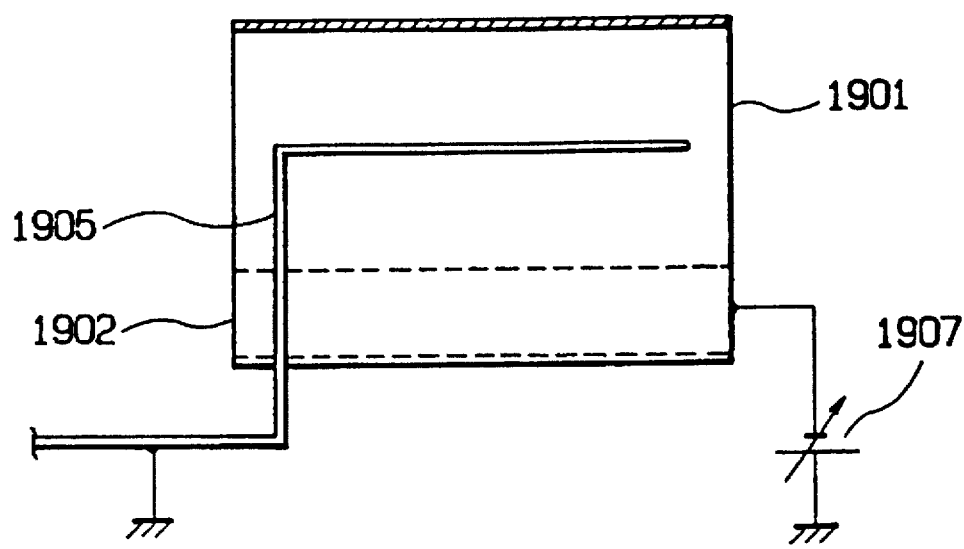

The procedures of Experiment 39 were repeated, except that the bias voltage applying means used in Experiment 39 was replaced by the constitution shown in FIG. 19(c) which comprises an earth pipe 1905 capable of serving as the gas feed pipe provided in the film-forming chamber 1901, to examine the current-voltage characteristics.

As a result, there were obtained the results similar to those obtained in Experiment 39.

And the following facts were found in comparison with the case of Experiment 39. That is, the voltage at which abnormal discharge such as spark is commenced is changed, when abnormal discharge occurs at connected portions between the moving substrate web and the two rotary rings by which the substrate web is supportingly conveyed; the bias voltage capable of contributing to provide a film to be formed on the moving substrate web with a smooth surface is of a negative polarity which is opposite to that in Experiment 39 and is in the range of from −10 V to −180 V, wherein plasma is maintained in a stable state; and the potential of microwave plasma to be generated in the film-forming space can be easily, stably and repeatedly controlled by using a ground pipe capable of serving as the gas feed pipe which is installed in the film-forming chamber.

Experiment 43

Figure 19D:
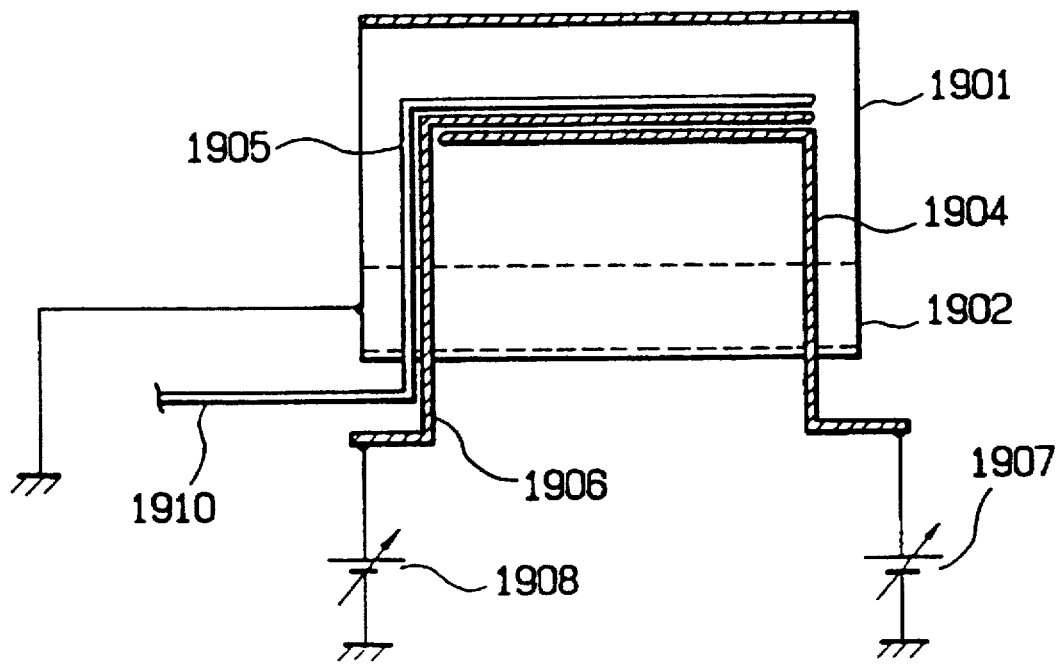

The procedures of Experiment 39 were repeated, except that the bias voltage applying means used in Experiment 39 was replaced by the constitution shown in FIG. 19(d) which comprises two bias voltage applying bars 1904 and 1906 being separately arranged in the film-forming chamber 1901 having a gas feed pipe 1905 being independently installed therein, to examine the current-voltage characteristic.

In this experiment, a DC bias voltage was applied onto the bias bar 1904 and concurrently, a DC bias voltage of a ¼ of said bias voltage was applied to the bias bar 1906 upon film formation to examine the controllability of microwave plasma generated in the film-forming space, plasma potential and influences provided on a film to be formed.

As a result, there were obtained the results similar to those obtained in Experiment 39. And the following facts were found. That is, abnormal discharge such as a spark only slightly occurred; the stability of plasma is improved; and the potential of microwave plasma can be easily, stably and repeatedly controlled.

Experiment 44

In this experiment, studies were made about the controllability of microwave plasma, plasma potential and influences over a film to be formed when the same bias voltages having various wave forms and frequencies as employed in Experiment 40 were respectively applied to the bias bar 1904 of the bias voltage applying means used in Experiment 43. In each case, discharge was performed under the same discharge conditions employed in Experiment 39.

In any case, abnormal discharge such as a spark slightly occurred, the voltage at which abnormal discharge commences was lowered the stability of microwave plasma was improved, and the results similar to those obtained in Experiment 39 were obtained.

As a result, it was found that it is possible to easily, stably and repeatedly control the potential of microwave plasma during film formation by using a plurality of bias voltage applying bars being separately arranged in the film-forming chamber and independently applying a bias voltage onto each of the bars.

Experiments 45 and 46

The procedures of Experiments 41 and 42 were repeated, except that the same bias voltage as employed in Experiment 40 was employed in each case. As a result, there were recognized the effects similar to those recognized in Experiments 41 and 42.

Comparative Experiments 4 to 7

In each of Experiments 2, 7, 21 and 25, studies were made mainly about the stability and the uniformity of plasma as generated under the conditions shown in Table 2 wherein the inner pressure of the film-forming chamber was varied as shown in Table 10.

There were obtained the results as shown in Table 10.

In Table 10, the mark "⊙" shows the case where discharge was maintained in the most desirable state; the mark "o" shows the case where discharge was slightly defective in the stability or/and the uniformity but was practically acceptable; the mark "Δ" shows the case where discharge was defective in both the stability and the uniformity and was not practically acceptable; and the mark "x" shows the case where abnormal discharge was caused.

From the results shown in Table 10, it was found that uniform microwave plasma can be provided in a relatively extended range with respect to the inner pressure of the film-forming chamber.

Further, the discharge experiments were carried out in the case where the substrate was not moved and also in the case where the substrate web was moved at a transportation speed of 1.5 m/min. As a result, there was not a distinguishable deference between the two cases.

Comparative Experiments 8 to 11

In each of Experiments 2, 7, 21 and 25, studies were made mainly about the stability and the uniformity of plasma as generated under the conditions shown in Table 2 wherein the microwave power was varied as shown in Table 11.

There were obtained the results as shown in Table 11.

In Table 11, the mark "⊙" shows the case where discharge was maintained in the most desirable state; the mark "o" shows the case where discharge was slightly defective in the stability or/and the uniformity but was practically acceptable; the mark "Δ" shows the case where discharge was defective in both the stability and the uniformity and was not practically acceptable; and the mark "x" shows the case where abnormal discharge was caused.

From the results shown in Table 11, it was found that uniform microwave plasma can be provided in a relatively extended range with respect to the microwave power.

Further, the discharge experiments were carried out in the case where the substrate was non moved and also in the case where the substrate web was moved at a transportation speed of 1.5 m/min. As a result, there was not a distinguishable difference between the two cases.

Comparative Experiments 12 to 15

In each of Experiments 2, 7, 21 and 25, studies were made mainly about the stability and the uniformity of plasma as generated under the conditions shown in Table 2 wherein the spacing $L_1$ and the spacing $L_2$ were varied as shown in Table 12.

There were obtained the results as shown in Table 12.

In Table 12, the mark "⊙" shows the case where discharge was maintained in the most desirable state; the mark "o" shows the case where discharge was slightly defective in the stability or/and the uniformity but was practically acceptable; the mark "Δ" shows the case where discharge was defective in both the stability and the uniformity and was not practically acceptable; and the mark "x" shows the case where abnormal discharge was caused.

From the results shown in Table 12, the following facts were found. That is, when at leash one of the spacings $L_1$ and $L_2$ is greater than a ¼ of one wavelength of the microwave applied, microwave plasma becomes uneven and leakage of microwave out of the film-forming space becomes relatively great; however, when the two spacings are less than a ¼ of one wavelength of the microwave applied, desirably uniform microwave plasma is stably provided.

Further, the discharge experiments were carried out in the case where the substrate was not moved and also in the case where the substrate web was moved at a transportation speed of 1.5 m/min. As a result, there was not a distinguishable difference between the two cases.

Comparative Experiments 16 to 19

In each of Experiments 2, 7, 21 and 25, studies were made mainly about the stability and the uniformity of plasma as generated under the conditions shown in Table 2 wherein the spacing $L_3$ was varied as shown in Table 13.

There were obtained the results as shown in Table 13.

In Table 13, the mark "⊙" shows the case where discharge was maintained in the most desirable state; the mark "o" shows the case where discharge was slightly defective in the stability or/and the uniformity but was practically acceptable; the mark "Δ" shows the case where discharge was defective in both the stability or/and the uniformity and was not practically acceptable; and the mark "x" shows the case where abnormal discharge was caused.

From the results shown in Table 13, the following facts were found. That is, (i) when the spacing $L_3$ is less than a ½ of one wavelength of the microwave applied, discharge becomes unstable; (ii) when the spacing $L_3$ is greater than the above value, uniform microwave plasma is stably provided; and (iii) when the spacings $L_1$ and $L_2$ are greater than a ¼ of one wavelength of the microwave applied and the spacing $L_3$ is excessively large, discharge becomes unstable and leakage of microwave out of the film-forming space becomes significant.

Further, the discharge experiments were carried out in the case where the substrate was not moved and also in the case where the substrate web was moved at a transportation speed of 1.5 m/min. As a result, there was not a distinguishable difference between the two cases.

Comparative Experiments 20 to 23

In each of Experiments 2, 7, 21 and 25, studies were made mainly about the stability and the uniformity of plasma as generated under the conditions shown in Table 2 wherein the size of the columnar portion was varied as shown in Table 14.

There were obtained the results as shown in Table 14.

In Table 14, the mark "⊙" shows the case where discharge was maintained in the most desirable state; the mark "o" shows the case where discharge was slightly defective in the stability or/and the uniformity but was practically acceptable; the mark "Δ" shows the case where discharge was defective in both the stability and the uniformity and was not practically acceptable; and the mark "x" shows the case where abnormal discharge was caused.

From the results shown in Table 14, it was found that uniform microwave plasma can be provided in a relatively extended range with respect to the size of the columnar portion.

Further, the discharge experiments were carried out in the case where the substrate was not moved and also in the case where the substrate web was moved at a transportation speed of 1.5 m/min. As a result, there was not a distinguishable difference between the two cases.

Comparative Experiments 24 to 27

In each of Experiments 11, 18, 30 and 37, studies were made mainly about the stability and the uniformity of plasma as generated under the conditions shown in Table 4 wherein the inner pressure of the film-forming chamber was varied as shown in Table 15.

There were obtained the results as shown in Table 15.

In Table 15, the mark "⊙" shows the case where discharge was maintained in the most desirable state; the mark "o" shows the case where discharge was slightly defective in the stability or/and the uniformity but was practically acceptable; the mark "Δ" shows the case where discharge was defective in both the stability and the uniformity and was not practically acceptable; and the mark "x" shows the case where abnormal discharge was caused.

From the results shown in Table 15, it was found that uniform microwave plasma can be provided in a relatively extended range with respect to the inner pressure of the film-forming chamber.

Further, the discharge experiments were carried out in the case where the substrate was not moved and also in the case where the substrate web was moved at a transportation speed of 1.5 m/min. As a result, there was not a distinguishable difference between the two cases.

Comparative Experiments 28 to 31

In each of Experiments 11, 18, 30 and 37, studies were made mainly about the stability and the uniformity of plasma as generated under the conditions shown in Table 4 wherein the microwave power was varied as shown in Table 16.

There were obtained the results as shown in Table 16.

In Table 16, the mark "⊙" shows the case where discharge was maintained in the most desirable state; the mark "o" shows the case where discharge was slightly defective in the stability or/and the uniformity but was practically acceptable; the mark "Δ" shows the case where discharge was defective in both the stability and the uniformity and was not practically acceptable; and the mark "x" shows the case where abnormal discharge was caused.

From the results shown in Table 16, it was found that uniform microwave plasma can be provided in a relatively extended range with respect to the inner pressure of the film-forming chamber.

Further, the discharge experiments were carried out in the case where the substrate was not moved and also in the case where the substrate web was moved at a transportation speed of 1.5 m/min. As a result, there was not a distinguishable difference between the two cases.

Comparative Experiments 32 to 35

In each of Experiments 11, 18, 30 and 37, studies were made mainly about the stability and the uniformity of plasma as generated under the conditions shown in Table 4 wherein the spacing $L_4$ was varied as shown in Table 17.

There were obtained the results as shown in Table 17.

In Table 17, the mark "⊙" shows the case where discharge was maintained in the most desirable state; the mark "o" shows the case where discharge was slightly defective in the stability or/and the uniformity but was practically acceptable; the mark "Δ" shows the case where discharge was defective in both the stability and the uniformity and was not practically acceptable; and the mark "x" shows the case where abnormal discharge was caused.

From the results shown in Table 17, the following facts were found. That is, when the spacing $L_4$ is less than a ½ of one wavelength of the microwave applied, uniform microwave plasma is stably provided.

Further, the discharge experiments were carried out in the case where the substrate was not moved and also in the case where the substrate web was moved at a transportation speed of 1.5 m/min. As a result, there was not a distinguishable difference between the two cases.

Comparative Experiments 36 to 39

In each of Experiments 11, 18, 30 and 37, studies were made mainly about the stability and the uniformity of plasma as generated under the conditions shown in Table 4 wherein the size of the columnar portion was varied as shown in Table 18.

There were obtained the results as shown in Table 18.

In Table 18, the mark "⊙" shows the case where discharge was maintained in the most desirable state; the mark "o" shows the case where discharge was slightly defective in the stability or/and the uniformity but was practically acceptable; the mark "Δ" shows the case where discharge was defective in both the stability and the uniformity and was not practically acceptable; and the mark "x" shows the case where abnormal discharge was caused.

From the results shown in Table 18, the following facts were found. That is, when the inside diameter of the columnar portion is in the range of up to about 5 fold of the diameter of the isolating means, uniform microwave plasma is stably provided.

Further, the discharge experiments were carried out in the case where the substrate was not moved and also in the case where the substrate web was moved at a transportation speed of 1.5 m/min. As a result, there was not a distinguishable difference between the two cases.

Comparative Experiments 40 to 43

In each of Experiments 1 to 40, the same procedures were repeated, except that the punching board for confining a microwave plasma region was replaced by a SUS 316 L thin plate applied with an alumina film to the surface thereof by a flame spraying method, to thereby make studies mainly about the stability of microwave plasma as generated.

As a result, there was not found a distinguishable difference among the results obtained.

As a result of further studies by the present inventors based on the results obtained by the foregoing experiments, the following items have been recognized.

First, in the MW-PCVD method and the MW-PCVD apparatus according to the present invention, it is difficult to establish the optimum condition which enables to stably maintain uniformity of microwave plasma on the basis of a single parameter since the stability and uniformity of microwave plasma will be maintained in the complicatedly correlated organic situation of a plurality of parameters such as the shape of a microwave applicator, means to be used, the gas pressure of the film-forming space upon film formation, the microwave power, the degree of microwave plasma to be confined, the shape and volume of the discharge space, etc.

The present inventors have found certain tendencies and conditions which enable to attain the purpose of maintaining the stability and uniformity of microwave plasma in order to continuously form a desirable semiconductor deposited film on a large area and lengthy substrate in the present invention.

That is, as for the inner pressure of the film-forming chamber upon film formation, it is preferably in the range of from 1 to 500 m Torr, more preferably in the range of from 3 to 200 m Torr.

As for the microwave power, it is preferably in the range of from 300 to 5000 W, more preferably in the range of from 300 to 3000 W.

As for the inside diameter of the projected and curved columnar portion (that is the film-forming chamber), it is desired to be made such that it corresponds preferably about 5 fold or more preferably, about 4 fold over the length of the exterior wall of the isolating means containing the microwave applicator means, which is exposed to a microwave plasma region.

As previously described, when the amount of microwave to be leaked from the microwave plasma region becomes large, microwave plasma in said region becomes unstable accordingly.

Therefore, the respective spacings provided between the pair of rollers, that is, the initial supporting and curving roller and the terminal supporting and curving roller, between the former roller and the above isolating means and between the latter roller and the above isolating means are basically important factors in order to avoid occurrence of said problem.

In view of this, it is desired that each of said spacings is made to be preferably less than a ½ or more preferably, less than a ¼ respectively of one wavelength of the microwave applied.

In the present invention, in order to control the potential of microwave plasma in a desirable state upon film formation, it is desired to provide a bias voltage applying means in the film-forming chamber in which microwave plasma is to be confined and apply a bias voltage of DC, PC (pulsating current) or AC with an optional wave form and frequency and with a maximum amplitude voltage onto said bias voltage applying means. It is possible to make the bias voltage applying means such that it serves also as a gas feed means. It is a matter of course that a gas feed means can be independently provided in the film-forming chamber.

In an alternative, it is possible to control the potential of microwave plasma in a desirable state by applying a bias voltage onto the substrate web constituting the circumferential wall of the film-forming chamber in the present invention.

In a preferred embodiment of applying a bias voltage of DC, the voltage is preferably in the range of from +10 V to +200 V. In this case, a film formed on the substrate web becomes such that excels in the film characteristics.

More detailed explanation will be made of the MW-PCVD method and the MW-PCVD apparatus of the present invention.

In the present invention, the columnar circumferential wall of the film-forming chamber is formed by curving and projecting the moving substrate web by the initial supporting and curving means and the terminal supporting and curving means while leaving a predetermined spacing between said two supporting and curving means in the longitudinal direction as previously described. In order to uniformly generate and confine microwave plasma in the film-forming chamber, a microwave energy is radiated or propagated into said chamber in the width direction of the inner wall face of said chamber such that said microwave energy is confined in said chamber.

For this purpose, a microwave applicator means capable of radiating or propagating a microwave energy into the film-forming chamber in the width direction of the inner face thereof is plunged into the film-forming space through one of the two side faces of the film-forming chamber or it is arranged in the foregoing spacing in vicinity to and in parallel to each of the foregoing two supporting and curving means in the longitudinal direction.

In any of these two cases, a microwave energy is radiated or propagated with a directivity in one direction perpendicular to the direction of microwave to propagate by means of said microwave applicator means in the film-forming space circumscribed by the circumferential wall comprising the moving substrate web. And the microwave energy thus introduced in the film-forming space is reflected or scattered by said substrate web to stay within the film-forming space, wherein the microwave energy is effectively absorbed by a film-forming raw material gas supplied therein by means of a gas feed means to provide uniform microwave plasma causing the formation of a deposited film on the inner face of the circumferential wall of the film-forming chamber. In this case, the inner face of the circumferential wall of the film-forming chamber which comprises the moving substrate web is desired to have a desirable conductivity which permits a current with a desired current density to flow. Therefore, the substrate web is preferred to be a member of an electroconductive material. In any case, it is necessary for the surface of the substrate web situated in the film-forming space to be electroconductive. In the case of using an insulating web as the substrate web, the surface of said insulating member to be situated in the film-forming chamber is applied with an electroconductive coat.

In order for the above microwave plasma to be stably and repeatedly generated in the film-forming space, it is necessary to continuously and effectively radiate or propagate a microwave energy in the film-forming space without leaking said microwave energy in the outside of said space.

For this purpose, for example, in the case where the foregoing microwave applicator means is plunged into the film-forming space through one of the two side faces of the film-forming chamber as previously described, the remaining side face of said film-forming chamber is necessary to be so configured that microwave energy is not leaked therefrom.

Specifically in this respect, the remaining side face is hermetically sealed with an electroconductive member. In an alternative, said side face may be covered with a metal mesh member or a punching metal member having a plurality of perforations respectively with a size being preferably less than a ½ or more preferably, less than a ¼ of one wavelength of the microwave.

In the case where the foregoing microwave applicator means is arranged in the spacing between the pair of supporting and curving means as previously described, the two side faces of the film-forming chamber are sealed or covered in the same manner as in the above case.

In the case where the foregoing microwave applicator means is plunged into the film-forming space, said applicator means is desired to be arranged such that it is situated at the position being equally distant from the inner face of the circumferential wall of the film-forming chamber.

However, there is not any particular limitation for the position of the microwave applicator means to be arranged in the case where the shape of the curved circumferential wall of the film-forming chamber is asymmetrical.

In the case where the microwave applicator means is arranged in vicinity of and parallel to the pair of the supporting and curving rollers as previously described, the direction of microwave energy to be radiated or propagated with the foregoing specific directivity by said microwave applicator means is necessary to be directed toward the spacing provided between the pair of supporting and curving means (this spacing will be hereinafter referred to as "spacing $L_1$"). Further in this case, in order to effectively radiate or propagate microwave energy in the film-forming space, the minimum width of the spacing $L_1$ in the longitudinal direction is desired to be preferably more than a ¼ or more preferably, more than a ½ respectively of one wavelength of the microwave applied.

In any case, due care should be made about the distance between the microwave applicator means and the spacing $L_1$ since the quantity of microwave energy to be radiated or propagated into the film-forming space is often decreased and the confinement of microwave energy within the film-forming space sometimes becomes insufficient if said distance is excessively large.

Thus, the direction of microwave energy to be radiated or propagated with the foregoing specific directivity, the spacing $L_1$ and the foregoing distance between the microwave applicator means and the spacing $L_1$ are importantly related to each other in order to efficiently apply microwave energy into the film-forming space.

Therefore, it is necessary that the system of this part be carefully configured.

The shape of each of the two sides of the columnar portion which is formed by curving and projecting the moving substrate web is preferred to be round. But, it may take other appropriate forms such as oval form, rectangular-like form, etc. In any case, the shape of each of the two sides of the columnar portion is to decide the entire form of the film-forming chamber to be provided and thus, the space of one side and that of the other side are desired to be relatively gentle forms which are symmetrical with each other.

The curved shape of the columnar portion provided by the moving substrate web is necessary to be maintained always constant without causing crease, slack, side-slippage, etc. by the initial and terminal supporting and curving rollers, so that the stability and uniformity of microwave plasma as generated can be maintained constant as desired.

It is possible to use one or more supporting and transporting means such as rotary ring in order to secure the curved shape of the circumferential wall of the film-forming chamber. In more detail in this respect, it is possible to support the moving substrate web constituting the circumferential wall of the film-forming chamber by one or more of said supporting and transporting means provided in the side film-forming space or/and outside of the film-forming chamber.

In the case where such supporting and transporting means is provided in the side of the film-forming space, it is necessary to make the portion of the supporting means to be in contact with the face of the moving substrate web on which a film is to be formed small as much as possible.

As the substrate web, it is desired to use such a web member that has a sufficient flexibility capable of being desirably curved by each of the initial and terminal supporting and curving rollers to provide a desirably projected and curved shape (columnar shape) to be the circumferential wall of the film-forming chamber and capable of stably maintaining said columnar shape in a desired state.

Upon film formation, the film-forming raw material gas introduced into the film-forming chamber by the gas feed means is exhausted by an exhaust means to maintain the film-forming space at a desired pressure.

There is not any particular restriction for the portion of the film-forming chamber from which gas of the film-forming space is exhausted. However, in any case, due care should be made on the exhaust portion of the film-forming chamber not to permit leakage of microwave therefrom but to permit effective gas exhaustion therefrom.

The number of exhaust means to be provided to the film-forming chamber is not a necessary one. A plurality of exhaust means may be provided to the film-forming chamber. In this case, due care should be made so that a film-forming raw material gas be uniformly dispersed or flown in the film-forming space. In a preferred embodiment, an exhaust pipe, which is connected to a vacuum pump, is provided in the foregoing spacing provided between the pair of supporting and curving means.

In the MW-PCVD method of the present invention, it is possible to apply a bias voltage into the film-forming space by using a bias voltage applying means, whereby controlling the potential of microwave plasma as generated. In this case, the bias voltage applying means is desired to be provided such that at least a part thereof is to be contacted with microwave plasma generated in the film-forming space.

The bias voltage applying means may be so designed that it serves also as the gas feed means. In this case, it is necessary for the bias voltage applying means to be so structured that the gas supply system containing a gas reservoir, flow rate controller, gas feed pipings, etc. is electrically isolated from the bias voltage applying system not to cause damages for said gas supply system because of the bias voltage from the bias voltage applying system. The position of isolating the two systems is desired to be in the vicinity of the film-forming space.

In any case, the portion of the bias voltage applying means to be in contact with microwave plasma is desired to have been applied with conductive treatment so as to permit the application of a bias voltage thereonto. As for the material to be used for the conductive treatment, it is necessary to be such a material that does not cause deformation, damage, melt-breakage, etc. In a preferred embodiment, the portion of the bias voltage applying means is constituted by a member comprising a metal or ceramic having a high melting point with a coat of a metal having a high melting point on the surface thereof.

In the case where the bias voltage applying means capable of serving also as the gas feed means is provided in the film-forming space, there is not any particular restriction for the position at which it is arranged as long as it is so arranged as to be in contact with microwave plasma generated with at least a part thereof because the microwave plasma functions as a nearly uniform conductor.

However, in the viewpoint of preventing occurrence of abnormal discharge, etc., it is desired that the bias voltage applying means is arranged at the position in the film-forming space which is apart by preferably more than 10 mm, more preferably more than 20 mm from the inner face of the circumferential wall.

As previously described, the bias voltage applying means may be comprised of a single bias bar or a plurally of bias bars.

In any of these cases, the same due consideration as in the case of the foregoing bias voltage applying means capable of serving also as the gas feed means should be made on the material constituting the bias bar and the position thereof to be arranged in the film-forming space. And for the gas feed means which is installed independently in the film-forming space, it is desired that said gas feed means is made of a dielectric material in the viewpoints of preventing occurrence of abnormal discharge and providing uniform plasma potential in the film-forming space. However, in the case where a relatively low bias voltage is applied, there is not any particular restriction for the material to constitute the gas feed means.

In the case where a single bias bar or a sole bias voltage applying means capable of serving also as the gas feed means is installed in the film-forming space, it is possible to use a bias voltage of DC, PC, AC or two or more of these kinds in combination.

Likewise, in the case where a plurality of bias bars are used, it is possible to apply the same bias voltage or a different bias voltage onto each of those bias bars. In this case, it is also possible to use a bias voltage of DC, PC, AC or two or more of these kinds in combination. In the case where plural kinds of bias voltages are used together, there are provided desirable effects that the range for the plasma potential which can be controlled is widened; the stability and reproducibility of microwave plasma are further improved; the characteristics of a film obtained are further improved; and the resulting film become such that is accompanied with extremely few defects.

Usable as the AC voltage are those having sine wave form, rectangular wave form, chopping wave form, pulse wave form, and combinations of two or more of these wave forms.

Usable as the PC voltage are those having wave forms comprising half-wave rectification or full-wave rectification of said AC voltage, lump wave form, etc.

For the DC voltage or the maximum amplitude voltage as the bias voltage to be applied, it should be determined depending upon the situation of providing a film to be formed with desired characteristics and also upon the situation of causing defects on said film. Said voltage may be maintained constant at a predetermined value from the beginning stage when film formation is started through the final stage where film formation is terminated. However, it is desired to continuously or periodically vary said voltage in order to control the characteristics of a film to be formed and to prevent occurrence of defects in said film. When abnormal discharge such as spark is caused in the film-forming chamber, the bias voltage is suddenly changed. In order to prevent occurrence of this situation, it is necessary to electrically detect said change, reduce the bias voltage or suspend the application thereof and return the bias voltage to the initial level. This process can be carried out by a manual manner. However, it is desired that an automatically controlling circuit is provided in the controlling circuit of the bias voltage applying means.

In the present invention, as previously described, the bias voltage applying means can be designed such that the substrate web constituting the circumferential wall of the film-forming chamber serves as said means. In this case, a ground electrode is provided in the film-forming chamber. The ground electrode may be designed such that it serves also as the gas feed means.

As for the substrate web to be used in the present invention, as previously described, web members respectively made of a conductive material or other web members respectively comprising an insulating member applied with a conductive film on the surface thereof may be optionally used. In any case, such substrate web is required to exhibit a conductivity capable of ensuring a sufficient current density at a temperature to which the substrate web is heated and maintained upon film formation. Preferable examples are webs of metals and webs of semiconductors.

The substrate web may be provided with regions respectively comprising an insulating material on the surface thereof in order to ease the process of dividing the substrate web having one or more semiconductor layers formed thereon into a plurality of elements.

In the case where the area of said insulating region is relatively large, the formation of a film while controlling the plasma potential is not caused on said insulating region. However, in the case where the area of said insulating region is extremely small, almost the same film as formed on the conductive surface is formed also on such small insulating region.

In the MW-PCVD method of the present invention, there is an optimum condition for each of the film-forming parameters in order to stably produce microwave plasma having a desirable uniformity whereby causing the formation of a desirable semiconductor film on the moving substrate web. However, it is difficult to generalize those film-forming parameters since the film-forming parameters such as the shape and volume of the film-forming chamber, the kind of a film-forming raw material gas and the flow rate thereof, the inner pressure of the film-forming chamber, the quantity of microwave energy to be radiated or propagated into said chamber, matching of microwave energy, bias voltage, etc. are complicatedly interrelated in terms of organic relation.

The point by which the MW-PCVD method of the present invention is apparently distinguished from the known MW-PCVD method is that the circumferential wall of the film-forming chamber is constituted by a moving substrate web and a film is continuously on the inner face of said circumferential wall, wherein the substrate web functions as a structural member of the film-forming chamber. The function as the structural member means to physically and chemically isolate the atmospheric space for film formation, i.e., the film-forming space from other atmospheric space which does not concern film formation. More particularly, it means to form an atmosphere having a different gas composition or a different state thereof, to control the direction of a gas flow, or to form an atmosphere having a different pressure.

The MW-PCVD method is to continuously form a desirably uniform semiconductor deposited film on a large area and lengthy substrate web by supportingly curving and projecting said substrate web by supportingly curving and projecting said substrate web while moving it to establish a columnar portion to be a film-forming chamber of which circumferential wall being constituted by said substrate web being curved and projected which has a film-forming space, introducing a film-forming raw material gas into said film-forming space and, at the same time, applying a microwave energy into said film-forming space while evacuating the film-forming space to thereby produce microwave plasma while confining said microwave plasma as produced, whereby continuously forming said semiconductor film on the inner surface of said circumferential wall comprising the moving substrate web. Thus, the substrate web itself functions as the structural member to isolate the film-forming space from the space which does not concern film formation and also functions as a substrate on which a film is to be formed.

In this connection, the atmosphere isolated from the film-forming space is in such a state that the gas composition, the state thereof, the pressure, etc. are significantly different from those in the film-forming space.

On the other hand, in the known MW-PCVD method, the substrate on which a film is to be formed is placed on a substrate holder in a film-forming chamber and thus, the substrate functions as a member to deposit thereon a film-forming precursor produced in the film-forming chamber. It therefore does not function as the structural member as in the present invention. This is a marked point that apparently distinguishes the MW-PCVD method of the present invention from the known MW-PCVD method.

In the known RF plasma CVD method or sputtering method, a substrate on which a film is to be formed occasionally serves also as an electrode to cause and maintain discharge, but it does not work to sufficiently confine plasma. And the substrate in this case does not function as the structural member to sufficiently isolate the film-forming space from other space which does not concern film formation as in the present invention.

Now, in the MW-PCVD method of the present invention, the gas composition and the state thereof in the space isolated from the film-forming space by the moving substrate web constituting the circumferential wall of the film-forming chamber are made different from those in said film-forming space in order to perform film formation only in the film-forming space. For instance, the atmosphere of the space outside the film-forming space may be comprised of a gas which is not capable of contributing to the formation of a film or a gas containing the gas exhausted from the film-forming space. Upon file formation, as previously described, microwave plasma is confined in the film-forming space. In this case, it is important to prevent said microwave plasma from leaking outside the film-forming space in order to improve the stability and the reproducibility of microwave plasma in the film-forming space and to prevent a film from depositing on other portions than the substrate web. For this purpose, it is effective (a) to provide a difference between the pressure of the film-forming space and the pressure of the space outside the film-forming space, (b) to form a gas atmosphere comprising an inert gas having a small ionization cross-section or $H_2$ gas in the space outside the film-forming space or (c) to purposely provide a means for preventing the leakage of microwave plasma from the film-forming space. In the case (c), as previously described, it is effective to seal the space connecting the film-forming space and the space outside the film-forming space with the use of the foregoing conductive member. Other than this, it is also effective no cover the foregoing space by the foregoing metal mesh member or the foregoing punching board having a plurality of perforations.

When the pressure of the space outside the film-forming space is made remarkably lower than the pressure of the film-forming space or when the former pressure is made higher than the latter, the generation of microwave plasma in the space outside the film-forming chamber can be effectively prevented.

In the MW-PCVD method of the present invention, either a leak-wave structure system or a slow-wave structure system may be optionally employed in order to radiate or propagate microwave energy with a directivity in one direction perpendicular to the direction of the microwave to propagate in a substantially uniform state against the crosswise length of the inner face, the circumferential wall comprising the substrate web of the film-forming chamber by the foregoing microwave applicator means. In any case of using said leak-wave structure system or said slow-wave structure system, due care should be made so that the quantity of microwave energy to be radiated or propagated be uniform in the direction of the microwave to propagate. And as previously described, the microwave applicator means is isolated from microwave plasma generated in the film-forming space by means of a microwave transmissive member.

Thus, the microwave energy radiated or propagated from the microwave applicator means can be maintained uniformly in the longitudinal direction without depending upon changes in the outside environment. For instance, even in the case where a film is deposited on the exterior of the isolating means to cause a change in the absolute quantity of microwave energy to be transmitted therethrough, at least the uniformity of microwave plasma in the longitudinal direction can be maintained. And, since the isolating means is provided with the cooling means as previously described, it is possible to avoid occurrence of locally non-uniform transmittance of microwave energy.

According to the MW-PCVD method as above described, it is possible to continuously form a desirable semiconductor deposited film having a uniform thickness and excelling in homogeneity of the property on a large area and lengthy substrate with an improved gas utilization and with a high yield.

In the following, explanation will be made of the MW-PCVD apparatus which is suitable for practicing the foregoing MW-PCVD method of the present invention.

As previously described, the basic constitution of the MW-PCVD apparatus of the present invention comprises: a substantially enclosed columnar film-forming chamber having a curved circumferential wall formed by curving and projecting a substrate web which is delivered by a pay-out mechanism and is moving in the longitudinal direction toward a take-up mechanism as said substrate web is moving toward said take-up mechanism by a pair of means for curving said substrate web while supporting said substrate web; a microwave applicator means capable of radiating microwave energy into said film-forming chamber with a directivity in one direction perpendicular to the direction of microwave to propagate; an isolating means which serves to transmit into said film-forming chamber said microwave energy radiated with a directivity in one direction perpendicular to the direction of microwave to propagate and also serves to isolate said microwave applicator means from microwave plasma to be generated in said film-forming chamber; means for evacuating the inside of said film-forming chamber; means for supplying a film-forming raw material gas into said film-forming chamber; and means for controlling the temperature of said substrate web constituting said circumferential wall on the inner surface of which a film is to be formed.

The MW-PCVD apparatus may further include means for applying a bias voltage into the film-forming space.

In the MW-PCVD apparatus of the present invention, the outside of the substrate web functioning as a structural member of the apparatus may be atmospheric air. However, in a preferred embodiment, said outside is enclosed by an appropriate enclosing means such that it is isolated from the open air. Particularly, the film-forming chamber may be isolated from the open air by means of a mechanically enclosing means with the use of O-ring, gasket, helicoflex, magnetic material, etc. In this case, the structure is made such that the substrate web can be continuously moved while being structurally sealed. In an alternative, there may be provided an enclosing vessel in the outside of the film-forming chamber which is capable of forming an atmosphere comprising a dilution gas which does not provide any negative influence to or provides a positive influence to a film to be formed in the film-forming chamber. Other than this, there may be provided another enclosing vessel in the outside of the film-forming chamber which is capable of vacuumizing said outside.

The MW-PCVD apparatus of the present invention may include a plurality of the foregoing film-forming chambers being horizontally arranged. In this case, the above enclosing vessel may be provided to each of those film-forming chambers. In an alternative, the foregoing enclosing vessel may be provided such that it dominates all the film-forming chambers.

The MW-PCVD apparatus of the present invention may include one or more other film-forming apparatus. In this case, it is desired that every two apparatus are connected by means of, for example, a gas gate means.

In the MW-PCVD apparatus of the present invention, the pressure of the outside of the film-forming chamber may be made to be either in a reduced pressure state or a pressured state. However, in order to prevent the circumferential wall comprising the moving substrate web of the film-forming chamber from deforming because of a difference caused between the pressure in the film-forming chamber and the pressure in the outside of said chamber, it is possible to provide an appropriate auxiliary structural member in the film-forming chamber. As such auxiliary member, there can be illustrated mesh members made of metal, ceramic or reinforced plastics. In this case, the auxiliary structural member comprising one of said mesh members is installed along the inner face of the circumferential wall in the film-forming chamber. In the case where the auxiliary structural mesh member is installed in this way in the film-forming chamber, the portions of the inner face of the circumferential wall shadowed by said mesh member are hardly exposed to microwave plasma and thus, slightly deposited with a film. In view of this, it is necessary to design said auxiliary structural mesh member such that it does not provide such shadowed portions on the inner face of the circumferential wall.

It is possible to design the auxiliary structural mesh member such that it rotates at the same speed as the substrate web moves upon film formation, to thereby purposely form a mesh pattern on said substrate web.

As previously described, the substrate web on which a film is to be deposited is desired to be such that is neither deformed nor distorted because of a high temperature upon film-formation by MW-PCVD process, has a sufficient strength and is conductive. As such substrate web, there can be mentioned web members made of metals or alloys thereof such as stainless steel, aluminum, aluminum alloy, iron, iron alloy, copper, copper alloy, etc., web members made of combinations of two or more of these metals, and web members comprising any of said web members applied with a thin film of a different metal to the surface thereof by sputtering method, evaporation method or coating method, etc.

Other than these web members, there can be also illustrated heat-resistant sheets made of resins such as polyimide, polyamide, polyethyleneterephthalate, epoxy resins, etc. or other sheets made of compositions of said resins and glass fiber, carbon fiber, boron fiber, metal fiber, etc., which were respectively applied with a conductive film of a metal, alloy or transparent conductive oxide film such as ITO to their surface by coating method, evaporation method, sputtering method, etc.

Any of these web members having a conductive surface may have an insulating film comprising $SiO_2$, $Si_3N_4$, $Al_2O_3$, AlN or one of said heat resistant resins on part of the surface thereof.

The substrate web to be used in the present invention is desired to be thin as much as possible as long as it can be desirably curved to provide a desirable curved columnar portion having a desirable strength to constitute the circumferential wall of the film-forming chamber of the present invention, in viewpoints of a cost, storage space, etc.

In general, the thickness of the substrate web is preferably in the range of from 0.01 to 5 mm, more preferably in the range of from 0.02 to 2 mm, and most preferably, in the range of from 0.05 to 1 mm.

As for the width of the substrate web, due consideration should be made that uniform microwave plasma be stably and repeatedly provided in the longitudinal direction (that is, in the width direction of the moving substrate web) in the film-forming chamber of which circumferential wall being constituted by the moving substrate web and the shape of the columnar portion be stably maintained. In general, it is preferably in the range of from 5 to 200 cm and more preferably, in the range of from 10 to 150 cm.

Further, as for the length of the substrate web, there is not any particular restriction therefor.

In the MW-PCVD apparatus of the present invention, as previously described, it is basically required that the moving substrate web is desirably curved and projected to provide a columnar portion to be the circumferential wall of the film-forming chamber by the first roller capable of initially curving and projecting the substrate web delivered from a pay-out mechanism while supporting and conveying said substrate web (this roller will be hereinafter referred to as "initial roller") upward and the second roller capable of terminally curving the substrate web (this roller will be hereinafter referred to as "terminal roller") while supporting and conveying the substrate web in the longitudinal direction toward to a take-up mechanism while leaving a spacing of a predetermined width in the longitudinal direction between the two rollers. And each of the two side faces of the columnar portion are respectively provided with a supporting and conveying rotary ring to maintain the columnar portion in a desired state, wherein one of the two side end parts of the columnar portion is supported by one of the two rotary rings in such way that the substrate web is contacted on the surface of said rotary ring. The substrate web is moved by rotating said two rollers or/and said two rings by a driving motor. In the case of moving the substrate web by rotating the two rotary rings, it is possible to use as said two rotary rings a pair of toothed rotary rings. In this case, it is necessary that the two side portions of the substrate web are provided with perforations corresponding to the projections of the two toothed rotary rings. In an alternative, it is possible to slidably convey the substrate web along the two rings without rotating them. Each of the two rotary rings is desired to have the same shape. A truly round shape is the most desirable. However, they may take other shapes such as oval shape, rectangular-like shape, etc.

In the MW-PCVD apparatus of the present invention, it is an important factor to maintain the transportation speed of the substrate web constant in order to prevent the substrate web from loosening, wrinkling, side-sliding, etc. during its transportation. For this purpose, it is desired to provide a detecting mechanism for detecting the transportation speed of the substrate web and a transportation speed controlling mechanism for automatically controlling the transportation speed of the substrate web based on the signal from said detecting mechanism to the supportingly and conveying mechanism. These mechanisms are also effective for controlling the thickness of a semiconductor film to be formed on the substrate web.

In any case, each of the two rotary rings is situated so that it is unavoidably exposed to microwave plasma upon film formation. Thus, there is a fear that a film is deposited also on the surface thereof and said film is removed therefrom to fly into a film deposited on the inner face of the circumferential wall comprising the moving substrate web of the film-forming chamber, wherein the resulting film becomes such that is accompanied with defects such as pin holes. Therefore, it is required for the rotary ring to have a sufficient resistance not only against heat and but also against corrosion. It is also required therefor to be hardly deposited with a film or to have an ability to hold a repeatedly deposited film thereon without being removed. In view of this, the rotary ring is necessary to be made of a selected material so that said requirements be fulfilled.

Specifically, the rotary ring is made of a material selected from the group consisting of stainless steel, nickel, titanium, vanadium, tungsten, molybdenum, niobium, and alloys of two or more of these metals. The surface of the rotary ring made of one of these materials may be applied with a coat comprising a ceramic material such as alumina, quartz, magnesia, zirconia or silicon nitride which is formed by a flame-spraying method, evaporation method, sputtering method, ion-plating method, CVD-coating method, etc. Further, the rotary ring may be made of one of the foregoing ceramic materials or one of composites comprising two or more of these ceramic materials. The surface of the rotary ring may be a mirror-ground surface or an uneven surface depending upon the related factors such as stress of a film to be deposited thereon.

It is desired to purposely remove a film deposited on the rotary rings before it is peeled off and dispersed in the film-forming chamber. The removal of said film is desired to be conducted by dry-etching or decomposing said film under vacuum condition and thereafter, carrying out chemical or physical treatments such as wet-etching or beads-blast. The foregoing initial and terminal rollers are so designed respectively to have a larger area to contact with the substrate web in comparison with the foregoing pair of rotary rings. Thus, the heat exchange effectiveness of the roller with the substrate web is large. Therefore, it is necessary to have due consideration that the moving substrate web is not undesirably heated or cooled by the initial and terminal curving rollers. For this purpose, it is desired to provide an appropriate temperature controlling mechanism to said rollers. Further, it is possible to provide an appropriate conveying tension detecting mechanism to said rollers. This is effective in order to maintain the transportation speed of each of the rollers constant. Further, in order to prevent the moving substrate web from deflecting, twisting, side-sliding, etc. upon supportingly curving by each of the rollers, a crown mechanism may be provided to said rollers.

As previously described, the form of each of the two side faces of the foregoing columnar portion to be the circumferential wall of the film-forming chamber may take a cylindrical form, oval form, rectangular-like form, etc.

In any case, it is desired that both the two side faces are substantially symmetrical to the central axis of the microwave applicator means in the viewpoint of providing a desirable uniformity for a film to be formed on the inner face of said circumferential wall.

The inside circular length of the foregoing columnar portion is to decide the volume of a microwave plasma region to be provided. Particularly, the thickness of a film to be formed on the inner face of the circumferential wall comprising the moving substrate web of the film-forming chamber will be decided upon depending upon a period of time during which said inner face is exposed to said microwave plasma region wherein said inner face is being transported.

In the interrelation with the peripheral length of the foregoing isolating means to be exposed to said microwave plasma region, the utilization efficiency of a film-forming raw material gas will be decided.

In view of this, the inside circular length of the foregoing columnar portion is desired to be preferably 5 fold or less or more preferably, 4 fold or less over said peripheral length of the isolating means.

The microwave power density ($W/cm^3$) in order to maintain microwave plasma in the foregoing microwave plasma region will be decided with the interrelations among the kind of a film-forming raw material gas to be used, its flow rate, the inner pressure, the radiating or propagating ability of microwave energy from the microwave applicator means, the absolute volume of the microwave plasma region, etc. Thus, it is extremely difficult to generalize said microwave power density.

The control of the thickness of a film to be formed on the inner face of the circumferential wall of the film-forming chamber may be carried out by placing a substrate cover over part of said inner face.

Now, as for the substrate web to be used in the present invention, it may have an electroconductive layer thereon in case where necessary. For example, in the case of continuously preparing a solar cell, when a substrate web made of an electroconductive material is used, it is not necessary to apply an electroconductive layer thereon since the electroconductive substrate web itself is capable of being a current outputting electrode. However, when a substrate web made of an insulating material such as synthetic resin is used, it is necessary to provide an electroconductive layer capable of serving as the current outputting electrode on the surface thereof, on which a semiconductor film is to be formed in the MW-PCVD apparatus of the present invention. Such electroconductive layer may be formed by applying onto the surface of the insulating substrate web an electroconductive material of Al, Ag, Pt, Au, Ni, Ti, To, W, Fe, V, Cr, Cu, stainless steel, brass, nichrome, $SnO_2$, $In_2O_3$, ZnO, $SnO_2$-$In_2O_3$(ITO) or TCO by means of metal plating, evaporation or sputtering.

In any case, any of these substrate webs may have an insulating layer portion intermittently on the surface thereof in order to ease the operation of dividing the product into a plurality of independent elements.

Further, in order to improve the reflectivity of a long wavelength light on the surface of a substrate, or in order to prevent mutual dispersions of the constituent elements of a substrate and a deposited film formed thereon between the substrate and the deposited film or in order to prevent occurrence of a short circuit, it is possible to provide an appropriate layer on the substrate, which comprises a metal different from the constituent element of the substrate or of the electroconductive layer.

In the case of preparing a solar cell of the type that light is impinged from the substrate side, when there is used a relatively transparent web member as the substrate web, it is desired that an electroconductive thin layer comprising the foregoing electroconductive oxide material or metal is provided on the surface thereof in advance.

The substrate web may be one that has an even surface or an uneven surface accompanied with minute irregularities.

In the case of the latter substrate web, the minute irregularities may be comprised of a plurality of dimples in round, conical or pyramid forms, wherein the maximum height (R max) of the dimple is preferably from 500 to 5000 Å.

The solar cell prepared using such substrate web becomes such that light is irregularly reflected to increase the optical path length of light reflected at the surface thereof.

The foregoing isolating means, which encapsulates therein the microwave applicator means capable of radiating or propagating microwave energy into the film-forming space of the film-forming chamber, takes such a structure which makes it possible to plunge said microwave applicator into the film-forming space through one of the two side faces of the film-forming chamber or other structure which makes it possible to arrange said microwave applicator in close proximity to the film-forming space.

Thus, in any of these two cases, the structure of the isolating means is necessary to be configured in a shape designed to isolate the vacuum atmosphere of the film-forming space from the outside air and it can withstand forces due to the presence of a pressure differential. The structure of the isolating means may take the form of a cylindrical form, a hemi-cylindrical form or the like form which as a smoothly curved surface.

As for the thickness of the circumferential wall of the isolating means, it somewhat differs depending upon the kind of a material by which said wall is constituted, but in general, it is desired to be preferably in the rage from 0.5 to 5 mm.

The circumferential wall of the isolating means (that is, the isolating vessel) is desired to be constituted by a dielectric material which permits microwave energy from the microwave applicator means to be radiated or propagated into the film-forming space with a minimum loss and excels in airtightness to prohibit flow of air into the film-forming chamber.

Examples of such material are glasses or fine ceramics such as quartz, alumina, silicon nitride, beryllia, magnesia, boron nitride, silicon carbide, etc.

In the case where the isolating vessel of the isolating means takes the form of a cylindrical form or a hemi-cylindrical form, its inside diameter is desired to be the irreducible minimum of a demand to encapsulate the microwave applicator means therein in a state that said applicator means is maintained without touching the inner face of the circumferential wall thereof.

It is desired to provide an appropriate microwave confining means or an appropriate dummy load to the remaining side face of the film-forming chamber in the case where the microwave applicator means encapsulated in the isolating means is plunged into the film-forming space through one of the two side faces of the film-forming chamber.

In a preferred embodiment of the case where the microwave-confining means is used, the entirety of the projected portion at said remaining side face is covered by an electroconductive member comprising a punching board or a metal mesh member, wherein said electroconductive member is electrically grounded. The dummy load can be effectively used in order to avoid occurrence of a problem on the matching of microwave at a high power lever.

As previously described, the isolating means is desired to be thermally cooled by an appropriate cooling means to a sufficiently low temperature in order to prevent it from being cracked or damaged due to the heat of the microwave energy and/or plasma energy.

The cooling means may be a flux of air adapted to flow about the interior of the isolating means. Other than this, the cooling means may be a concentric enclosure formed interiorly of and shaped similarly to said isolating means so as to define a conduit between said isolating means and said concentric enclosure, wherein a coolant fluid such as water, oils or freon can be used to flow.

Now, the foregoing cylindrically-shaped isolating means in the present invention may be employed together with a conventional slow-wave microwave applicator, wherein a slow-wave structure is used to couple microwave energy through an evanescent wave into the film-forming space. In this case, the use of such thin isolating means ensures that said isolating means can be thermally cooled to a sufficiently low temperature. Thus, a relatively high power microwave energy can be applied into the film-forming space to provide a high electron density plasma without said isolating means being cracked or damaged due to the heat generated there.

In the MW-PCVD apparatus of the present invention, at least part of the peripheral surface of the foregoing isolating means which is situated in the film-forming space and is to be contacted with microwave plasma therein is also deposited with a film upon repeating film formation. In this case, it depends upon the kind and the property of the film deposited on said surface part of said isolating means but in general, microwave energy to be radiated or propagated from the microwave applicator means is absorbed or reflected by such deposited film to cause reduction in the quantity of microwave energy radiated or propagated into the film-forming space. As a result, there will sometimes happen such a case that microwave plasma cannot be stably maintained and as a result, reduction is caused in the film deposition rate, and the resulting film becomes such that it is defective in the characteristics. In order to avoid occurrence of this situation, it is necessary to periodically clean the peripheral surface of the isolating means by dry-etching, wet-etching or a mechanical cleaning means. The cleaning of said peripheral surface can be favorably carried out by dry-etching the film deposited thereon while maintaining the vacuum of the film-forming chamber. In alternative, said cleaning can be also carried out in the following way. That is, the whole unit of the isolating means containing the microwave applicator means therein is transported into a load lock chamber being connected to the film-forming chamber without breaking the vacuum of the film-forming chamber. Said isolating means is cleaned by dry-etching or a mechanical cleaning means in said load lock chamber, and is returned to the film-forming chamber. In a further alternative, the isolating means having a deposited film thereon can be replaced by a new one.

Further, in addition, it is possible to maintain the isolating means in a desirable state without being deposited with a film thereon by continuously moving a sheet made of a dielectric material equivalent to the dielectric material constituting the isolating means along the surface thereof situated in the film-forming space to thereby prevent a film from depositing on said surface and taking out the sheet having a film deposited thereon from the film-forming chamber.

The microwave applicator means has such a structure that functions to radiate or propagate microwave energy supplied from a microwave power source into the film-forming space in a desirable state, whereby decomposing a film-forming raw material gas supplied from the gas feed means with the action of said microwave energy to stably generate plasma causes the formation of a semiconductor film on the inner face of the circumferential wall comprising the moving substrate web of the film-forming chamber and maintains said plasma constant in a desirable state.

The microwave applicator means in the MW-PCVD apparatus for the present invention comprises a waveguide means having an open end portion at the terminal end portion thereof.

As such waveguide means, there can be illustrated a microwave waveguide in the form of a circular, rectangular or elliptic shape.

In any case, standing waves can be effectively prevented from appearing am the terminal end portion of the waveguide means because in has the foregoing open end portion at the terminal end portion thereof.

It is to be understood that no negative influence is provided because of said open end portion.

In the MW-PCVD apparatus of the present invention, a rectangular waveguide is preferably used for the propagation of microwave from the microwave power source from the viewpoint that it is commercially available.

In the case of using a circular shaped waveguide as the microwave applicator means, it is necessary to minimize propagation loss of microwave energy at a converting portion to said waveguide. In view of this, it is desired to use a rectangular shaped waveguide or a circular shaped waveguide respectively of the electromagnetic horn type.

In the case of using said circular shaped waveguide as the microwave applicator means in the MW-PCVD apparatus of the present invention, it should be properly configured to a size designed to optimize its ability depending upon the frequency band and propagating mode of microwave used. In this case, due care is to be made so that neither propagation loss nor multiple modes are caused in said circular shaped waveguide.

Specifically, an EIAJ standard circular shaped waveguide and other circular shaped waveguides (for 2.45 GHz) or 90 mm or 100 mm in inside diameter (produced by CANON KABUSHIKI KAISHA) may be optionally used.

Likewise, in the case of using the above rectangular waveguide, its kind should be decided properly depending upon the frequency band and propagating mode of microwave to be used. In addition, its cut-off frequency is desired to be smaller than the frequency to be used.

In view of this, usable as the rectangular waveguide are, for example, those standardized under JIS, EIAJ, IEC or JAN. Other than these rectangular waveguides, it is also possible to use a rectangular waveguide for 2.45 GHz having a rectangular cross-section of 96 mm in width and 27 mm in height.

In the MW-PCVD apparatus of the present invention, the microwave energy from the microwave power source is effectively radiated or propagated into the film-forming space because of using the foregoing microwave applicator, so that problems relating to the so-called reflected wave can be desirably eliminated, and relatively stable discharge can be maintained without using a microwave matching circuit such as three-stub tuner or E-H tuner in the microwave circuit.

However, in the case where there is a fear that a strong reflected wave would be caused before commencement of discharge or such strong reflected wave would be caused by abnormal discharge after discharge is started, it is desired to use the foregoing microwave matching circuit in order to protect the microwave power source.

The foregoing waveguide includes at least one aperture formed through one face thereof for substantially uniformly radiating microwave energy therefrom into the film-forming space. The size of the apertures may be periodic or a periodic. The aperture is desired to be rectangularly shaped. In the case where a plurality of apertures are spacedly positioned along the longitudinal extent of the waveguide, microwave plasma can be distributed uniformly in the crosswise direction of the inner face of the circumferential wall comprising the substrate web of the film-forming chamber by blocking and unblocking various ones of the apertures. In this case, microwave energy radiated is desired to be of a wavelength more than a ½ of one wavelength of the microwave radiated in the longitudinal direction of the waveguide and radiated substantially equally and uniformly in said crosswise direction. In the cases where a single elongated, rectangular aperture is provided, it is desired to be such that it is larger than one wavelength of the microwave used and formed through substantially the entire length and width dimension of one face of the waveguide.

In order to improve the uniformity of a microwave energy to be radiated in the longitudinal direction, it is desired to use a microwave shutter capable of adjusting the opening of said aperture. The microwave shutter is desired to be of a shape similar to the surface shape of the waveguide. More particularly, the microwave shutter may take the form of a strip shape, an elongated trapezoidal shape, or other shapes comprising modifications of these shapes.

In any case, the microwave shutter is formed of a metal plate or a synthetic resin plate applied with electroconductive treatment.

One end of the microwave shutter is operatively affixed to the waveguide by a single connection on the side of said waveguide nearest to the microwave power source. The microwave shutter thus arranged is properly operated in order to adjust the opening of the aperture. After the adjustment of the opening of the aperture is completed as desired, said shutter can be fixed in the viewpoint of improving the stability of microwave plasma generated.

In the case where said aperture is made such that the ratio of the length to the width is large, the size of its long edge is desired to be substantially equal to the width of the substrate web.

The microwave shutter is desired to be electrically grounded only at the foregoing connection. And it is desired that there is formed an insulating barrier between the waveguide and the microwave shutter by an appropriate dielectric insulator means. Additional contact between the microwave shutter and the waveguide will cause an arcing contact.

The applicator means above described are of the type generally known as a leaky microwave structure in that microwave energy is allowed to leak or radiate therefrom through one or more apertures.

Alternatively, it is possible to use a slow-wave microwave structure instead of the above microwave applicator means in the present invention. The slow-wave structure delivers a significant part of microwave energy by means of evanescent waves. Thus, for the slow-wave structure, there are shortcomings such as the rapid fall-off of applied energy coupled to the plasma as a function of distance along the traverse to the microwave structure. However, this shortcoming is substantially eliminated by the use of means for isolating the microwave applicator means from the plasma region.

In the MW-PCVD apparatus, as previously described, it is possible to provide a bias voltage applying means to the film-forming chamber in order to control the plasma potential.

In the following, explanation will be made of the constitution and arrangement of the bias voltage applying means in the MW-PCVD apparatus of the present invention with reference to FIG. 19(a) through FIG. 19(d).

Figure 2:
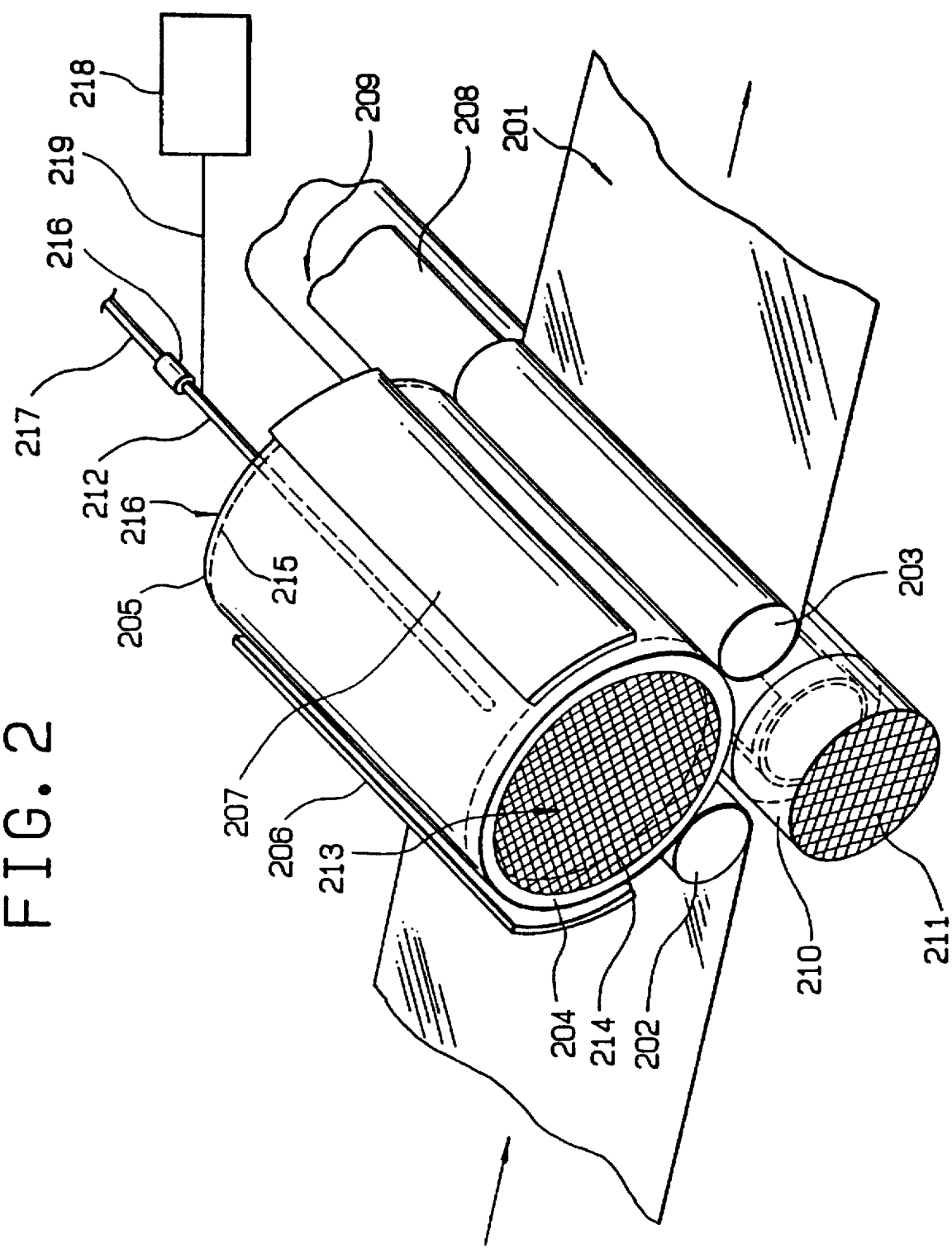
FIG. 2 is a schematic diagram illustrating the constitution of a second representative embodiment of the MW-PCVD apparatus according to the present invention which is a partial modification of the apparatus shown in FIG. 1 wherein a bias voltage applying means is additionally provided.

FIG. 19(a) though FIG. 19(d) are schematic cross-section views respectively illustrating the constitution of the bias voltage applying means to be provided to the MW-PCVD apparatus in the way as shown by numeral reference 212 in FIG. 2. In each case, the constitution of the bias voltage applying means is shown as a schematic side cross-section view in the H-H' direction in FIG. 8(a).

FIG. 19(a) shows a typical example of the case where the bias voltage applying means serves also as the gas feed means.

In FIG. 19(a), a substrate web 1901 as the circumferential wall of the film-forming chamber is electrically grounded and it is moved while maintaining its columnar shape by a supportingly curving roller 1902. Numeral reference 1903 stands for a bias voltage applying pipe capable of serving as a gas feed pipe. Numeral reference 1910 stands for a gas supply pipe extending from a gas reservoir (not shown), and said gas supply pipe 1910 is connected through an insulating fitting 1909 to the bias voltage applying pipe 1903. Numeral reference 1907 stands for a bias voltage generating power source which is electrically connected to the bias voltage applying pipe 1903. As the power source 1907, there can be used a commercially available DC power source or AC power source. Other than these power sources, there can be used a power source system capable of applying a selected bias voltage having various wave forms and frequencies wherein a wave form outputted, for example, from a function generator is amplified by a precision power amplifier.

It is desired to set up a system which always monitors the bias voltage and the bias current value by a recorder and sends the date obtained to a control circuit for improving the stability and reproducibility of microwave plasma and controlling occurrence of abnormal discharge.

There is not any particular restriction for the position at which the bias voltage applying pipe 1903 is arranged in the film-forming chamber as long as the bias voltage applying pipe is situated so as to contact with microwave plasma generated.

In a preferred embodiment from the viewpoint of preventing occurrence of abnormal discharge, the bias voltage applying pipe 1903 is arranged at the position apart, preferably by more than 10 mm or more preferably by more than 20 mm, from the inner face of the circumferential wall 1901.

Since the bias voltage applying pipe 1903 also serves to feed a film-forming raw material gas into the film-forming space, said pipe is desired to be provided with a plurality of gas liberation holes or slits capable of uniformly spouting a film-forming raw material gas preferably in the longitudinal direction.

As for the diameter and the length of the bias voltage applying pipe 1903, they are designed such that a desired current density to provided. As for its surface area, it is desired to be small as much as possible as long as said current density is ensured in the viewpoint of preventing film deposition thereon which will cause contamination for a film formed on the inner face of the circumferential wall comprising the moving substrate and also cause reduction in the gas utilization efficiency.

FIG. 19(b) and FIG. 19(d) are schematic explanatory views respectively illustrating a typical example of the constitution wherein an independent bias voltage applying means and an independent gas feed means are separately arranged in the film-forming chamber.

In the case of FIG. 19(b), there is arranged a bias bar 1904. And in the case of FIG. 19(d), there are separately arranged a first bias bar 1904 and a second bias bar 1906. In any of these two cases, it is possible to arrange one or more additional bias bars.

In the case of FIG. 19(d), the two bias voltage applying power sources 1907 and 1908 can be of a different specification or of the same specification.

In any of the two cases, a film-forming raw material gas is supplied through a gas feed pipe 1905 into the film-forming space.

The gas feed pipe 1905 is desired to be made of a dielectrical material from the viewpoint of preventing occurrence of abnormal discharge and providing a uniform plasma potential. However, it can be made of a conductive material. In this case, it is necessary for the gas feed pipe to be electrically grounded.

FIG. 19(c) schematically illustrates a typical example of the case where a bias voltage is applied onto the substrate web as the circumferential wall of the film-forming chamber wherein a bias voltage applying power source is electrically connected to the substrate web 1901 and a gas feed pipe 1905 made of a conductive material is electrically grounded. In this case, it is possible to use a gas feed pipe 1905 made of a dielectric material and to provide an earth electrode.

In this case, there is not any particular restriction for the position of said gas feed pipe to be arranged in the film-forming chamber as long as it is situated so as to contact with microwave plasma generated.

As previously described, the MW-PCVD apparatus of the present invention may include one or more other film-forming vacuum vessels. In this case, each of the vacuum vessels is isolated one from the other by means of a gas gate means capable of allowing transportation of the substrate web from one to the other under vacuum. In the MW-PCVD apparatus, the inside of the film-forming chamber (or vacuum vessel) is desired to be maintained at such a pressure which is required for the performance near the minimum value of the modified Pashen's curve. Therefore, the inside pressure of the other vacuum vessel connected to the film-forming chamber (vacuum vessel) of the present invention often becomes equivalent or superior to that of the film-forming chamber (vacuum vessel) of the present invention. Thus, it is required that said gas gate means functions to prevent a film-forming raw material gas used in one vacuum vessel from dispersing into the other vacuum vessel. In order to design the gas gate means so as to satisfy this requirement, the principle of a gas gate means disclosed in the specification of U.S. Pat. No. 4,438,723 may be employed.

Particularly in this respect, the gas gate means is required to stand against a pressure difference of about $10^6$ fold. And as the exhaust pump therefor, there is used an exhaust pump having a high exhausting capacity such as oil diffusion pump, turbomolecular pump, mechanical booster pump, etc.

The cross-section form of the gas gate means is desired to be in the form of a slit or the like form. The scale therefore is properly designed based on the result obtained by a known conductance computation equation in connection with its full length and the exhausting capacity of the exhaust pump used.

In order to sufficiently isolate one vacuum vessel from the other vacuum vessel, it is desired to use a gate gas. Usable as the gate gas are rare gases such as Ar, He, Ne, Kr, Xe, Rn, etc. and dilution gases for diluting a film-forming raw material such as $H_2$. The flow rate of such gate gas can be properly decided depending upon the conductance of the entire gas gate and the exhausting capacity of the exhaust pump used, utilizing the pressure gradient shown FIG. 19(a) or FIG. 19(b). In the case of FIG. 19(a), it is understood that the point where pressure becomes maximum is situated near the central part of the gas gate and thus, the gate gas dividedly flows from the central part toward the respective adjacent vacuum vessels positioned in the both sides. In the case of FIG. 19(b), it is understood that the point where pressure becomes minimum is situated near the central part of the gas gate and thus, the gate gas is exhausted together with film-forming raw material gases from the adjacent vacuum vessels through the central part. In this connection, in each of these two cases, it is possible to prevent mutual dispersion of the gases used in the adjacent vacuum vessels. In practice, this is done by measuring the amount of a gas to be dispersed by a mass spectrometer or by analyzing the composition of the resultant deposited film to find an optimum condition.

In the MW-PCVD apparatus of the present invention, the film formation in a vacuum vessel other than the film-forming chamber of the present invention can be carried out by any known film-forming method such as RF plasma CVD method, sputtering method, reactive sputtering method, ion plating method, light-induced CVD method, thermally induced CVD method, MO-CVD method, MBE method, HR-CVD method, etc. It is also possible to use a microwave plasma CVD method similar to the MW-PCVD method of the present invention.

The frequency of microwave to be used in the MW-PCVD apparatus is preferably of 2.45 GHz but it is possible to use microwave of other frequency.

The oscillation system in order to provide stable discharge is desired to be continuous oscillation. And its ripple width is desired to be preferably within 30% or more preferably within 10% in the use output region.

In order to obtain a high quality semiconductor film, it is desired to continue film formation without opening the film-forming chamber to the open air. However, there is a limit for the length of a substrate web used. Therefore, it is necessary to connect a new substrate web to the previously used substrate web by means of an appropriate connecting means such as welding. This can be carried out, for example, in a processing chamber arranged next to the chamber containing the pay-out mechanism or the take-up mechanism.

In the following, explanation is to be made about the processing of a substrate web upon film formation.

FIG. 18(a) through FIG. 18(j) are, respectively, schematic views for illustrating the outline of the substrate web processing chamber and the operation of the substrate web U mOn film-formation.

In FIG. 18, 1801a represents a first substrate web processing chamber disposed on the side of delivering the substrate web and 1801b represents a second substrate web processing chamber disposed on the side of taking-up the substrate web, in which are contained a pair of rollers 1807a or a pair of rollers 1807b, respectively made of a fluorine-contained rubber, a pair of cutting blades 1808a or 1808b and a welding jig 1809a or 1809b.

Figure 18A:
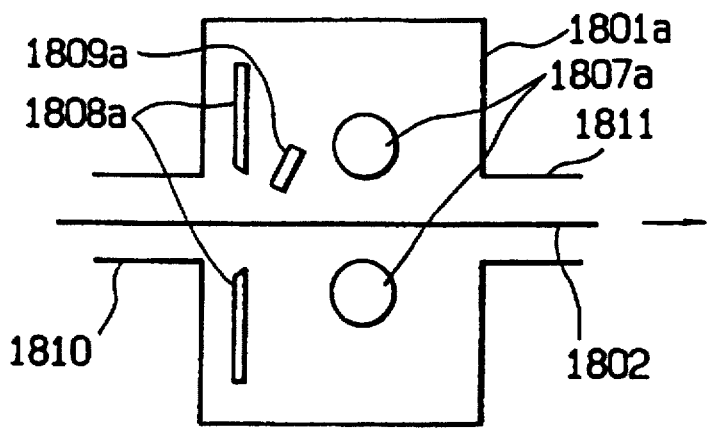
FIGS. 18(a) through 18(j) are schematic views for illustrating the operations in the substrate web processing chamber in the present invention.

That is, FIG. 18(a) shows a state of the usual film-formation, in which the substrate web 1802 is moving in the direction of an arrow, and the rollers 1807a, the cutting blades 1808a and the welding jig 1809a are not in contact with the substrate web 1802. Numeral reference 1810 represents a connection pipe (gas gate) with an initial substrate web container (not shown). Numeral reference 1811 represents a connection pipe (gas gate) with a first film-forming chamber (A).

Figure 18B:
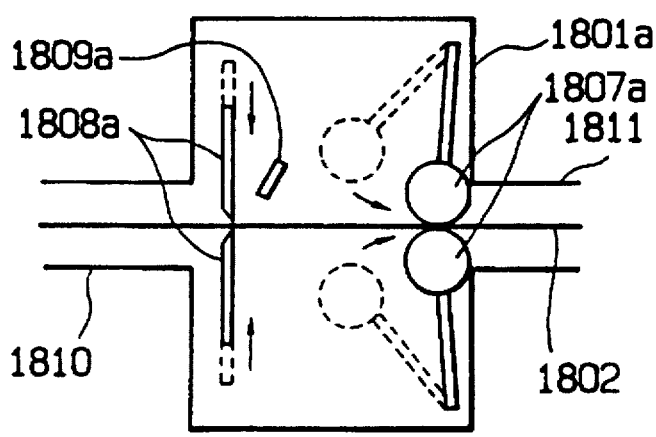

FIG. 18(b) shows a first step for replacing with a new substrate web after the completion of the film-forming step to one roll of the substrate web. At first, the substrate web 1802 is stopped, and the rollers 1807a are moved from the positions shown by the dotted lines along the directions of arrows shown in the figure, thereby brought into close contact with the substrate web 1802 and the wall of the substrate web processing chamber 1801a. In this state, the initial substrate web container and the first film-forming chamber are separated in a gas sealed manner of operating the gas gate. Then, the pair of cutting blades 1808a are operated in the directions of arrows to cut the substrate web 1802. The cutting blades 1808a are constituted so as to mechanically, electrically or thermally cut the substrate web 1802.

Figure 18C:
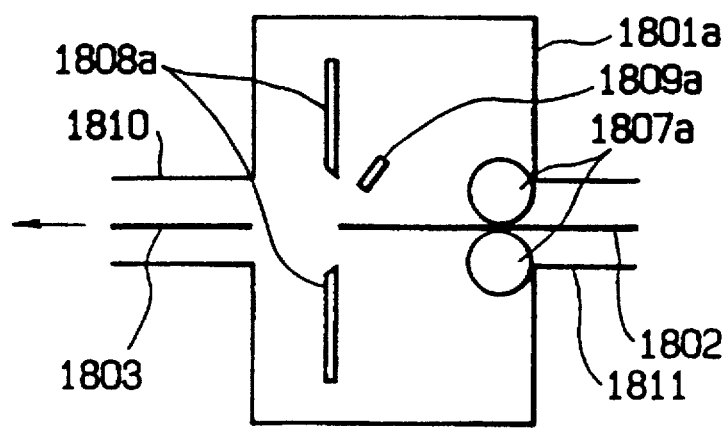

FIG. 18(c) shows a state in which the cut and separated substrate web 1803 is taken up on the side of the initial substrate web container.

The above cutting and making-up steps can be conducted at the inside of the initial substrate web container under a vacuum state or under a state of leaking to atmospheric air.

Figure 18D:
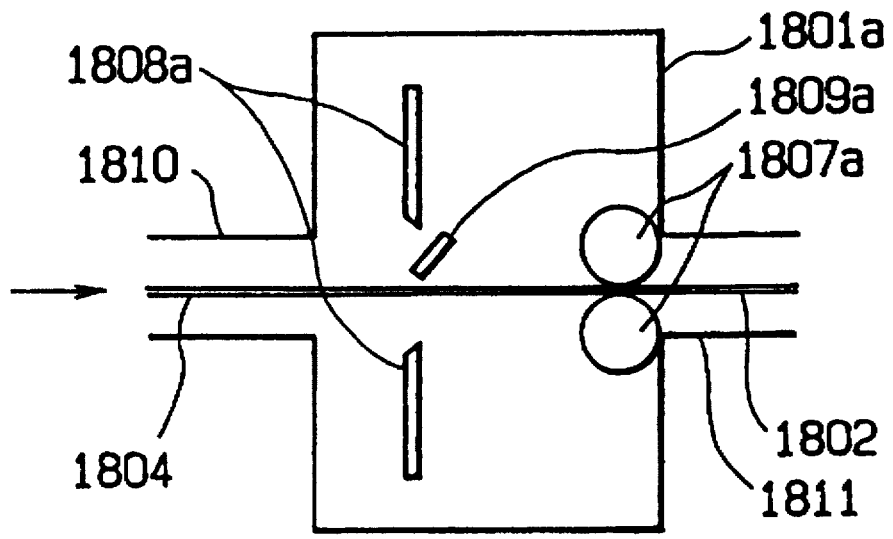

FIG. 18(d) shows a step in which new substrate web 1804 is supplied and connected with the former substrate web 1802. The substrate webs 1804 and 1802 are brought into contact at the ends thereof and then connected by welding using the welding jig 1809a.

Figure 18E:
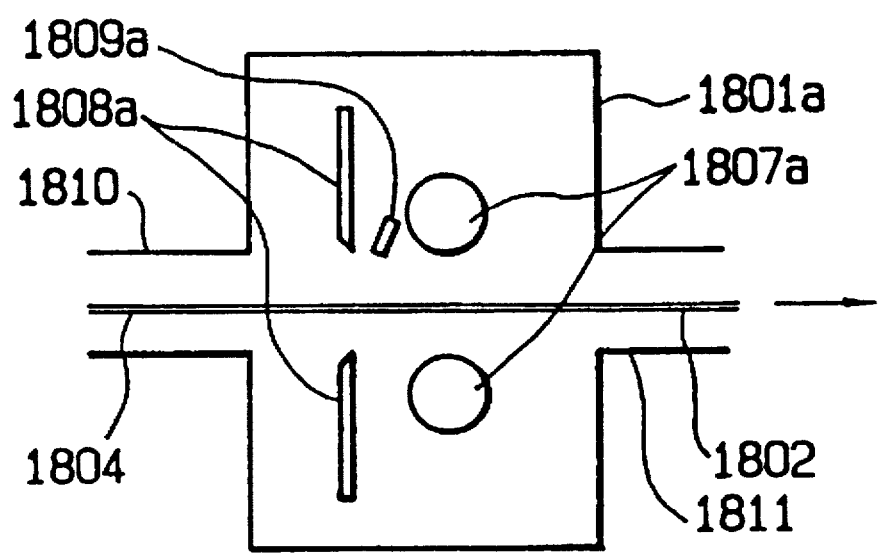

FIG. 18(e) shows a state in which the inside of the first substrate web container (not shown) is evacuated to reduce the pressure difference relative to the film-forming chamber sufficiently and, thereafter, the pair of rollers 1807a are parted from the substrate web 1802 and the substrate webs 1802 and 1804 are taken up.

Now, description will be made for the operation on the side of taking-up the substrate web.

Figure 18F:
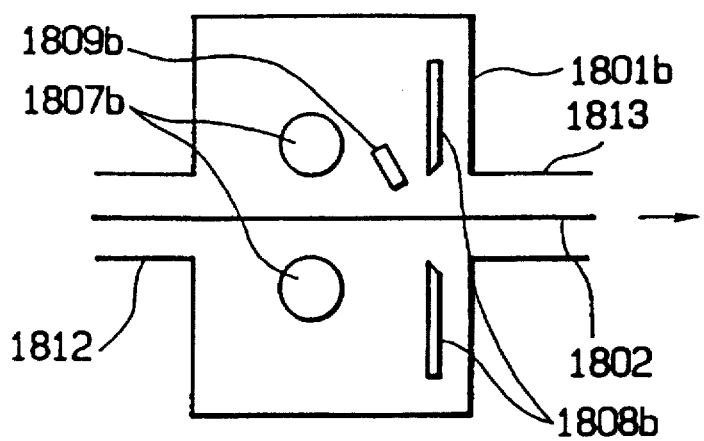

FIG. 18(f) shows a usual film-forming state, in which respective jigs are disposed substantially in symmetry with those described in FIG. 18(a).

Figure 18G:
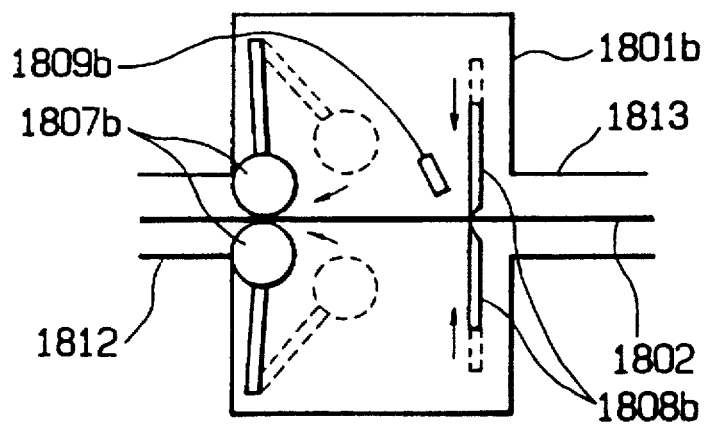

FIG. 18(g) shows a step for taking out one roll of a substrate web after the completion of the film formation thereto, and placing an empty bobbin for taking-up the substrate web applied with the subsequent film-forming step.

At first, the substrate web 1802 is stopped, and the pair of rollers 1807b are moved from the positions shown by the dotted lines along the directions of arrows shown in the figure and are brought into close contact with the substrate web 1802 and the wall of the second substrate web processing chamber 1801b. In this state, the foregoing terminal substrate web container and the film-forming chamber are separated in a gastight manner of operating the gas gate. Then, the pair of cutting blades 1808b are moved in the directions of arrows to cut the substrate web 1802. The cutting blades 1808b are constituted with any one of those capable of mechanically, electrically or thermally cutting the substrate web 1802.

Figure 18H:
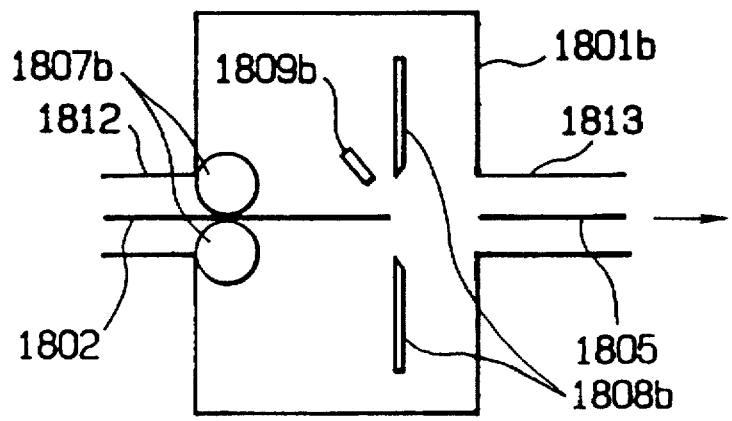

FIG. 18(h) shows the state in which a cut substrate web 1805 after the completion of the film-forming step is taken up on the side of the terminal substrate web container.

The above cutting and taking-up steps can be conducted at the inside of the terminal substrate web container under an evacuated state or under a state of leaking to atmospheric.

Figure 18I:
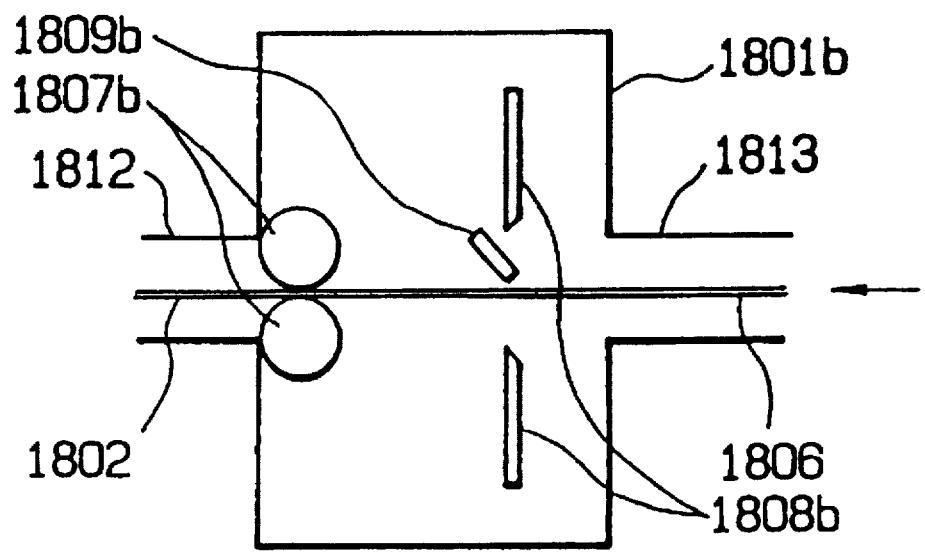

FIG. 18(i) shows a step in which a stand-by substrate web 1806 for taking-up use attached to a new taking-up bobbin is supplied and connected with the substrate web 1802. The substrate web 1806 and the substrate web 1802 are in contact with each other at the ends thereof and then connected by welding using the welding jig 1809b.

Figure 18J:
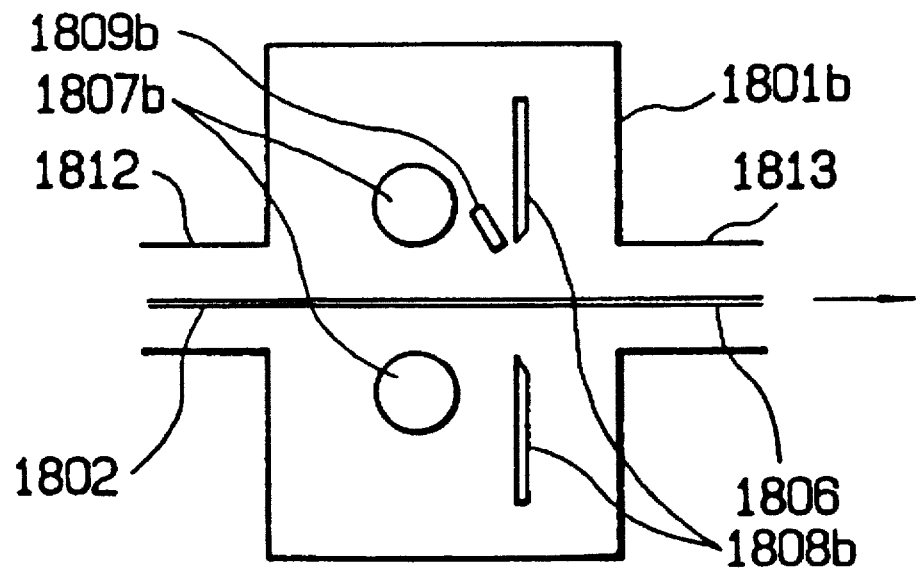

FIG. 18(j) shows a state in which the inside of the terminal substrate web container (not shown) is evacuated to reduce the pressure difference with a film-forming chamber (B) sufficiently and thereafter, the rollers 1807b are parted from the substrate web 1802 and the wall of the second substrate web processing chamber 1801b and the substrate webs 1802 and 1806 are being taken up.

As shown in FIG. 18, since the substrate web can be replaced by another substrate web easily while maintaining the evacuated state in the film-forming chamber, the operation efficiency can be remarkably improved. In addition, since the inside of the film-forming chamber is not exposed to the atmospheric pressure, there is not any occasion for the inner wall of the film-forming chamber to be wetted with water, thereby enabling to stably prepare semiconductor devices of high quality.

According to the present invention, there can be continuously formed a desirable high quality amorphous or crystalline semiconductor film on a large area and lengthy substrate at a high deposition rate and with a high yield.

As such semiconductor film, there can be mentioned, for example, so-called IV Group semiconductor films containing Si, Ge, C, etc.; so-called IV Group alloy semiconductor films containing SiGe, SiC, SiSn, etc.; so-called III–V Group semiconductor films containing GaAs, GaP, GaSb, InP, InAs, etc.; and so-called II–VI Group semiconductor films containing ZnSe, ZnS, ZnTe, CdS, CdSe, CdTe, etc.

As the film-forming raw material gases for forming these semiconductor films in the present invention, there can be used known gaseous or easily gasifiable compounds capable of contributing to the formation of such semiconductor films such as hydrides, halides or organic metal compounds of one or more of the constituent elements of a semiconductor film to be formed.

One or more of these film-forming raw material gases are introduced through the foregoing gas feed means or the foregoing bias voltage applying means capable of serving as the gas feed means into the film-forming chamber upon film formation.

It is possible that the film-forming raw material gas is mixed with an appropriate rare gas or dilution gas and then introduced into the film-forming chamber. Usable as such rare gas are, for example, He, Ne, Ar, Kr, Xe, Rn, etc. Usable as such dilution gas are, for example, $H_2$, HF, HCl, etc.

In the present invention, the semiconductor film to be continuously formed on the foregoing substrate web maybe controlled with respect to the valence electron or the forbidden band width by incorporating a valence electron controlling element or a forbidden band width controlling element into the film upon its formation. In this case, a raw material gas capable of imparting such element is introduced into the film-forming chamber independently or together with the film-forming raw material gas, optionally while being mixed with the above rare gas or dilution gas.

In the present invention, as previously described, the film-forming raw material gas is uniformly spouted out into the film-forming space from the gas feed pipe provided with one or more gas liberation holes or the bias voltage applying pipe capable of serving as the gas feed pipe which is provided with one or more gas liberation holes, wherein the film-forming raw material gas is decomposed with the action of a microwave energy applied from the foregoing microwave applicator means to provided plasma region causing the formation of a deposited film on the inner face of the circumferential wall comprising the moving substrate web of the film-forming chamber. Thus, in any case, pare of the gas feed pipe which is situated in the film-forming space is unavoidably contacted with microwave plasma. Therefore, due regard should be made so that the gas feed pipe is not damaged with microwave plasma. In view of this, the gas feed pipe is necessary to be constituted by a selected member which is not damaged with the action of microwave plasma and which permits smooth gas flow. Usable as such a member are, for example, heat resistant metal members of stainless steel, nickel, titanium, niobium, tantalum, tungsten, vanadium, molybdenum, etc., and composite members comprising ceramics such as alumina, silicon nitride or quartz which are applied with films of said metals to their surfaces by a flame spraying method. Other than these, it is possible to use alumina, silicon nitride, quartz or composites of two or more of these ceramics to constitute the gas feed pipe.

In the case of using the bias voltage applying pipe, due regard should be made so that it is not damaged with the action of microwave plasma and it effectively functions as a bias voltage applying means and also as a gas spouting means. Thus, the bias voltage applying pipe is necessary to be constituted by a heat resistant and electroconductive member. Usable as such a member are, for example, metal members of stainless steel, nickel, titanium, niobium, tantalum, tungsten, vanadium, molybdenum, etc., and composite members comprising ceramics such as alumina, silicon nitride or quartz which are applied with films of said metals to their surfaces by a flame spraying method.

Further, in the present invention, as previously described, the film-forming raw material gas supplied into the film-forming space is entirely or sometimes partly decomposed with the action of microwave energy to produce precursors causing the formation of a deposited film on the moving substrate web. In this case, there is sometimes caused an undesirable gas composition in the film-forming space. And there sometimes remains the film-forming raw material gas undecomposed in the film-forming space.

It is necessary to continuously exhaust these gases upon film formation.

However, when the exhaust cross-section area is made excessively great, microwave energy is likely to leak through the exhaust means to the outside, whereby causing undesirable influences on the instruments provided in the outside and sometimes on human body.

In view of this, the exhaustion of the gas from the film-forming space is desired to be carried out by one of the following three methods (1) to (3).

(1) A mesh member or a punching board respectively made of a dielectric material is provided to the side face of each of the pair of supportingly transporting rotary rings. Gas is exhausted through said mesh member or punching board while prohibiting leakage of microwave energy. The size of perforations of said mesh member or punching board is desired to be such that is capable of causing a difference between the pressure in the film-forming space and that in the outside and also capable of prohibiting leakage of microwave energy. Particularly, the maximum of said size in terms of diameter with respect to each of those perforations is desired to be a figure of preferably less than a ½ or more preferably less than a ¼ respectively of one wavelength of the microwave used. And the numeral aperture is desired to be preferably less than 80% or more preferably, less than 60%. In this case, it is possible to exhaust gas through the spacing provided between the pair of supportingly curving rollers, or through one of the two slits (spacings) or both of them which are provided between said pair of rollers and the foregoing isolating means. The size (width in the longitudinal direction) of each of the spacings is desired to be preferably less than a ½ or more preferably, less than a ¼ respectively of one wavelength of the microwave used.

(2) A thin plate made of a dielectric material is hermetically provided to the side face of each of said pair of supportingly transporting rotary rings so as to prohibit leakage of microwave energy and gas. Gas is exhausted through the spacing provided between the pair of supportingly curving rollers, or through one of the two slits (spacings) or both of them which are provided between said pair of rollers and the foregoing isolating means. The size (width in the longitudinal direction) of each of the spacings is desired to be preferably less than a ½ or more preferably, less than a ¼ respectively of one wavelength of the microwave used.

(3) Combination of the methods (1) and (2), wherein the foregoing mesh member or the foregoing punching board is provided to the side face of one of the pair of supportingly transporting rollers and the foregoing thin plate is provided to the side face of the remaining supportingly transporting roller.

The MW-PCVD apparatus of the present invention will now be explained more specifically with reference to the drawings as follows, The description is not intended to limit the scope of the present invention.

Apparatus Embodiment 1

FIG. 1 is a schematic perspective view illustrating the constitution of a first embodiment of the MW-PCVD apparatus according to the present invention.

In FIG. 1, a substrate web 101 is continuously moved in the direction expressed by an arrow while being supported and while being curved and projected by an initial supporting and transporting roller 102 and a terminal supporting and transporting roller 103 to provide a columnar portion 116 to be the circumferential wall of a film-forming chamber having a film-forming space 113, the two side ends of said columnar portion being supported by a pair of supporting and transporting rings 104 and 105 so that the shape of said columnar portion is maintained in a desired state. Numeral references 106 and 107 respectively stand for a temperature controlling mechanism for heating or cooling the substrate web, which are provided over the external face of said circumferential wall comprising the moving substrate web 101. The temperature controlling mechanisms 106 and 107 are designed such that each of them can be independently operated (this part is not shown).

Numeral references 114 and 115 respectively stand for a microwave-leakage prohibiting metal mesh member which is provided to one of said pair of rotary rings such that the open side face of the film-forming chamber is apparently sealed so as to prohibit leakage of microwave energy from the film-forming space 113 and the metal mesh member functions to confine microwave plasma generated within said film-forming space. Numeral reference 112 stands for a gas feed pipe having a plurality of gas liberation holes capable of spouting a film-forming raw material gas into the film-forming space 113. The gas feed pipe 112 is connected through a gas flow controlling means (not shown) to a gas reservoir (not shown). Numeral reference 108 stands for a microwave applicator extending from a microwave power source (not shown), which is encapsuled in cylindrical isolating means 109. Thus, the microwave applicator 108 is isolated from the film-forming space 113 (plasma region in other words) by means of the isolating means 109. Numeral reference 110 stands for a microwave-leakage prohibiting cylindrical metal cylinder which is provided at one end portion of the isolating means 109. Numeral reference 111 stands for a microwave-leakage prohibiting metal mesh member which is provided on the metal cylinder 110 such that the open side face of said metal cylinder is apparently sealed so as to prohibit leakage of microwave energy therethrough.

Gas of the film-forming space 113 can be exhausted by means of an exhaust means (not shown) through the two spacings provided between the isolating means 109 and each of the pair of the rollers 102 and 103.

It is possible to exhaust said gas through the metal mesh members 114 and 115 by means of an exhaust means (not shown).

Figure 3:
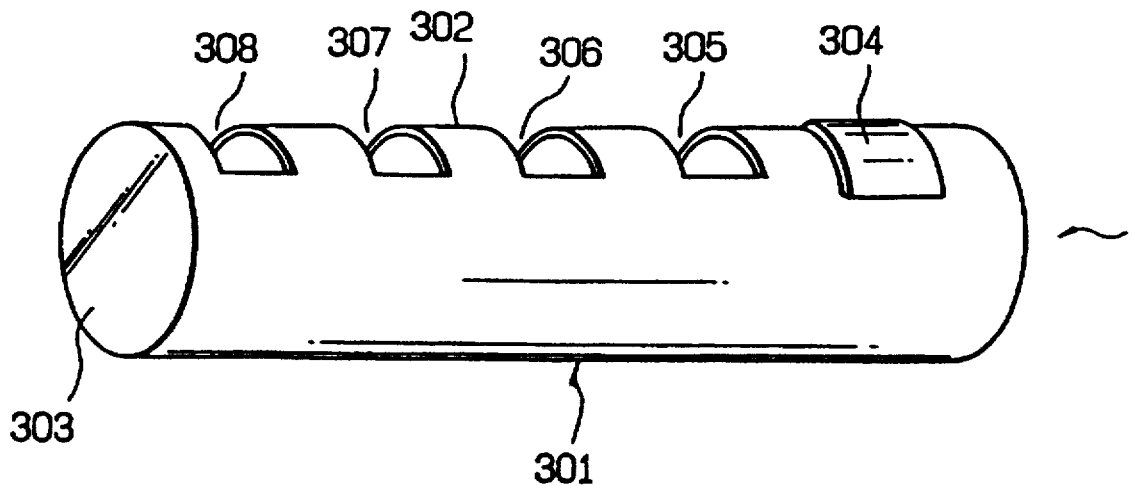
FIG. 3 is a schematic diagram of the constitution of a representative microwave applicator means according to the present invention.

FIG. 3 is a schematic explanatory view of the constitution of a typical microwave applicator means (301 in FIG. 3) to be used as the foregoing microwave applicator 108 (in FIG. 1). The microwave applicator means 301 shown in FIG. 3 comprises a circular wave guide 302 having an end portion 303 and having a plurality of apertures 304–308 spacedly formed through one side face thereof. The other end of the waveguide 302 is connected to a microwave power source (not shown). Numeral reference 304 stands for a microwave shutter means which is operatively provided in the waveguide 302 only for the aperture 304 in this case such that it can block or unblock said aperture in order for uniform microwave energy to be radiated.

Apparatus Embodiment 2

There can be mentioned the case where the apparatus described in Apparatus Embodiment 1 is placed in an isolating vessel.

Figure 5:
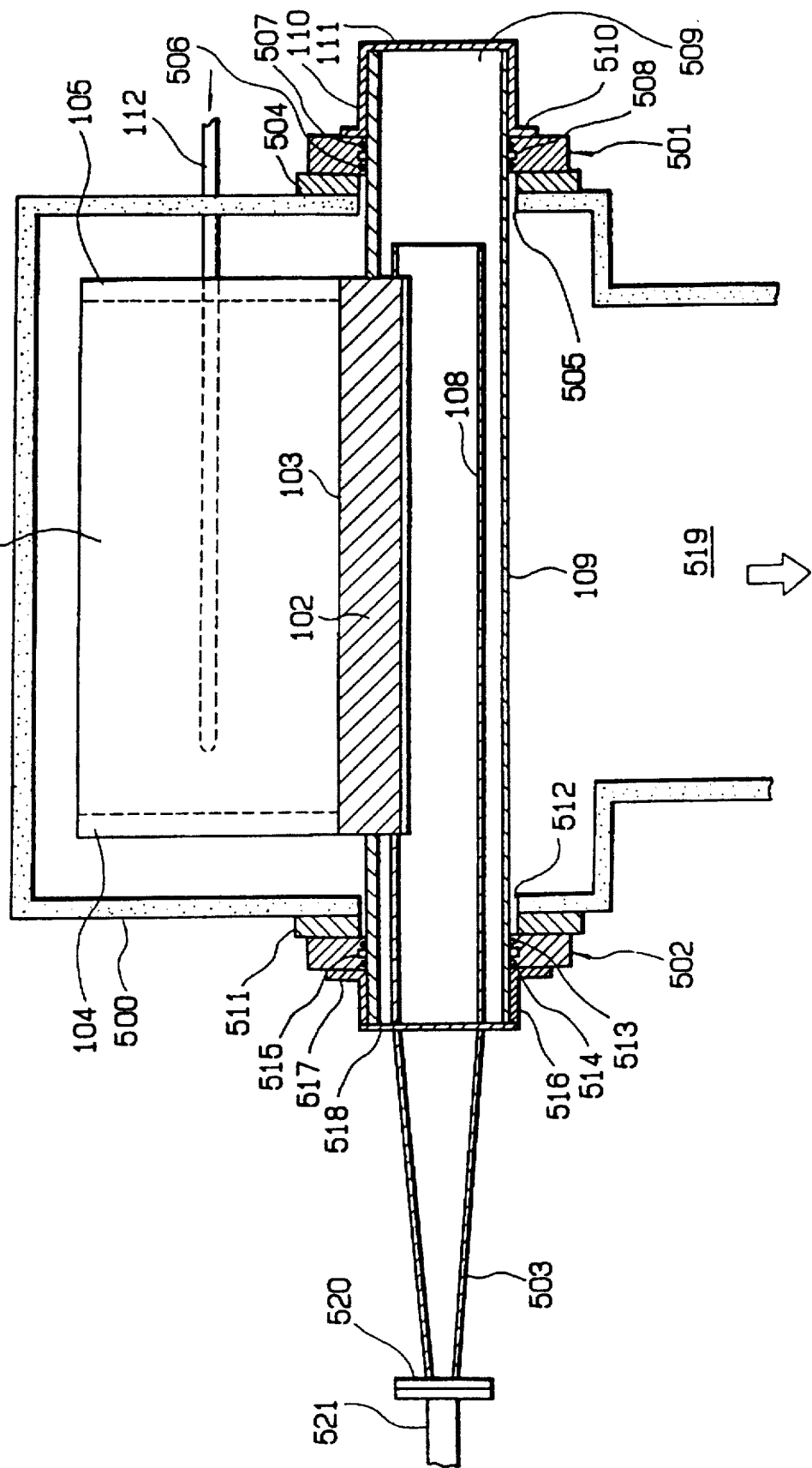
FIG. 5 is a schematic cross-section view of the MW-PCVD apparatus shown in FIG. 2.

FIG. 5 shows a schematic diagram of the constitution in this case.

In FIG. 5, numeral reference 500 stands for an isolating vessel made of a corrosion resistant material such as stainless steel which hermetically encloses the MW-PCVD apparatus shown in FIG. 1, numeral reference 519 stands for an exhaust pipe being connected to a vacuum pump (not shown). The inside of the isolating vessel 500 can be evacuated by actuating said vacuum pump.

The cylindrical isolating means 109 is arranged to pass through the isolating vessel and it is hermetically fixed to the circumferential wall of the isolating vessel through a pair of connection flanges 504, 511 and a pair of fixing flanges 501, 502 as shown in FIG. 5.

Each of the flanges 501, 502, 504 and 511 is desired to be made of a corrosion resistant material such as stainless steel. These flanges 501 and 502 are disconnectably arranged. Each of the connection flanges 504 and 511 is directly fixed to the circumferential wall of the isolating vessel 500. In this case, there is provided a spacing 505 or 512 along the exterior of the cylindrical isolating means 109 which provides a through passage capable of allowing insertion of said isolating means. Each of the fixing flanges 501 and 502 is hermetically fixed to the exterior of the isolating means 109.

For each of the fixing flanges 501 and 502, there is provided a cooling channel 508 or 515 at the central position thereof such that said channel is contacted to the exterior of the isolating means 109. Further, for each of the fixing flanges 501 and 502, there are provided a pair of O-rings (506, 507) or (513, 514) are hermetically compressed against the exterior of the isolating means 109 so as to insure air-tight and water-tight seal of the isolating vessel 500.

Said pair of O-rings are arranged to sandwich the cooling channel. A coolant fluid such as water, oil or freon flows in the cooling channel to cool the pair of O-rings. Each of the O-rings is made of an appropriate highly heat-resistant material. In a preferred embodiment, the O-rings are arranged at positions sufficiently apart from microwave plasma region provided in the film-forming space.

Numeral reference 110 stands for a metal cylinder which is capped on one end portion of the isolating means 109. Numeral reference 111 stands for a metal mesh member provided to the metal cylinder 110 such that open face 509 of one end portion of said cylinder is apparently sealed to prohibit leakage of microwave energy therefrom.

The metal mesh member 111 in this case also functions to allow flow of a cooling air into the isolating means 109, whereby cooling said isolating means 109.

The metal cylinder 110 is provided with grounding fingers 510 through which said cylinder is electrically contacted with the fixing flange 501. This results in preventing leakage of microwave energy from the isolating vessel 500 to the outside. It is possible to connect a dummy load for absorbing microwave energy (not shown) at the end portion of the cylinder 110.

Likewise, numeral reference 516 stands for a metal cylinder which is capped on the other end portion of the isolating means 109 which is situated in the side of a microwave power source (not shown). The metal cylinder 516 is provided with grounding fingers 517 through which said cylinder is electrically contacted with the fixing flange 502. This results in preventing leakage of microwave energy from the isolating vessel 500 to the outside. Numeral reference 518 stands for a connection plate (comprising a choke flange, for example) which is provided to the open side face of said metal cylinder 516. This connection plate 518 serves to connect the microwave applicator means 108 to a mode converting waveguide 503 capable of converting the mode of a rectangular waveguide into the mode of a circular waveguide (hereinafter referred to as "mode converter"). The structure of this part is necessary to be so configured that microwave energy is not leaked therefrom. Numeral reference 521 stands for a rectangular waveguide extending from a microwave power source (not shown). The rectangular waveguide is connected through a connection flange 520 to the mode convertor 503.

Shown in FIG. 7(a) is a schematic diagram of a typical embodiment of a mechanism for transporting the substrate web 101 in the above MW-PCVD apparatus.

In this embodiment, there is shown the case when the substrate web 101 is curved and projected by a pair of supportingly transporting rollers 102 and 103 to provide a columnar portion to be the circumferential wall of the film-forming chamber, wherein the initial curved portion (hereinafter referred to as "portion 1") of the substrate web and the terminal curved portion (hereinafter referred to as "portion 2") of the substrate web are respectively situated in vicinity to the exterior of the isolating means 109 in which a circular waveguide 302 having an aperture 308 formed through the top portion thereof is encapsuled. The columnar portion is supported by a pair of supportingly conveying rotary rings 104, 105. Each of the two side faces of the columnar portion is covered by the foregoing microwave confining metal mesh member or the foregoing microwave confining thin plate 701 or 701' in the same manner as previously described. The width of each of the rotary rings 104 and 105 to be contacted to the inner face of said circumferential wall comprising the substrate web is desired to be of a small ratio as much as possible to the width of said inner face from the viewpoints of minimizing deposition of a film on the rotary rings and providing a high use efficiency of a film product obtained.

Numeral references 106 and 107 in FIG. 7(a) respectively stand for a temperature controlling mechanism for heating or cooling the substrate web 101 in order to maintain said substrate web at a desired temperature upon film formation.

Each of these temperature controlling mechanism 106 and 107 may be configured to touch the exterior of the substrate web in order to provide a desirable heat exchange effectiveness.

There is a tendency that the temperature of part of the substrate web to be exposed to microwave plasma in the film-forming space upon film formation is apt to locally heighten in an undesirable state. Therefore, it is necessary to observe and control the temperature of the substrate web upon film formation. This can be done by the temperature controlling mechanisms 106 and 107. Numeral reference 112 in FIG. 7(a) stands for a gas feed pipe extended into the film-forming space. The gas feed pipe 112 is preferably provided with a plurality of gas liberation holes capable of spouting a film-forming raw material gas uniformly into the film-forming space.

The gas feed pipe is connected through a gas flow regulating means (not shown) to a gas reservoir.

In FIG. 7(a), $L_1$ stands for a spacing (that is, spacing $L_1$) provided between the portion 1 and the exterior of the isolating means 109, $L_2$ stands for a spacing (that is, spacing $L_2$) provided between the portion 2 and the exterior of the isolation means 109, and $L_3$ stands for a spacing (that is, spacing $L_3$) provided between the portion 1 and the portion 2.

The crosswise width of each of the spacings $L_1$ and $L_2$ is desired to be designed such that it does not go beyond a ½ of one wavelength of the microwave used, whereby preventing leakage of microwave energy into the outside and confining microwave plasma within the film-forming space.

Due regard should be made also on the crosswise width of the spacing $L_3$ so that microwave energy is allowed to effectively radiate through said spacing into the film-forming space from the microwave applicator means.

In this respect, it is desired to be greater than a ¼ of one wavelength of the microwave used. In the case shown in FIG. 7(a), it is intended that microwave energy be radiated with the foregoing specific directivity vertically in the upward direction from the aperture 308 of the circular waveguide 302. Thus, the structural system with respect to the aperture and the spacing $L_3$ is desired to be made such that microwave energy be vertically radiated through the spacing $L_3$ into the film-forming space from the aperture 308 of the circular waveguide 302.

Apparatus Embodiment 3

There can be mentioned the case where the apparatus described in Apparatus Embodiment 1 contains a microwave applicator means having the constitution shown in FIGS. 4(a) through 4(d) as the microwave applicator means 108 shown in FIG. 1.

Figure 4A:
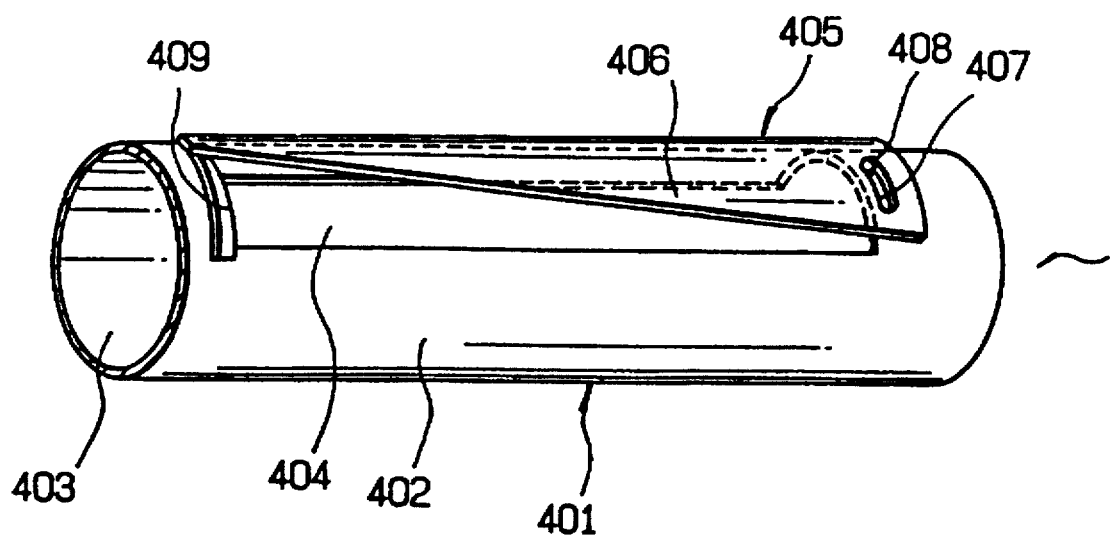
FIGS. 4(a) through 4(d) are schematic explanatory views of the constituents of the microwave applicator means according to the present invention.
Figure 4B:
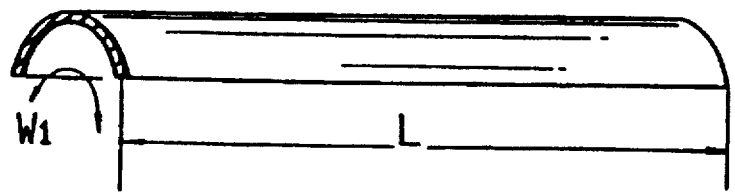
Figure 4C:
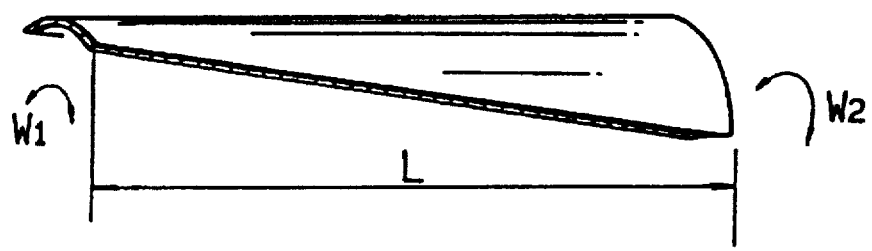
Figure 4D:
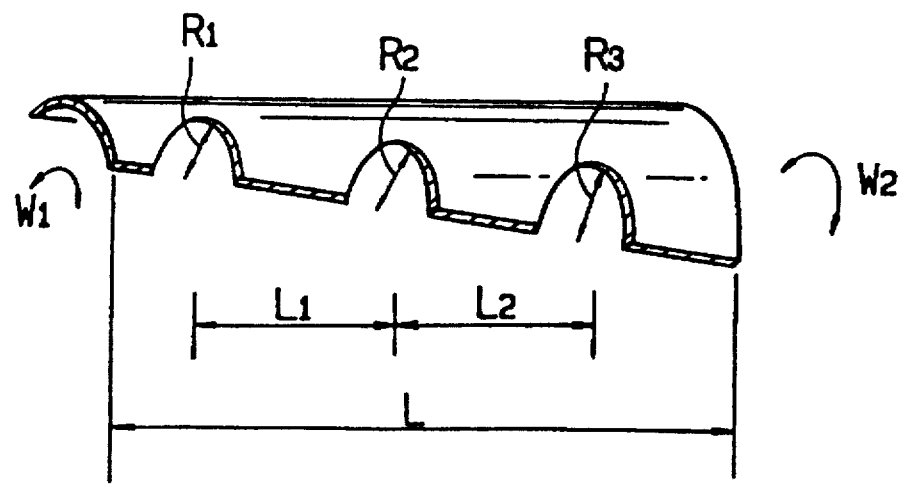

As illustrated in FIG. 4(a), the microwave applicator means 401 includes a circular microwave waveguide means 402 extending from a microwave power source (not shown) which has an open end portion thereof 403 and a single elongated, rectangular aperture 404 which is larger than one wavelength of the microwave used, and formed through substantially the entire length and width dimension of one face of said circular waveguide means 402. The open end portion 403 is adapted to avoid occurrence of standing waves. However, a sealed end portion may be employed for a given application. The microwave applicator means 401 thus configured allows microwave energy to radiate from the entire aperture 404, though without more, the concentration of microwave energy becomes greatest at the end of the aperture 404 situated nearest to the microwave power source. However, it is possible to properly regulate the concentration of the microwave energy by employing at least one metallic microwave shutter 406 operatively fixed to the waveguide means 402 by a single connection 405 consisting of a fixing pin 408 through a channel 407 on the side of the wave guide means 402 nearest to the microwave power source. The microwave shutter 406 may take other appropriate forms other than the above, such as shown in FIGS. 4(b) to 4(d). Disposed at the opposite end of the aperture 404, and along the edges of said aperture, are dielectric insulator means 409 made of glass or teflon. The dielectric insulator means 409 are adapted to form an insulating barrier between the waveguide means 402 and the microwave shutter 406. This is necessary since the microwave shutter 406 may be grounded to the waveguide means 402 only at the connection 405. Additional contact between the microwave shutter 406 and the waveguide means 402 will cause an arcing contact.

Apparatus Embodiments 4 and 5

There can be mentioned a modification of the apparatus described in Apparatus Embodiment 1, wherein the isolating means having the microwave applicator means encapsuled therein is arranged in the film-forming space in the way shown in FIG. 7(b), and a modification of the apparatus described in Apparatus Embodiment 2, wherein the isolating means having the microwave applicator means encapsuled therein is arranged in the film-forming space in the way shown in FIG. 7(b). Explanation is to be made with reference to FIG. 7(b) while also referring to FIG. 7(a).

The constitution of FIG. 7 (b) differs from that of FIG. 7(a) with the point that the isolating means 109 is arranged in the outside of the film-forming space in the case of FIG. 7(a) but it is arranged in the film-forming space in the case of FIG. 7(b).

As illustrated in FIG. 7(b), the microwave applicator means 302 encapsuled in the isolating means 109 is arranged in the film-forming space concentrically with the columnar substrate web 101 constituting the circumferential wall of the film-forming chamber. In any case, said isolating means 109 is inserted into the film-forming space through one of the two side faces (702, 702') of the film-forming chamber. There unavoidably remains a space around the interior of the isolating means 109 at the side face through which said isolating means is passed into said film-forming space.

Therefore, it is also necessary to seal said space with the foregoing perforated metal member or the foregoing thin plate in addition to sealing the remaining side face in order to prohibit leakage of microwave energy therefrom.

And as for the crosswise width of the spacing $L_4$ provided between the pair of the supportingly curving rollers 102 and 103, it is necessary to design it such that microwave energy is prevented from leaking outside the film-forming space therefrom.

In view of this, the width of the spacing $L_4$ is made to be a width of less than a ½ of one wavelength the microwave used.

As for the position of the isolating means to be arranged in the film-forming space, it is not always necessary to be concentric with the circumferential wall of the film-forming chamber but it can be varied depending upon the related situation. Further, there is not any particular restriction for the direction of the opening of the aperture 308 of the applicator means 302. There is not any particular restriction for the position of the gas feed pipe 112, but it is desired to be arranged in the film-forming space provided between the exterior of the isolating means 109 and the inner face of the circumferential wall of the film forming chamber.

Apparatus Embodiments 6 and 7

There can be mentioned a modification of the apparatus described in Apparatus Embodiment 4 and a modification of the apparatus described in Apparatus Embodiment 5, wherein the microwave applicator means 301 is replaced by the microwave applicator means 401 shown in FIG. 4(a).

Apparatus Embodiments 8 to 11

There can be mentioned four modifications of the apparatus described in Apparatus Embodiments 1, 2, 4 and 5, wherein the microwave applicator means 301 is replaced by a slow microwave structure microwave applicator means (not shown).

Apparatus Embodiment 12

There can be mentioned a MW-PCVD apparatus comprising the apparatus shown in Apparatus Embodiment 2 which includes a substrate feed chamber 1001 for paying out a substrate web 101 and an unload chamber 1002 for taking up said substrate web as shown in FIG. 10, said substrate feed chamber being connected through a gas gate 1021 to an isolating chamber 500 containing the film-forming chamber shown in FIG. 1 and said unload chamber 1002 being connected through a gas gate 1022 to said isolation chamber 500.

As shown in FIG. 10, the substrate feed chamber 1001 contains a pay-out reel 1003 having a substrate web 101 wound thereon and a feed roller 1005. The unload chamber 1002 contains a take-up reel 1004 and a feed roller 1006. Each of the chambers 1001 and 1002 contains a temperature controlling mechanism 1012 or 1013 for heating or cooling the substrate web 101 and is provided with an exhaust pipe 1010 or 1011 provided with a slot valve 1007 or 1008 for regulating the exhausting degree.

Each of the chambers 1001 and 1002 is also provided with a pressure gage 1014 or 1015.

In the substrate feed chamber 1001, there can be provided an appropriate protective sheet feed means for feeding a protective sheet for the rear face of the substrate web to be delivered. Likewise, in the unload chamber 1002, there can be provided an appropriate protective sheet feed means for feeding a protective sheet for the surface of a film formed on the substrate web 101. As such protective sheet, there can be mentioned a thin film sheet made of a heat resistant resin such as polyimide resin and polyfluoroethylene fiber or a thin glass wool sheet. Numeral references 1016 and 1017 are gate gas supply pipes. Numeral references 1018 and 1019 are exhaust pipes respectively for exhausting a gate gas and sometimes, a film-forming raw material gas.

Apparatus Embodiment 13

Figure 12:
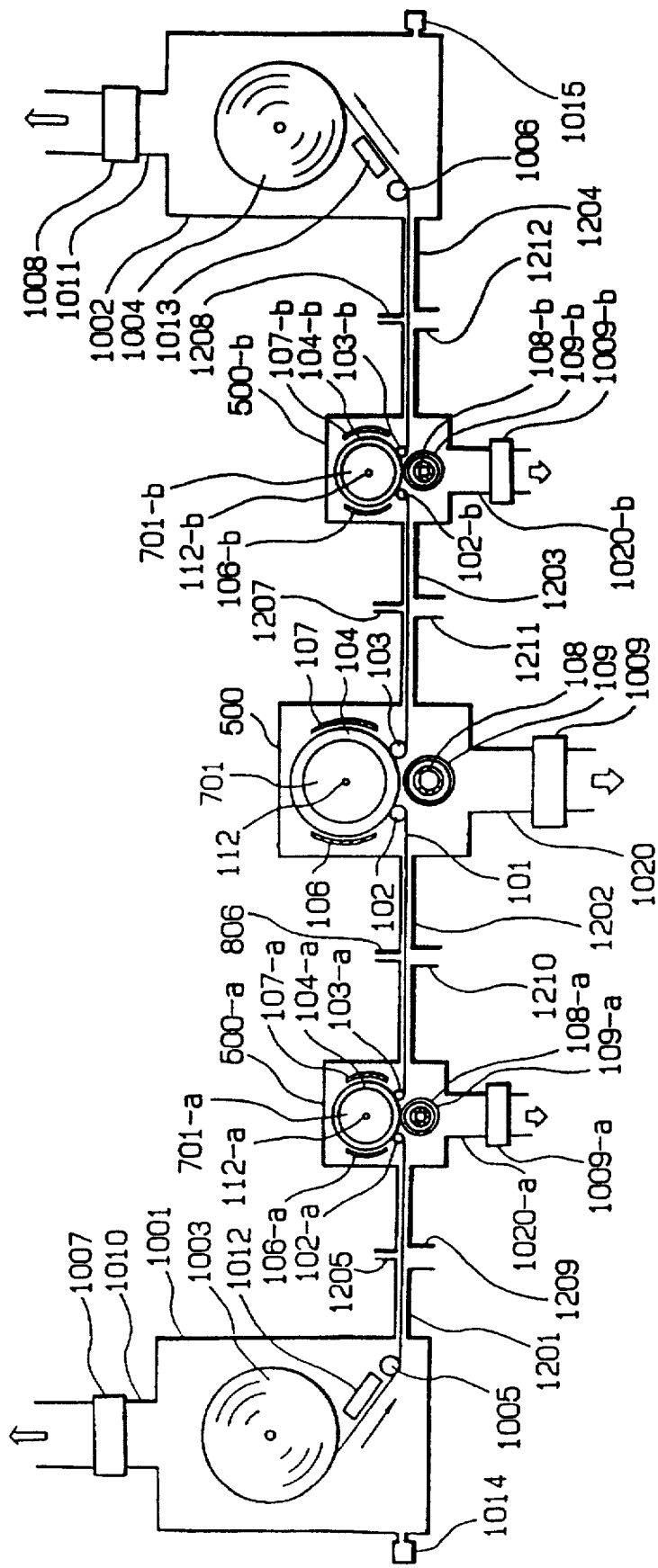

There can be mentioned a MW-PCVD apparatus shown in FIG. 12 which comprises a modification of the apparatus shown in Apparatus Embodiment 12 wherein the same MW-PCVD apparatus 500a as shown in FIG. 1 is additionally arranged between the substrate feed chamber 1001 and the MW-PCVD apparatus 500 and the same MW-PCVD apparatus 500b as shown in FIG. 1 is also arranged between said apparatus 500 and the unload chamber 1002. This apparatus is suitable for continuously preparing a multi-layered semiconductor device.

In FIG. 12, numeral references added with the mark "a" or the mark "b" are used for purposes of distinguishing one from the other among the three MW-PCVD apparatus 500, 500a and 500b being separately arranged. Each of numeral references 1201 through 1204 stands for a gas gate. Each of numeral references 1205 through 1208 stands for a gate gas supply pipe. Each of numeral references 1209 through 1212 stands for a gate gas exhaust pipe.

Apparatus Embodiments 14 and 15

There can be mentioned a partial modification of the apparatus shown in Apparatus Embodiment 12 and a partial modification of the apparatus shown in Apparatus Embodiment 13, wherein the microwave applicator means 301 is replaced by the microwave applicator means as used in the apparatus shown in Apparatus Embodiment 3 in each of the two cases.

Apparatus Embodiments 16 and 17

There can be mentioned a partial modification of the apparatus shown in Apparatus Embodiment 12 and a partial modification of the apparatus shown in Apparatus Embodiment 13, wherein the microwave applicator means 301 is replaced by a slow microwave structure microwave applicator means (not shown) in each of the two cases.

Apparatus Embodiment 18

Figure 14:
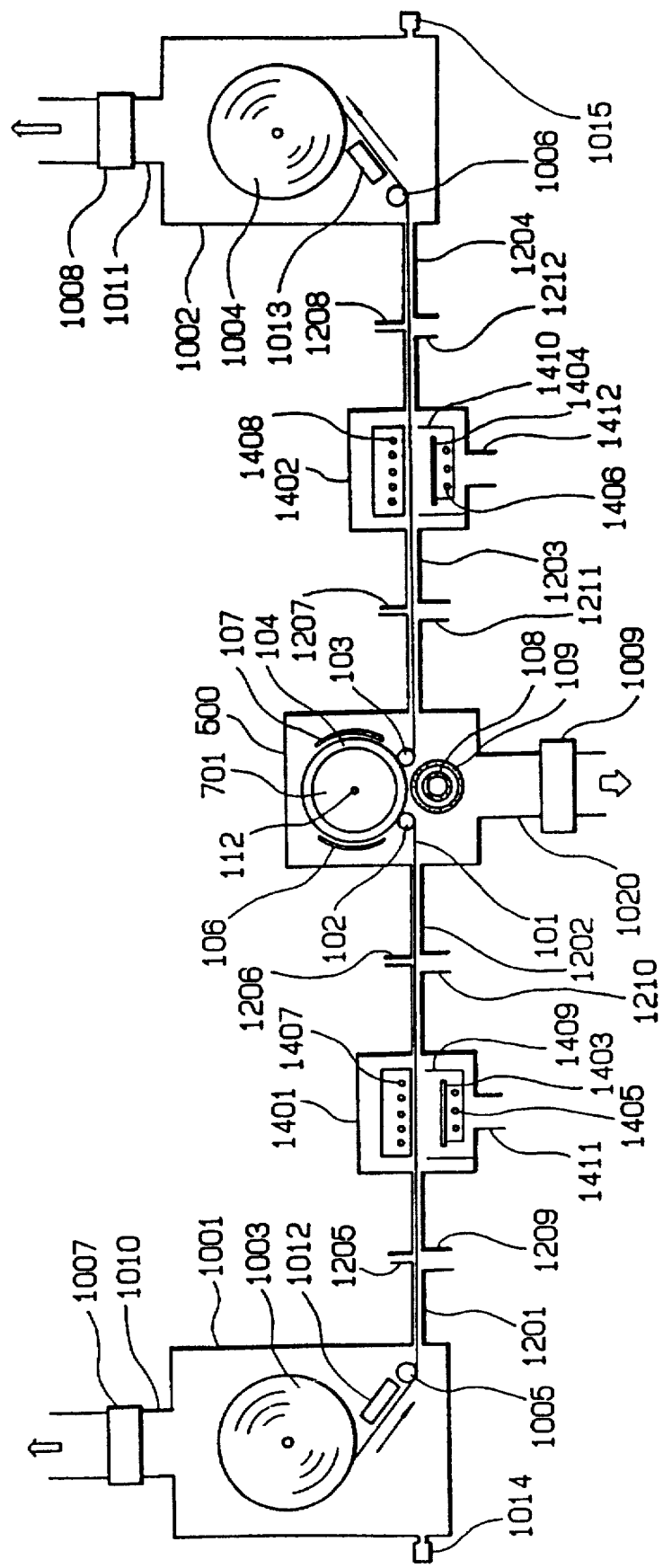

There can be mentioned a MW-PCVD apparatus shown in FIG. 14 which comprises a modification of the apparatus shown in Apparatus Embodiment 12, wherein a known RF plasma CVD apparatus (1401, 1402) is additionally arranged between the substrate feed chamber 1001 and the MW-PCVD apparatus 500 and also between said apparatus 500 and the unload chamber 1002. This apparatus is suitable for continuously preparing a multi-layered semiconductor device.

In FIG. 14, each of numeral references 1401 and 1402 stands for a vacuum vessel. Each of numeral references 1403 and 1404 stands for a RF power applying cathode electrode. Each of numeral references 1405 and 1406 stands for a gas feed pipe capable of serving also as a heater. Each of numeral references 1407 and 1408 stands for a halogen lamp for heating the substrate web 101. Each of numeral references 1409 and 1410 stands for an anode electrode. Each of numeral references 1411 and 1412 stands for an exhaust pipe.

Apparatus Embodiment 19

Shown in FIG. 2 is a schematic diagram illustrating the constitution of a typical embodiment of the MW-PCVD apparatus having a bias voltage applying means according to the present invention. A substrate web 201 is continuously moved in the direction expressed by an arrow while being supportingly curved and projected by an initial supportingly transporting roller 202 and a terminal supportingly transporting roller 203 to provide a columnar portion 216 to be the circumferential wall of a film-forming chamber having a film-forming space 213, the two side ends of said columnar portion 216 being supported by a pair of supportingly transporting rotary rings 204 and 205 so that the shape of said columnar portion 216 is maintained in a desired state. Numeral references 206 and 207 are temperature controlling mechanisms for heating or cooling the substrate web 201 which are provided over the exterior of said circumferential wall comprising the moving substrate web 201.

The temperature controlling mechanisms 206 and 207 are designed such that each of them can be independently operated.

Each of numeral references 214 and 215 stands for a microwave-leakage prohibiting metal mesh member which is provided to one of said pair of the rotary rings 204 and 205 such that the open side face of the film-forming chamber is apparently sealed so as to prohibit leakage of microwave energy from the film-forming space 213 and the metal mesh member functions to confine microwave plasma generated within said film-forming space. Numeral reference 212 stands for a basis voltage applying pipe capable of serving also as a gas feed means. Thus, the portion of said bias voltage applying pipe which is situated in the film-forming space 213 is provided with one or more gas liberation holes capable of spouting a film-forming raw material gas uniformly into said film-forming space. Numeral reference 217 stands for a gas supply pipe extending from a gas reservoir (not shown). The gas supply pipe 217 is connected through an insulating fitting 216 to the bias voltage applying pipe 212. The bias voltage applying pipe 212 is electrically connected through a lead wire 219 to a bias power source 218. The moving substrate web 201 constituting the circumferential wall of the film-forming chamber is electrically grounded. In a preferred embodiment, the entire inner face of said circumferential wall is uniformly grounded, for example, by means of an electric brush (not shown) being electrically contacted with the roller 202 and 203, the rings 204 and 205, and said circumferential wall.

Numeral reference 208 stands for a microwave applicator means extending from a microwave power source (not shown), which is encapsuled in a cylindrical isolating means 209. Thus, the microwave applicator means 208 is isolated from the film-forming space 213 (or from plasma region in other words) by means of the isolating means 209. Numeral reference 210 stands for a microwave-leakage prohibiting metal cylinder which is provided to one end portion of the isolating means 209. Numeral reference 211 stands for a microwave-leakage prohibiting metal mesh member which is provided to the metal cylinder such that the open side face of said metal cylinder is apparently sealed to prohibit leakage of microwave energy therefrom.

Gas of the film-forming space 213 can be exhausted by means of an exhaust means (not shown) through the two spacings provided between the isolating means 209 and each of the pair of the rollers 202 and 203.

It is possible to exhaust said gas through the metal mean members 214 and 215 by means of an exhaust means (not shown).

As the above microwave applicator means 208, there is used the foregoing microwave applicator means having the constitution shown in FIG. 3.

In the case above described, there is used the construction shown in FIG. 19(a) as the bias voltage applying means.

However, this can be replaced by the constitution shown in any of FIGS. 19(b) through 19(d).

Apparatus Embodiment 20

There can be mentioned the case where the apparatus described in Apparatus Embodiment 19 is placed in an isolating vessel.

Shown in FIG. 6 is a schematic diagram of the constitution in this case.

In FIG. 6, numeral reference 600 stands for an isolating vessel made of a corrosion resistant material such as stainless steel, which encloses the MW-PCVD apparatus shown in FIG. 2. Numeral reference 619 stands for an exhaust pipe being connected to a vacuum pump (not shown). The inside of the isolating vessel 600 can be evacuated by actuating said vacuum pump.

The cylindrical isolating means 209 is arranged to pass through the isolating vessel and it is hermetically fixed to the circumferential wall of the isolating vessel through a pair of connection flanges 604, 611 and a pair of fixing flanges 601, 602 in the way shown in FIG. 6.

Each of the flanges 601, 602, 604 and 611 is desired to be made of a corrosion resistant material such as stainless steel. These flanges 601 and 602 are disconnectably arranged. Each of the connection flanges 604 and 611 is directly fixed to the circumferential wall of the isolating vessel 600. In this case, there is provided a spacing 605 or 612 along the exterior of the cylindrical isolating means 209 which provides a through passage capable of insertion of said isolating means. Each of the fixing flanges 601 and 602 is hermetically fixed to the exterior of the isolating means 209.

For each of the fixing flanges 601 and 602, there is provided a cooling channel 608 or 615 at the central position thereof such that said channel is contacted to the exterior of the isolating means 209. Further, for each of the fixing flanges 601 and 602, there are provided a pair of O-rings (606, 607) or (613, 614) such that the O-rings (606, 607) or (613, 614) are hermetically compressed against the exterior of the isolating means 209 so as to insure the air-tight and water-tight seal of the isolating vessel 600.

Said pair of the O-rings is arranged to sandwich the cooling channel. A coolant fluid such as water, oil or freon flows in the cooling channel to cool the pair of the O-rings. Each of the O-rings is made of an appropriate highly heat resistant material. In a preferred embodiment, each pair of the O-rings is arranged at the position sufficiently apart from microwave plasma region provided in the film-forming space.

Numeral reference 210 stands for a metal cylinder which is capped on one end portion of the isolating means 209. Numeral reference 211 stands for a metal mesh member provided on the metal cylinder 210 such that open face 609 of one end portion of said cylinder is apparently sealed to prohibit leakage of microwave energy therefrom.

The metal mesh member 211 in this case also functions to allow flow of a cooling air into the isolating means 209, thereby cooling said isolating means 209.

The metal cylinder 210 is provided with grounding fingers 610 through which said cylinder is electrically contacted with the fixing flange 601. This results in preventing leakage of microwave energy from the isolating vessel 600 to the outside. It is possible to connect a dummy load for absorbing microwave energy (not shown) to the end portion of the cylinder 210.

Likewise, numeral reference 616 stands for a metal cylinder which is capped on the other end portion of the isolating means 209 which is situated in the side of a microwave power source (not shown). The metal cylinder 616 is provided with grounding fingers 617 through which said cylinder is electrically contacted with the fixing flange 602. This results in preventing leakage of microwave energy from the isolating vessel 600 to the outside. Numeral reference 618 stands for a connection plate (comprising a choke flange, for example) which is provided to the open side face of said metal cylinder 616. This connection plate 618 serves to connect the microwave applicator means 208 to a mode converting waveguide 603 capable of converting the mode of a rectangular waveguide into the mode of a circular waveguide (hereinafter referred to as "mode converter"). The structure of this part is necessary to be so configured that microwave energy is not leaked therefrom. Numeral reference 621 stands for a rectangular waveguide extending from a microwave power source (not shown). The rectangular waveguide is connected through a connection flange 620 to the mode convertor 603.

Numeral reference 212 stands for a bias voltage applying pipe capable of serving also as a gas feed means. Thus, the portion of said bias voltage applying pipe which is situated in the film-forming space is provided with one or more gas liberation holes capable of spouting a film-forming raw material gas uniformly into said film-forming space. Numeral reference 217 stands for a gas supply pipe extending from a gas reservoir (not shown). The gas supply pipe 217 is connected through an insulating fitting 216 to the bias voltage applying pipe 212. The basic voltage applying pipe 212 is electrically connected through a lead wire 219 to a bias power source 218. The moving substrate web 201 constituting the circumferential wall of the film-forming chamber is electrically grounded. In a preferred embodiment, the entire inner face of said circumferential wall is uniformly grounded, for example, by means of an electric brush (not shown) being electrically contacted with the rollers 202 and 203, the rings 204 and 205, and the circumferential wall of the film-forming chamber.

Shown in FIG. 8 (a) is a schematic diagram of a typical embodiment of mechanism for transporting the substrate web 201 in the above MW-PCVD apparatus.

In this embodiment, there is shown the case when the substrate web 201 is curved and projected by a pair of supportingly transporting rollers 202 and 203 to provide a columnar portion to be the circumferential wall of the film-forming chamber, wherein the initial curved portion (hereinafter referred to as "portion A") of the substrate web and the terminal curved portion (herein after referred to as "portion B") of the substrate web 201 are respectively situated in vicinity to the exterior of the isolating means 209 in which a circular waveguide 302 having an aperture 308 formed through the top portion thereof is encapsuled. The columnar portion is supported by a pair of supportingly conveying rotary rings 204, 205. Each of the two side faces of the columnar portion is covered by the foregoing microwave confining metal mesh member or the foregoing microwave confining thin plate 801 or 801' in the same manner as previously described. The width of each of the rotary rings 204 and 205 to be contacted to the inner face of said circumferential wall comprising the substrate web 201 is desired to be of a small ratio as much as possible to the width of said inner face in the viewpoints of minimizing deposition of a film on the rotary rings and providing a high use efficiency of a film product obtained.

Numeral references 206 and 207 in FIG. 8(a) respectively stand for a temperature controlling mechanism for heating or cooling the substrate web 201 in order to maintain said substrate web at a desired temperature upon film formation.

Each of these temperature controlling mechanisms 206 and 207 may be configured to touch the exterior of the substrate web in order to provide a desirable heat exchange effectiveness.

There is a tendency that the temperature of part of the substrate web to be exposed to microwave plasma in the film-forming space upon film formation is apt to locally heighten in an undesirable state. Therefore, it is necessary to observe and control the temperature of the substrate web upon film formation. This can be done by the temperature controlling mechanisms 206 and 207. Numeral reference 212 in FIG. 8(a) stands for the foregoing bias voltage applying pipe capable of serving as the gas feed pipe.

In FIG. 8(a) $L_1$ stands for a spacing (that is, spacing $L_1$) provided between the portion A and the exterior of the isolating means 209, $L_2$ stands for a spacing (that is, spacing $L_2$) provided between the portion B and the exterior of the isolating means 209, and $L_3$ stands for a spacing (that is, spacing $L_3$) provided between the portion A and the portion B.

The crosswise width of each of the spacings $L_1$ and $L_2$ is desired to be designed such that it does not go beyond a ½ of one wavelength of the microwave used, thereby preventing leakage of microwave energy into the outside and confining microwave plasma within the film-forming space. Due care should be used also on the crosswise width of the spacing $L_3$ so that a microwave energy be allowed to effectively radiate through said spacing into the film-forming space from the microwave applicator means.

In this respect, it is desired to be greater than a ¼ of one wavelength of the microwave used. In the case shown in FIG. 8(a), it is intended that microwave energy be radiated with the foregoing specific directivity vertically in the upward direction from the aperture 308 of the circular waveguide 302. Thus, the structural system with respect to the aperture and the spacing $L_3$ is desired to be made such that microwave energy be vertically radiated through the spacing $L_3$ into the film-forming space from the aperture 308 of the circular waveguide 302.

In the case above described, there is used the constitution shown in FIG. 19(a) as the bias voltage applying means. However, this can be replaced by the constitution shown in any of FIGS. 19(b) through 19(d).

Apparatus Embodiment 21

There can be mentioned a modification of the apparatus shown in FIG. 2, wherein a microwave applicator means having the constitution shown in FIG. 4(a) is used instead of the microwave applicator means 208.

In the case above described, there is used the constitution shown in FIG. 19(a) as the bias voltage applying means. However, this can be replaced by the constitution shown in any of FIGS. 19(b) and 19(d).

Apparatus Embodiments 22 and 23

Figure 8B:
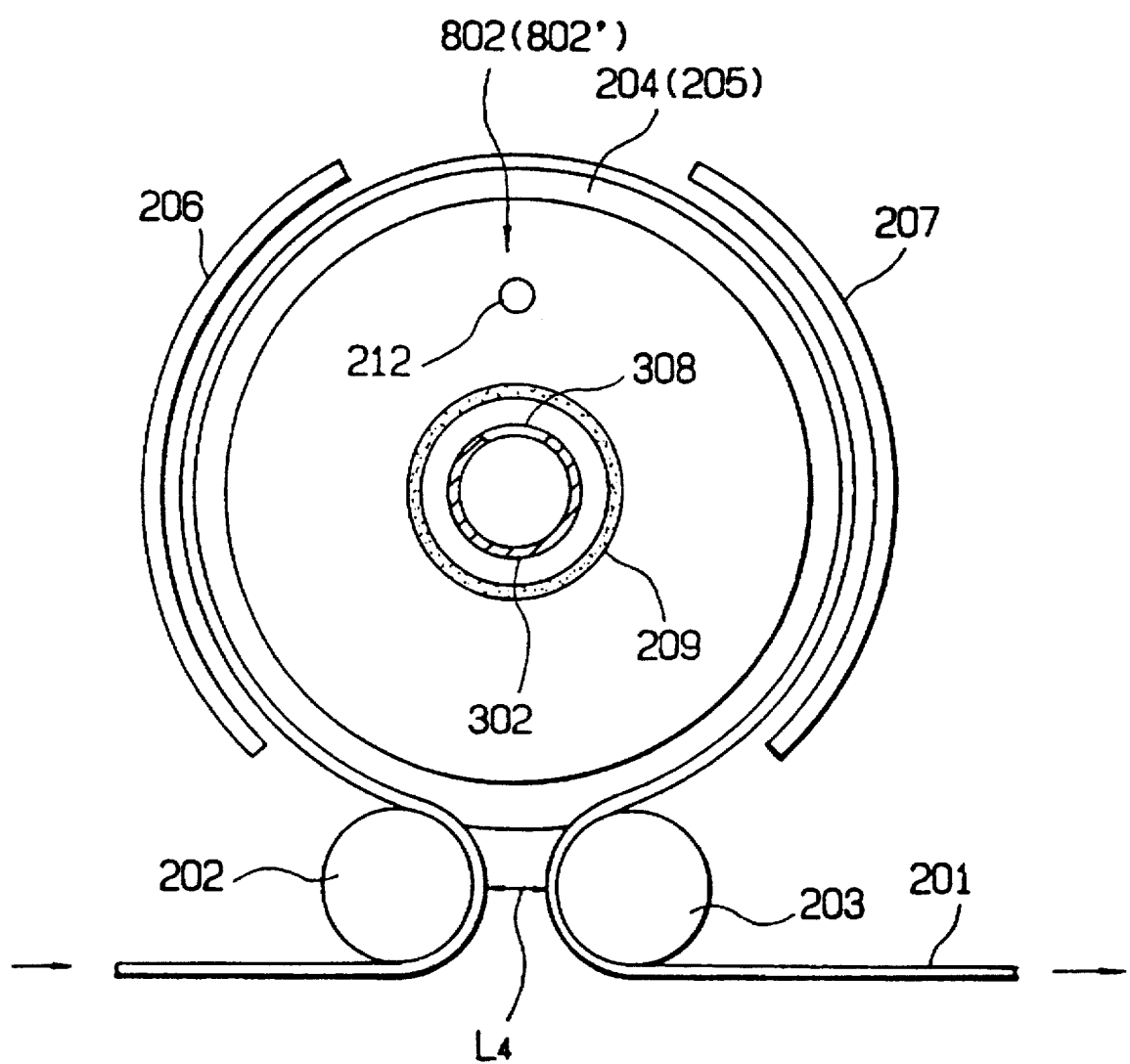
Figure 9A:
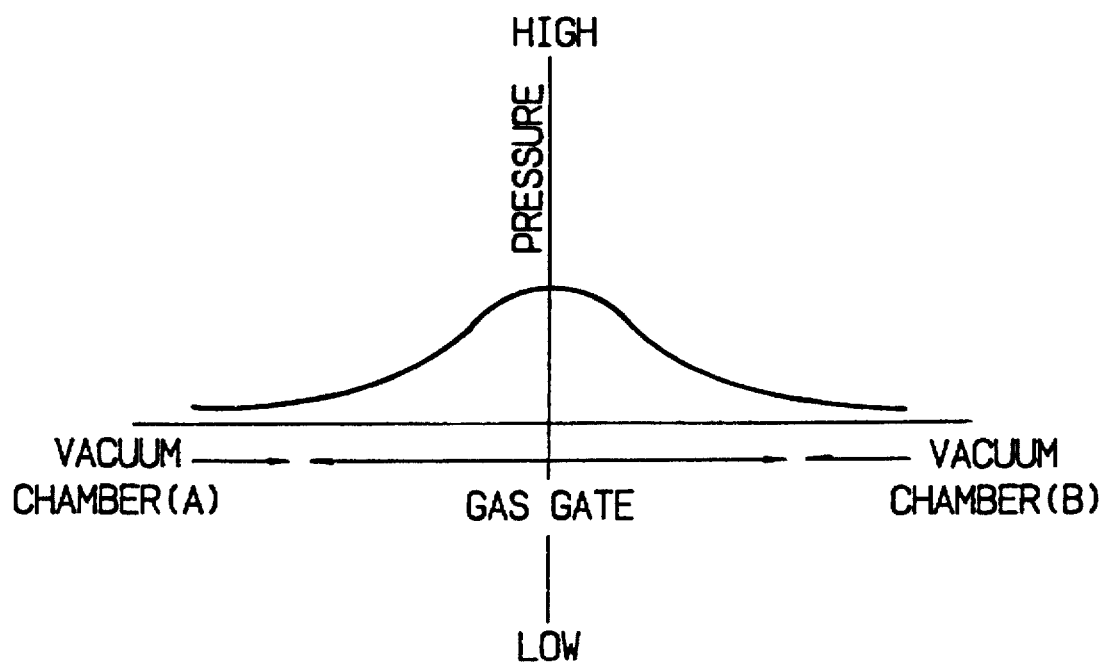
FIGS. 9(a) and 9(b) are schematic graphs respectively for illustrating a pressure gradient in the gas gate in the present invention.
Figure 9B:
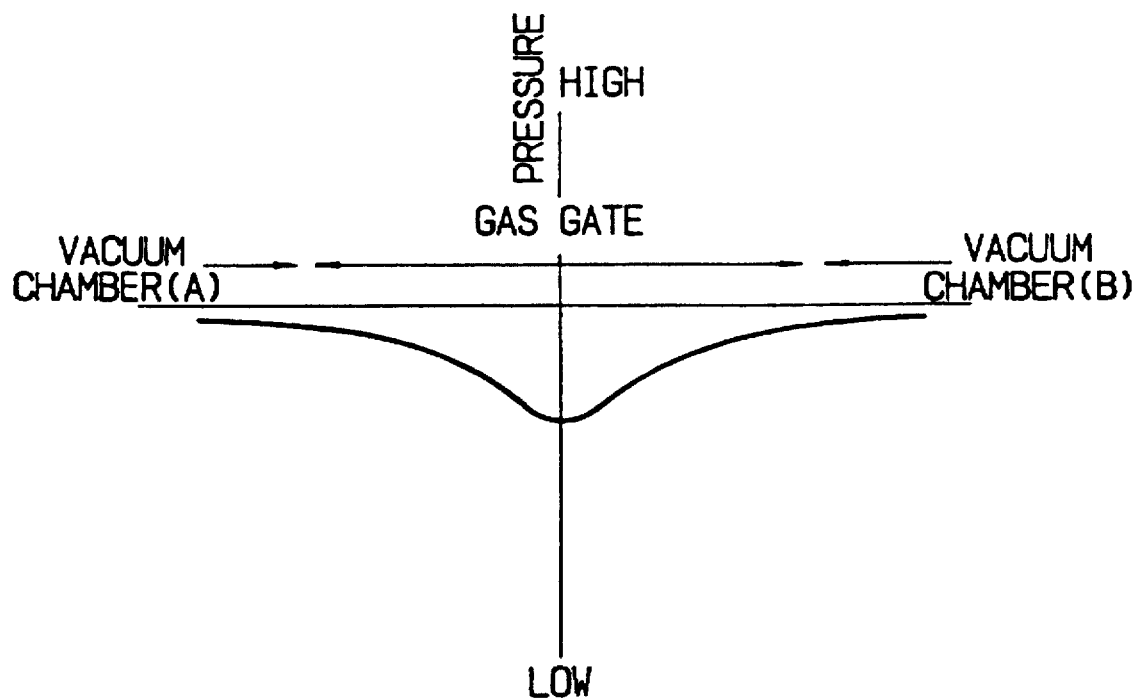

There can be mentioned a modification of the apparatus described in Apparatus Embodiment 19, wherein the isolating means having the microwave applicator means encapsuled therein is arranged in the film-forming space in the way shown in FIG. 8(b), and a modification of the apparatus described in Apparatus Embodiment 20, wherein the isolating means having the microwave applicator means encapsuled therein is arranged in the film-forming space in the way shown in FIG. 8(b). Explanation is to be made with reference to FIG. 8(b) while also referring to FIG. 8(a).

The constitution of FIG. 8(b) differs from that of FIG. 8(a) in that the isolating means 209 is arranged in the outside of the film-forming space in the case of FIG. (a) but is arranged in the film-forming space in the case of FIG. 8(b).

As illustrated in FIG. 8(b), the microwave applicator means 302 encapsuled in the isolating means 209 is arranged in the film-forming space concentrically with the columnar substrate web 201 constituting the circumferential wall of the film-forming chamber. In any case, said isolating means 209 is inserted into the film-forming space through one of the two side faces (802, 802') of the film-forming chamber. There unavoidably remains a space around the interior of the isolating means 209 at the side face through which said isolating means is passed into said film-forming space.

Therefore, it is also necessary to seal said space with the foregoing perforated metal member or the foregoing thin plate in addition to sealing the remaining side face in order to prohibit leakage of microwave energy therefrom.

And as for the crosswise width of the spacing $L_4$ provided between the pair of the supportingly curving rollers 202 and 203, it is necessary to design spacing $L_4$ such that microwave energy is prevented from leaking outside the film-forming space therefrom. In view of this, the width of the spacing $L_4$ is made to be less than a ½ of one wavelength of the microwave used.

As for the position of the isolating means to be arranged in the film-forming space, it is not always necessary to be concentric with the circumferential wall of the film-forming chamber but is can be varied depending upon the related situation. Further, there is not any particular restriction for the direction of the opening of the aperture 308 of the applicator means 302. There is not any particular restriction for the position of the bias voltage applying pipe 212 capable of serving as the gas feed pipe, but it is desired to be arranged in the film-forming space provided between the exterior of the isolating mean 209 and the inner face of the circumferential wall of the film-forming chamber.

In the case above described, there is used the constitution shown in FIG. 19(a) as the bias voltage applying means. However, this can be replaced by the constitution shown in any of FIGS. 19(b) through 19(d).

Apparatus Embodiments 24 and 25

There can be mentioned a modification of the apparatus described in Apparatus Embodiment 22 and a modification of the apparatus described in Apparatus Embodiment 23, wherein the microwave applicator means 301 is replaced by a microwave applicator means 401 having the constitution shown in FIG. 4(a) in each of the two cases.

Apparatus Embodiments 26 to 29

There can be mentioned four modifications of the apparatus described in Apparatus Embodiments 19, 20, 22 and 23, wherein the microwave applicator means 301 is replaced by a slow microwave structure microwave applicator means (not shown) in each case.

Apparatus Embodiment 30

Figure 11:
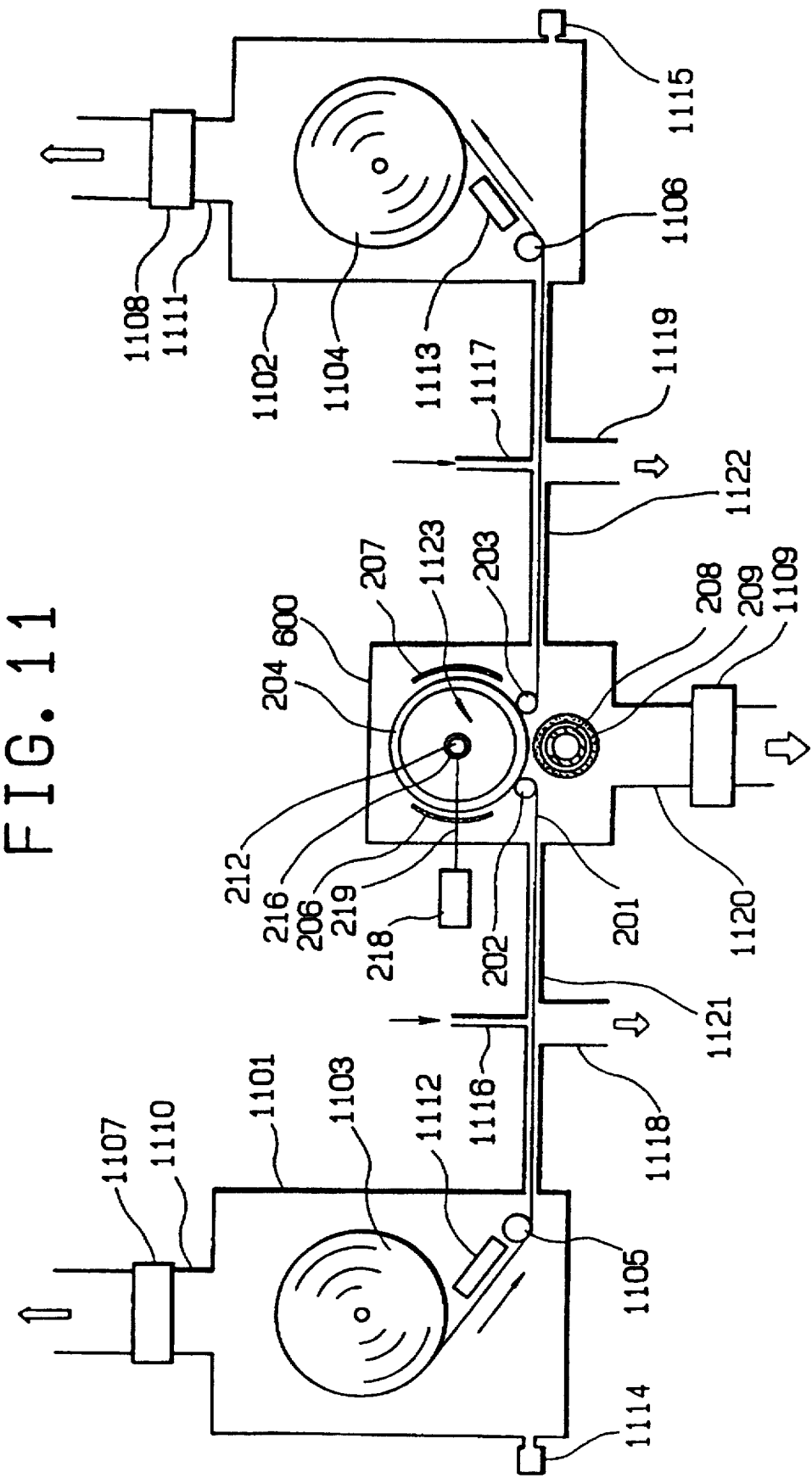

There can be mentioned a MW-PCVD apparatus comprising the apparatus shown in Apparatus Embodiment 20 which includes a substrate feed chamber 1101 for paying out a substrate web 201 and an unload chamber 1102 for taking up said substrate web as shown in FIG. 11, said substrate feed chamber being connected through a gas gate 1121 to an isolating chamber 600 containing the film-forming chamber shown in FIG. 2 and said unload chamber 1102 being connected through a gas gate 1122 to said isolation chamber 600.

As shown in FIG. 11, the substrate feed chamber 1101 contains a pay-out reel 1103 having a substrate web 201 wound thereon and a feed roller 1105. The unload chamber 1102 contains a take-up reel 1104 and a feed roller 1106. Each of the chambers 1101 and 1102 contains a temperature controlling mechanism 1112 or 1113 for heating or cooling the substrate web 201 and is provided with an exhaust pipe 1110 or 1111 provided with a slot valve 1107 or 1108 for regulating the exhausting degree.

Each of the chambers 1101 and 1102 is also provided with a pressure gage 1114 or 1115.

In the substrate feed chamber 1101, there can be provided an appropriate protective sheet feed means for feeding a protective sheet for the rear face of the substrate web to be delivered. Likewise, in the unload chamber 1102, there can be provided an appropriate protective sheet feed means for feeding a protective sheet for the surface of a film formed on the substrate web 201. As such protective sheet, there can be mentioned a thin film sheet made of a heat resistant resin such as polyimide resin and polyfluoroethylene fiber or a thin glass wool sheet. Numeral references 1116 and 1117 are gate gas supply pipes. Numeral references 1118 and 1119 are exhaust pipes respectively for exhausting a gate gas and sometimes, a film-forming raw material gas.

In FIG. 11, numeral reference 1123 stands for a film-forming space. Numeral reference 1120 stands for an exhaust pipe being connected through a slot valve 1109 to a vacuum pump (not shown).

In the case above described, there is used the constitution shown in FIG. 19(a) as the bias voltage applying means. However, this can be replaced by the constitution shown in any of FIGS. 19(b) through 19(d).

Apparatus Embodiment 31

Figure 13:
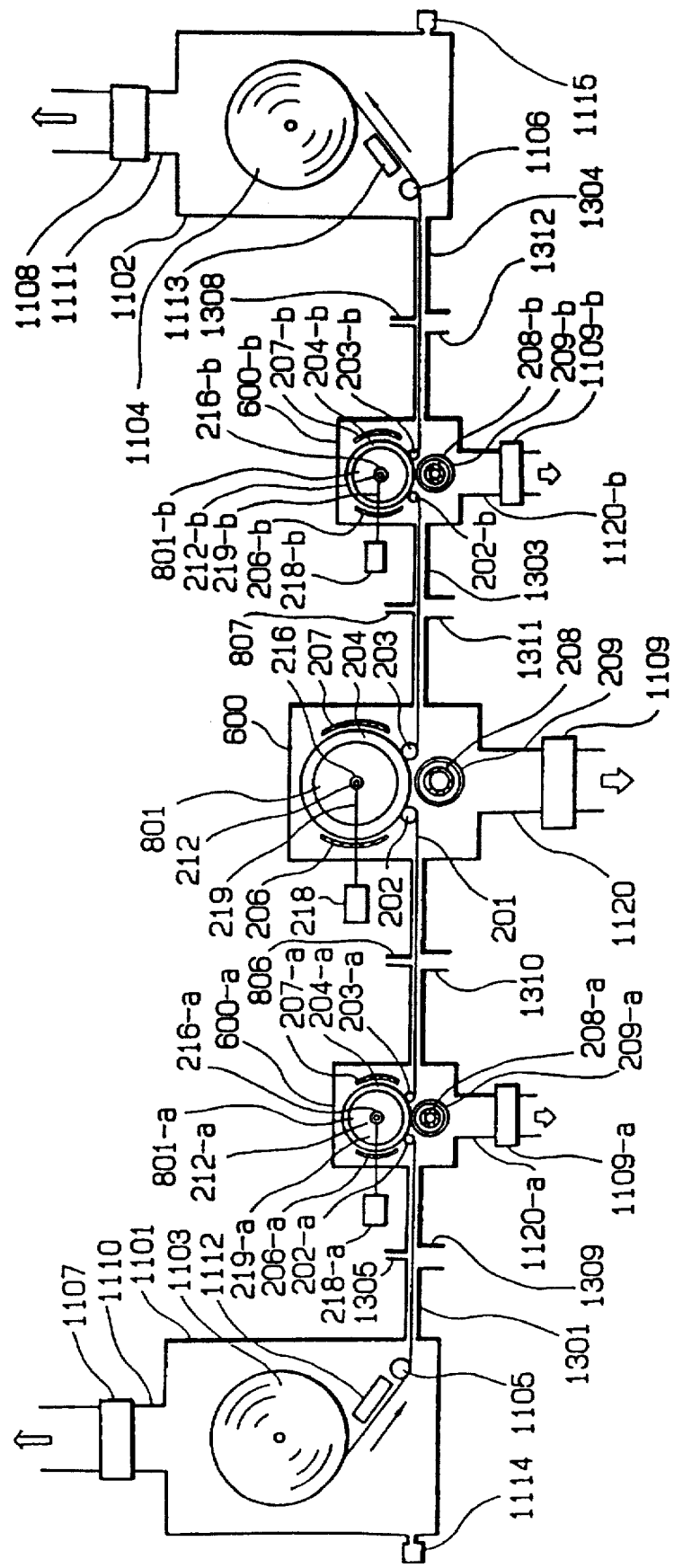

There can be mentioned a MW-PCVD apparatus shown in FIG. 13 which comprises a modification of the apparatus shown in Apparatus Embodiment 30 wherein the same MW-PCVD apparatus 600a as shown in FIG. 2 is additionally arranged between the substrate feed chamber 1101 and the MW-PCVD apparatus 600 and the same MW-PCVD apparatus 600b as shown in FIG. 2 is also arranged between said apparatus 600 and the unload chamber 1102. This apparatus is suitable for continuously preparing a multi-layered semiconductor device.

In FIG. 13, numeral references added with the mark "a" or the mark "b" are used for purposes of distinguishing one from the other among the three MW-PCVD apparatus 600, 600a and 600b being separately arranged. Each of numeral references 1301 through 1304 stands for a gas gate. Each of numeral references 1305 through 1308 stands for a gate gas supply pipe. Each of numeral references 1309 through 1312 stands for a gate gas exhaust pipe.

In the case above described, there is used the constitution shown in FIG. 19(a) as the bias voltage applying means. However, this can be replaced by the constitution shown in any of FIGS. 19(b) through 19(d).

Apparatus Embodiments 32 and 33

There can be mentioned a partial modification of the apparatus shown in Apparatus Embodiment 30 and a partial modification of the apparatus shown in Apparatus Embodiment 31, wherein the microwave applicator means 301 is replaced by a slow microwave structure microwave applicator means (not shown) in each of the two cases.

Apparatus Embodiments 34 and 35

There can be mentioned a partial modification of the apparatus shown in Apparatus Embodiment 30 and a partial modification of the apparatus shown in Apparatus Embodiment 31, wherein the microwave applicator means 301 is replaced by a slow microwave structure microwave applicator means (not shown) in each of the two cases.

Apparatus Embodiment 36

Figure 15:
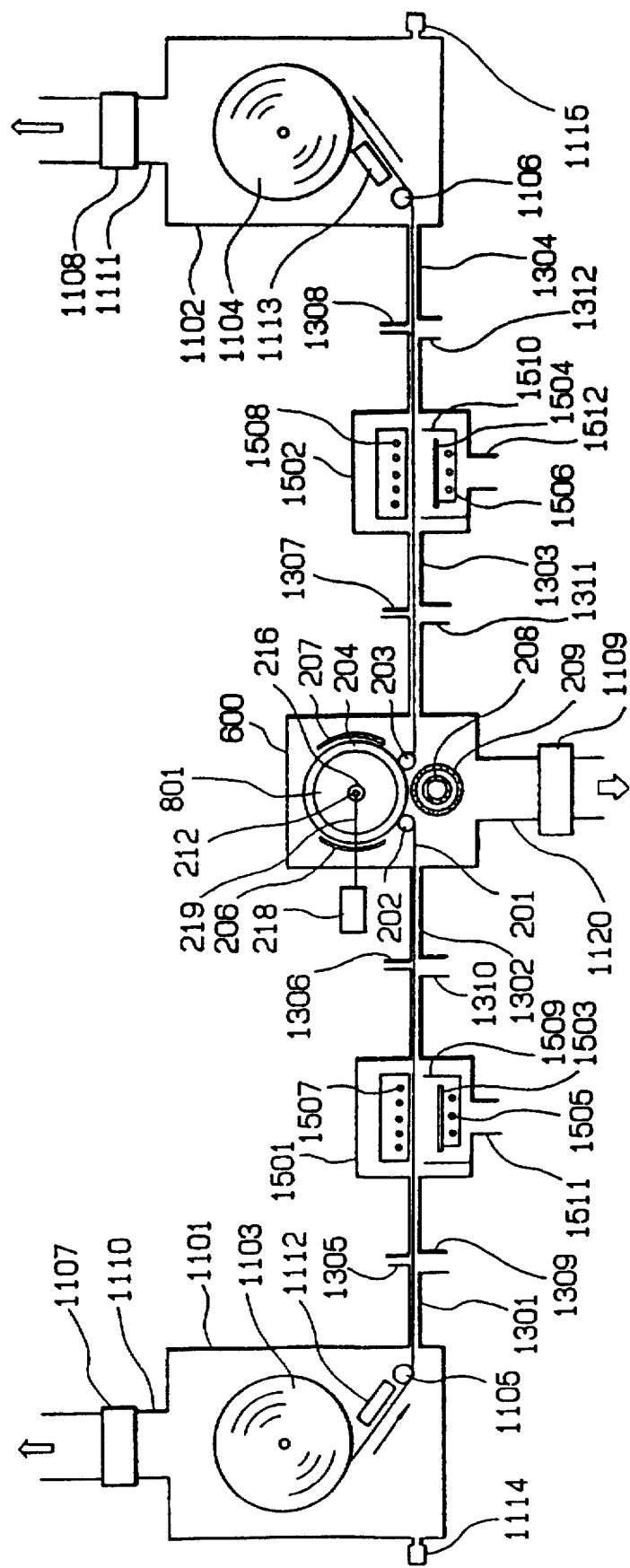

There can be mentioned a MW-PCVD apparatus shown in FIG. 15 which comprises a modification of the apparatus shown in Apparatus Embodiment 30 wherein a know RF plasma CVD apparatus (1501, 1502) is additionally arranged between the substrate feed chamber 1101 and the MW-PCVD apparatus 600 and also between said apparatus 600 and the unload chamber 1102. This apparatus is suitable for continuously preparing a multi-layered semiconductor device.

In FIG. 15, each of numeral references 1501 and 1502 stands for a vacuum vessel. Each of numeral references 1503 and 1504 stands for a RF power applying cathode electrode. Each of numeral references 1505 and 1506 stands for a gas feed pipe capable of serving also as a heater. Each of numeral references 1507 and 1508 stands for a halogen lamp for heating the substrate web 201. Each of numeral references 1509 and 1510 stands for an anode electrode. Each of numeral references 1511 and 1512 stands for an exhaust pipe.

In the case above described, there is used the constitution shown in FIG. 19(a) as the bias voltage applying means. However, this can be replaced by the constitution shown in any of FIGS. 19(b) through 19(d).

Other Apparatus Embodiments

Other than those embodiments mentioned above, there can be mentioned further apparatus embodiments as will be hereunder mentioned.

(1) Modifications of the MW-PCVD apparatus described in Apparatus Embodiment 13 wherein each of the isolated vessels 500, 500a and 500b is provided with a different microwave applicator means selected from those previously described.

(2) Modifications of the MW-PCVD apparatus described in Apparatus Embodiment 13 wherein the three chambered unit is repeated twice or three times.

(3) Modifications of the MW-PCVD apparatus described in Apparatus Embodiment 13 wherein the three chambered unit added with a known RF plasma CVD apparatus is repeated twice or three times.

(4) Modifications of the MW-PCVD apparatus described in Apparatus Embodiment 12 or 13, wherein the microwave applicator means is arranged in the same way as in the case of Apparatus Embodiment 4 or 5.

(5) Modifications of the MW-PCVD apparatus described in Apparatus Embodiment 31 wherein each of the isolated vessels 500, 500a and 500b is provided with a different microwave applicator means selected from those previously described.

(6) Modifications of the MW-PCVD apparatus described in Apparatus Embodiment 31 wherein the three chambered unit is repeated twice or three times.

(7) Modifications of the MW-PCVD apparatus described in Apparatus Embodiment 31 wherein the three chambered unit added with a known RF plasma CVD apparatus is repeated twice or three times.

(8) Modifications of the MW-PCVD apparatus described in Apparatus Embodiment 30 or 31, wherein the microwave applicator means is arranged in the same way as in the case of Apparatus Embodiment 22 or 23.

According to the present invention, various kinds of semiconductor devices can be continuously and effectively prepared.

As a representative example of those semiconductor devices, there can be mentioned a solar cell of the configuration shown in FIG. 17(a), FIG. 17(b), FIG. 17(c), or FIG. 17(d).

Figure 17A:
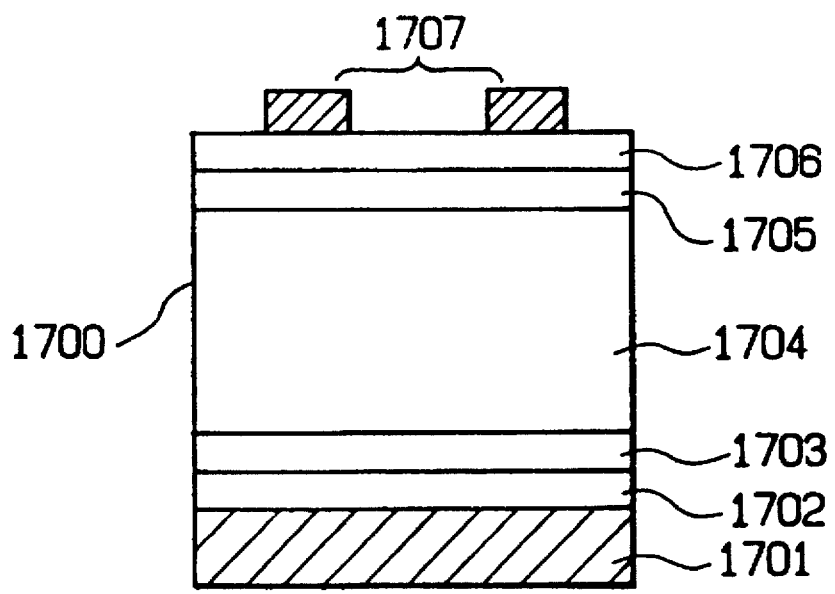
FIGS. 17(a) through 17(d) are schematic cross-section views respectively for illustrating the constitution of a pin junction photovoltaic device prepared by the present invention.

The solar cell 1700 shown in FIG. 17(a) is of the type that light is impinged from the side of a transparent electrode 1706.

The solar cell 1700 shown in FIG. 17(a) comprises a substrate 1701, a lower electrode 1702, an n-type semiconductor layer 1703, an i-type semiconductor layer 1704, a p-type semiconductor layer 1705, a transparent electrode 1706 and a comb-shaped collecting electrode 1707.

Figure 17B:
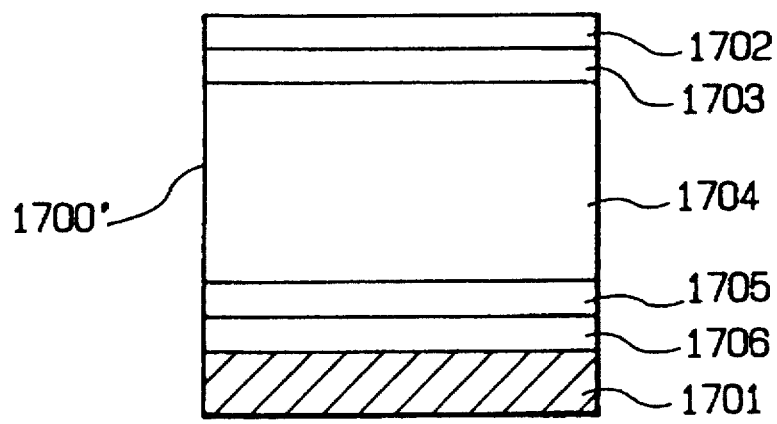

The solar cell 1700' shown in FIG. 17(b) is of the type that light is impinged from the side of a transparent substrate 1701. The solar cell 1700' shown in FIG. 17(b) comprises a transparent substrate 1701, a transparent electrode 1706, a p-type semiconductor layer 1705, an i-type semiconductor layer 1704, an n-type semiconductor layer 1703, and a lower electrode 1702.

Figure 17C:
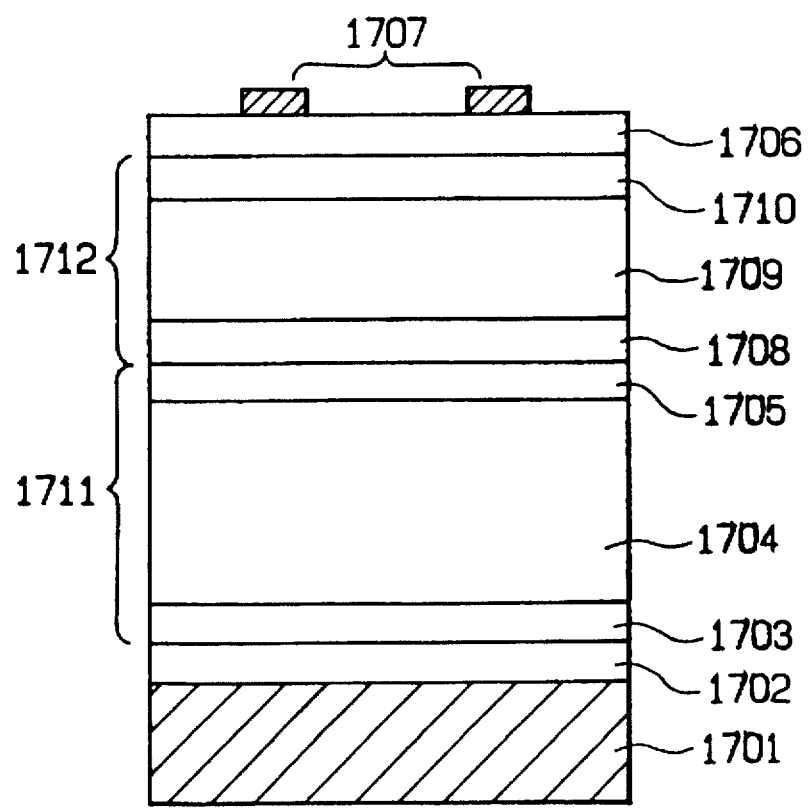

The solar cell shown in FIG. 17(c) is of a so-called tandem type which comprises a first pin junction photovoltaic cell 1711 and a second pin junction photovoltaic cell 1712 having an i-type layer different from the i-type layer of the former element 1711 with respect to the band gap or/and the layer thickness, the two cells 1711 and 1712 being stacked in this order from the side of a substrate 1701. For this solar cell, light is impinged from the side of a transparent electrode 1706.

The tandem type solar cell shown in FIG. 17(c) comprises a substrate 1701, a lower electrode 1702, the first photovoltaic cell 1711 comprising an n-type semiconductor layer 1703, an i-type semiconductor layer 1704 and a p-type semiconductor layer 1705, the second photovoltaic cell 1712 comprising an n-type semiconductor layer 1708, and i-type semiconductor layer 1709 and a p-type semiconductor layer 1710, a transparent electrode 1706, and a comb-shaped collecting electrode 1707.

Figure 17D:
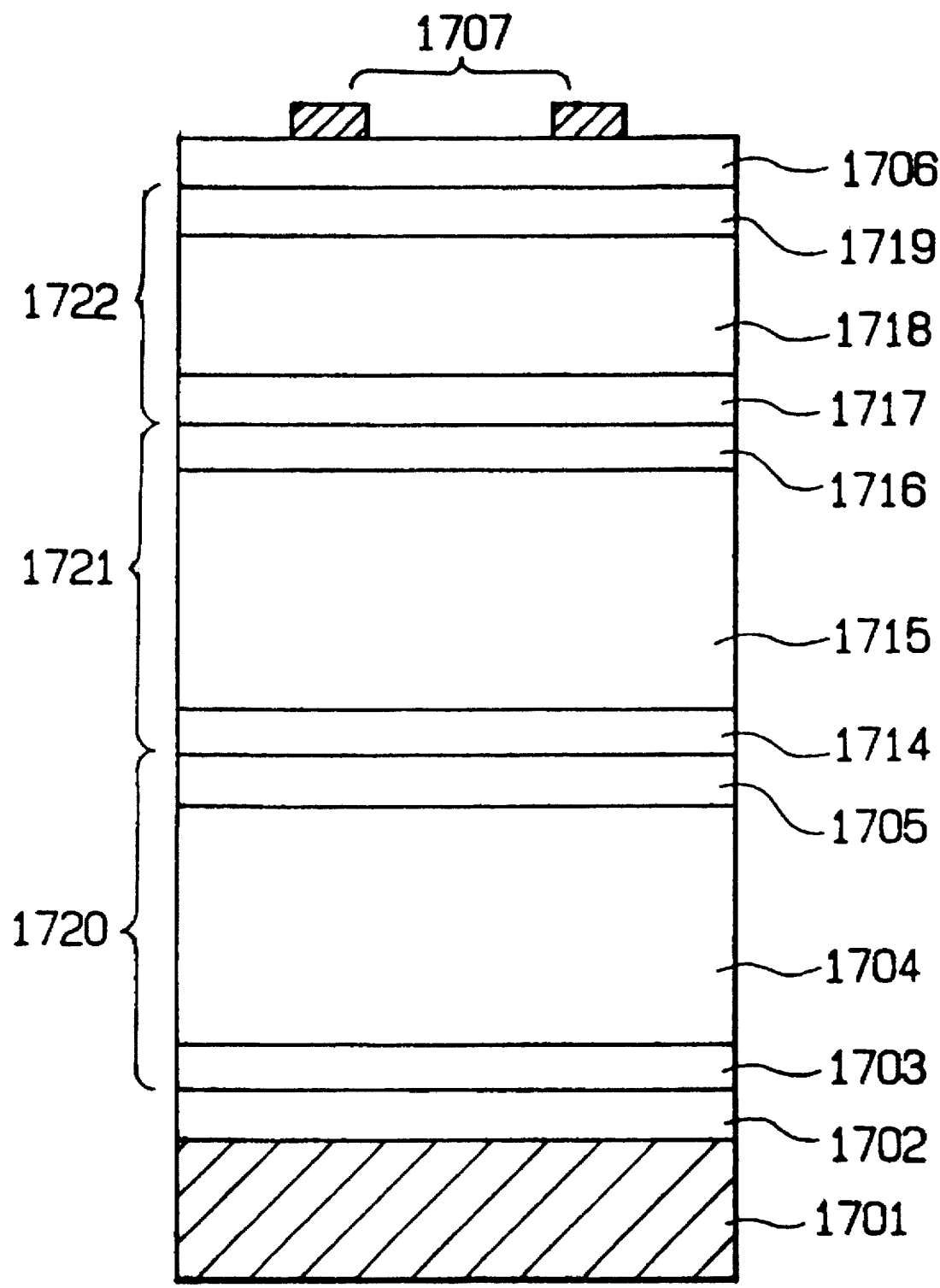

The solar cell shown in FIG. 17(d) is of a so-called triple cell type which comprises a first pin junction photovoltaic cell 1720, a second pin junction photovoltaic cell 1721 and a third pin junction photovoltaic cell 1722, the three cells 1720, 1721 and 1722 being stacked in this order from the side of a substrate 1701, wherein the i-type layer of each of said three cells is different one from the other with respect to the band gap or/and the layer thickness. For this solar cell, light is impinged from the side of a transparent electrode 1706 disposed on the top cell (the third photovoltaic cell 1722).

The solar cell shown in FIG. 17(d) comprises a substrate 1701, a lower electrode 1702, the first photovoltaic cell 1720 comprising an n-type semiconductor layer 1703, an i-type semiconductor layer 1704 and a p-type semiconductor layer 1705, the second photovoltaic cell 1721 comprising an n-type semiconductor layer 1714, an i-type semiconductor layer 1715 and a p-type semiconductor layer 1716, the third photovoltaic cell 1722 comprising an n-type semiconductor layer 1717, an i-type semiconductor layer 1718 and a p-type semiconductor layer 1719, a transparent electrode 1706, and a comb-shaped collecting electrode 1707.

For any of the above solar cells, the position of the n-type semiconductor layer may be replaced by the position of the p-type semiconductor layer.

Explanation will be made for the substrate, each constituent semiconductor layer and each constituent electrode in the pin junction photovoltaic element of the present invention.

Substrate

As the substrate web (substrate 1701 in FIG. 17), it is desired to use such a web member that can be desirably curved to provide the foregoing columnar portion to be the circumferential wall of the film-forming chamber. It may be electroconductive or electrically insulating, and it may be transparent or opaque. It is necessary to be transparent in the case of preparing a solar cell of the type that light is impinged from the side of the substrate. Particularly, those web members as previously described may be selectively used. According to the present invention, as a substrate web is used as the substrate for the preparation of such solar cell as above described, it enables to mass-produce any of the foregoing solar cells with an improved gas utilization efficiency and with a high yield.

Electrodes

For the solar cell to be provided according to the present invention, an appropriate electrode is optionally used depending upon the configuration of a solar cell to be prepared. As such electrode, there can be mentioned lower electrode, upper electrode (transparent electrode) and collecting electrode. Said upper electrode denotes the one to be placed at the side through which light is impinged, and said lower electrode denotes the one to be placed opposite to the upper electrode through the semiconductor layers to be arranged between the two electrodes.

These electrodes will be explained in the following.
(i) Lower electrode

For the pin junction photovoltaic element according to the present invention, the side through which light is impinged is determined depending upon whether there is used a transparent member or an opaque member as the substrate 1701.

In this connection, the position where the lower electrode 1702 is to be placed is properly determined upon the kind of the substrate 1701 to be used. For example, in the case where an opaque member such as metal member is used as the substrate 1701, light for the generation of a photoelectromotive force is impinged from the side of the transparent electrode 1706.

Now, in the case where the solar cell is of the configuration as shown in FIG. 17(a), FIG. 17(c) or FIG. 17(d), the lower electrode 1702 is disposed between the substrate 1701 and the n-type semiconductor layer 1703.

In the case of FIG. 17(b), there is used a transparent member as the substrate 1701 and light is impinged from the side of the substrate 1701. In this connection, the lower electrode 1702 serving to output a photo current is placed on the surface of the top semiconductor layer above the substrate 1701. In the case where there is used an electrically insulating member as the substrate 1701, the lower electrode 1702 serving to output a photocurrent is placed between the substrate 1701 and the n-type semiconductor layer 1703.

The electrode 1702 may be a metallic thin film of a metal selected from the group consisting of Ag, Au, Pt, Ni, Or, Cu, Al, Ti, Zn, Mo and W. Said metallic thin film may be properly formed by way of the known vacuum deposition technique, electron-beam deposition technique or reactive sputtering technique. However, due consideration shall be made for the metallic thin film to be thus formed not to be a resistance component for the photovoltaic element. In this respect, the metallic thin film to constitute the electrode 1702 is desired to be such that has a sheet resistance of preferably, 50 $\Omega$ or less, more preferably 10 $\Omega$ or less.

An alternative, it is possible to place a diffusion preventive layer comprising an electroconductive material such as zinc oxide between the lower electrode 1702 and the n-type semiconductor layer 1703. (This is not shown.)

In the case where such diffusion preventive layer is placed in the way as above mentioned, the following advantages will be expected: (a) it prevents the metal elements constituting the electrode 1702 from diffusing into the n-type semiconductor layer 1703; (b) as being provided with a certain resistance value, it prevents occurrence of shorts, which would otherwise occur between the lower electrode 1702 and the transparent electrode 1706 through the semiconductor layers being arranged between them due to pinholes and the like; and (c) it serves to generate multiple interferences with the thin film and confines the light as impinged within the photovoltaic element.

(ii) Upper electrode (transparent electrode)

The transparent electrode 1706 is desired to have a light transmittance of more than 85% so that it serves to make the semiconductor layer to efficiently absorb sunlight or fluorescent light. In addition to this, it is desired to have a sheet resistance of 100 $\Omega$ or less from the viewpoint of preventing the internal resistance of the photovoltaic element from becoming great to result in impairing the performance.

In view of the above, the transparent electrode 1706 is desired to comprise a thin film of a metal oxide selected from the group consisting of $SnO_2$, $In_2O_3$, ZnO, CdO, $CdO_2SnO_2$ and ITO ($In_2O_3+SnO_2$) or a semitransparent thin film of a metal selected from the group consisting of Au, Al and Cu.

The transparent electrode 1706 is disposed on the p-type semiconductor layer in the case of FIG. 17(*a*), FIG. 17(*c*) or FIG. 17 (*d*), and it is disposed on the substrate 1701 in the case of FIG. 17(*b*).

In any of the cases, it is necessary to constitute the transparent electrode 1706 with a thin film member selected from the foregoing which is good in adhesion with the layer or the substrate.

The transparent electrode 1706 comprising such thin film may be formed by way of the known resistance heating deposition technique, electron-beam heating deposition technique, reactive sputtering technique or spraying technique.

(iii) Collecting electrode

The collecting electrode 1707 in the solar cell according to the present invention is disposed on the transparent electrode 1706 for the purpose of reducing the surface resistance of said transparent electrode.

The collecting electrode 1707 is desired to comprise a metallic thin film of Ag, Cr, Ni, Al, Ag, Au, Ti, Pt, Cu, Mo, W or alloy of these metals. It is possible for the collecting electrode 1707 to be constituted with a member comprising a plurality of such metallic thin films being stacked.

The shape and the area of the collecting electrode 1707 are properly designed so that a sufficient quantity of light is impinged into the semiconductor layer.

Specifically as for the shape, it is desired to be such that extends uniformly all over the light receiving face of the photovoltaic element. As for the area, it is desired to correspond to 15% or less in a preferred embodiment or 10% or less in a more preferred embodiment respectively of said light receiving face.

And the member constituting the collecting electrode 1707 is desired to be such that has a sheet resistance of preferably 50 $\Omega$ or less, more preferably, 10 $\Omega$ or less.

i-type semiconductor layer

The i-type semiconductor layer of any of the foregoing solar cells may be formed of an appropriate non-doped semiconductor film.

Usable as such non-doped semiconductor film are so-called Group IV semiconductor films or so-called Group IV semiconductor alloy films such as a-Si:H, a-Si:F, a-Si:H:F, a-SiC:H, a-SiC:F, a-SiC:H:F, a-SiGe:H, a-SiGe:F, a-SiGe:H:F, poly-Si:H, poly-Si:F, poly-Si:H:F films, etc.

Other than these semiconductor films, so-called compound semiconductor films of Group II–VI or Group III–V are also usable.

n-type semiconductor layer and p-type semiconductor layer

The n-type semiconductor layer of any of the foregoing solar cells may be formed of an n-type semiconductor film obtained by doping any of the films mentioned in the case of the i-type semiconductor layer with an n-type dopant.

Likewise, the p-type semiconductor layer of any of the foregoing solar cells may be formed of a p-type semiconductor film obtained by doping any of the films mentioned in the case of the i-type semiconductor layer with a p-type dopant.

The features and the effects of the present invention will be described more in detail referring to the following film formation examples.

It should, however, be noted that the present invention is not restricted only to these examples.

Film Formulation Example 1

An amorphous silicon film was continuously deposited on a large area and lengthy substrate web, using the MW-PCVD apparatus (FIG. 10) described in the foregoing Apparatus Embodiment 12.

As the microwave applicator means 108 in FIG. 10, there was used a microwave applicator means of Applicator No. 13 shown in Table 6.

A pay-out reel 1003 having a cleaned substrate web 101 made of SUS 430 BA (stainless steel) of 60 cm in width, 0.2 mm in thickness and 100 m in length wound thereon was set in the substrate feed chamber 1001. The substrate web 101 was paid out from the pay-out reel, in was passed through the gas gate 1021, the transportation mechanism of the isolated vessel 500 and the gas gate 1022, and fixed to the take-up reel 1004 of the unload chamber 1002. The substrate web was adjusted not to have any loose part.

The size of the columnar portion to be the circumferential wall of the film-forming chamber and the foregoing spacings $L_1$, $L_2$ and $L_3$ were made as shown in Table 19. The conditions concerning the microwave applicator means were made as shown in Table 19. The substrate feed chamber 1001, the isolated vessel 500, and the unload chamber 1002 were provisionally evacuated respectively by means of a rotary vacuum pump (not shown). These three vessels were then evacuated respectively by means of a mechanical booster pump (not shown) to a vacuum of about $10^{-3}$ Torr.

The substrate web 101 was heated to and maintained at a temperature of about 250° C. by the temperature controlling mechanisms 106 and 107 in the isolated vessel 500. The inner pressure of the isolating vessel was regulated to a vacuum of less than $5\times10^{-6}$ Torr by means of an oil diffusion pump (not shown). Thereafter, $SiH_4$, gas, $SiF_4$ gas and $H_2$ gas were fed through a gas feed pipe 112 into the film-forming space at respective flow rates of 600 sccm, 10 sccm and 50 sccm. The gas pressure of the film-forming space 1023 was controlled to and maintained at about 9 m Torr by regulating the opening of a slot valve 1009 of an exhaust pipe 1020. After the flow rates of the three gases and the gas pressure became stable respectively, a microwave power source (not shown) was switched on to radiate a microwave energy (2.45 GHz) through the microwave applicator means 108 into the film-forming space with an effective power of 1.8 KW. Wherein discharge was caused to provide a plasma region in the film-forming space. In this case, no plasma region was leaked out of the isolated vessel 500. And no leakage of microwave energy occurred. Then the initial and terminal supportingly transporting rollers 102 and 103 and the pair of the supportingly transporting rings 104 and 105 were started rotating respectively by a driving mechanism (not shown) to transport the substrate web at a speed of 1.5 m/min.

In the above, $H_2$ gas as the gate gas was fed into gas gates 1021 and 1022 through gate gas supply pipes 1016 and 1017 at a flow rate of 50 sccm. And the gas gates 1021 and 1022 were evacuated through exhaust pipes 1018 and 1019 by means of an oil diffusion pump (not shown) to bring their insides to and maintain at a vacuum of 1 m Torr.

Film formation was performed for 30 minutes. Since there was used a lengthy substrate web, next film formation was successively performed after finishing the film formation of this example.

After the film formation of this example, the substrate web 101 taken up on the take-up reel while being cooled by the temperature controlling mechanism 1013 in the unload chamber 1002 was taken out from the unload chamber 1002.

Then, the film deposited on the substrate web 101 in this example was examined with respect to the thickness distribution in the width direction and also in the longitudinal direction. As a result, it was found that the thickness distribution was within 5%. As a result of examining the deposition rate, it was found to be 110 Å/sec on the average. Further, as a result of examining an infrared absorption spectrum for a film specimen cut off from the resultant by a conventional reflection method, a distinguishable peak was found at 2000 $cm^{-1}$ and also at 630 $cm^{-1}$ which indicate a-Si:H:F film. Likewise, as a result of examining the crystallinity of said film specimen by a RHEED (trade name: JEM-100 SX, product by JEOL, Ltd.), the film specimen showed a halo pattern, and it was found to be amorphous. Further, the amount of hydrogen atoms contained in the film specimen was examined by a hydrogen content analyzer EMGA-1100 (product by Horiba Seisakusho Kabushiki Kaisha).

As a result, it was found to be 22±2 atomic %.

Film Formation Example 2

After the film formation of Film Formation Example 1 was completed, the introduction of the gases used therein was terminated. In this example, the procedures of Film Formation Example 1 were repeated, except that a microwave applicator means of Applicator No. 11 shown in Table 6 was used instead of the foregoing Applicator No. 13. The isolated vessel 500 was evacuated in the same manner as in Film Formation Example 1 to bring the inside to a vacuum of less than $5\times10^{-6}$ Torr. The film-forming procedures of Film Formation Example 1 were repeated, except that $SiH_4$ gas, $GeH_4$ gas, $SiF_4$ a gas and $H_2$ gas were fed into the film-forming space at respective flow rates of 150 sccm, 120 sccm, 5 sccm and 30 sccm; the gas pressure of the film-forming space was maintained at a vacuum of 15 m Torr; and the power of a microwave energy was made to be 1.0 KW, to thereby form an amorphous silicon-germanium film on the substrate web. Then, the resultant film was taken out in the same manner as in Film Formation Example 1.

For the resultant film, the film thickness distribution in the width direction and in the longitudinal direction, deposition rate, infrared absorption spectrum, crystallinity and hydrogen content were examined respectively in the same manner as in Film Formation Example 1. As a result, the following were found. That is, the film thickness distribution: within 5%; the deposition rate: 49 Å/sec on the average; the infrared absorption spectrum: a distinguishable peak at 2000 $cm^{-1}$, at 1880 $cm^{-1}$ and at 630 $cm^{-1}$; which indicate a-SiGe:H:F film; the crystallinity: halo pattern which indicates an amorphous film; and the hydrogen content: 16±2 atomic %.

Film Formation Example 3

After the film formation of Film Formation Example 2 was completed, the introduction of the gases used therein was terminated. The microwave applicator means of Applicator No. 11 was replaced by a microwave applicator means of Applicator No. 13 shown in Table 6. Then, the isolated vessel 500 was evacuated in the same manner as in Film Formation Example 1 to bring the inside to a vacuum of less than $5\times10^{-6}$ Torr.

The film-forming procedures of Film Formation Example 1 were repeated, except that $SiH_4$ gas, $CH_4$ gas, $SiF_4$ gas and $H_2$ gas were fed into the film-forming space at respective flow rates of 280 sccm, 40 sccm, 5 sccm and 50 sccm; and the gas pressure of the film-forming space was maintained at a vacuum of 25 m Torr, to thereby form an amorphous silicon carbide film on the substrate web.

The resultant film was taken out in the same manner as in Film Formation Example 1.

For the resultant film, the film thickness distribution in the width direction and in the longitudinal direction, deposition rate, infrared absorption spectrum, crystallinity and hydrogen content were examined respectively in the same manner as in Film Formation Example 1.

As a result, the following were found. That is, the film thickness distribution: within 5%; the deposition rate: 42 Å/sec on the average; the infrared absorption spectrum: a distinguishable peak at 2080 $cm^{-1}$, at 1250 $cm^{-1}$, at 960 $cm^{-1}$; at 777 $cm^{-1}$ and at 660 $cm^{-1}$ which indicate a-SiC:H:F film; the crystallinity: halo pattern which indicates an amorphous film; and the hydrogen content: 12±2 atomic %.

Film Formation Example 4

After the film formation of Film Formation Example 3 was completed, the introduction of the gases used therein was terminated. The microwave applicator means of Applicator No. 13 was replaced by a microwave applicator means of Applicator No. 3 shown in Table 1. The isolated vessel 500 was evacuated in the same manner as in Film Formation Example 1 to bring the inside to a vacuum of less than $5\times10^{-6}$ Torr.

The film-forming procedures of Film Formation Example 1 were repeated, except that $SiH_4$ gas, $BF_3$ gas (diluted with $H_2$ gas to 3000 ppm), $SiF_4$ gas and $H_2$ gas were fed into the film-forming space at respective flow rates of 250 sccm, 50 sccm, 45 sccm and 50 sccm; the gas pressure of the film-forming space was maintained at a vacuum of 20 m Torr; and the power of a microwave energy was made to be 3.0 KW, to thereby form a p-type crystalline silicon film on the substrate web.

The resultant film was taken out in the same manner as in Film Formation Example 1.

For the resultant film, the film thickness distribution in the width direction and in the longitudinal direction, deposition rate, infrared absorption spectrum, crystallinity and hydrogen content were examined respectively in the same manner as in Film Formation Example 1.

As a result, the following were found. That is, the film thickness distribution: within 5%; the deposition rate: 42 Å/sec on the average; the infrared absorption spectrum: a distinguishable peak at 2100 $cm^{-1}$ and at 630 $cm^{-1}$ which indicate a microcrystal Si:H:F:B film; the crystallinity: ring pattern which indicates a non-oriented polycrystalline film; and the hydrogen content: 5±2 atomic %.

Film Formation Example 5

In this example, the procedures of Film Formation Example 1 were repeated. The isolated vessel 500 was evacuated in the same manner as in Film Formation Example 1 to bring the inside to a vacuum of less than $5\times10^{-6}$ Torr.

The film-forming procedures of Film Formation Example 1 were repeated, except that $SiH_4$ gas, $PH_3$ gas (diluted with $H_2$ gas to 1%), $SiF_4$ gas and $H_2$ gas were fed into the film-forming space at respective flow rates of 360 sccm, 30 sccm, 5 sccm and 20 sccm; the gas pressure of the film-forming space was maintained at a vacuum of 12 m Torr; and the power of a microwave energy was made to be 1.2 KW, to thereby form an n-type amorphous silicon film on the substrate web.

The resultant film was taken out in the same manner as in Film Formation Example 1.

For the resultant film, the film thickness distribution in the width direction and in the longitudinal direction, deposition rate, infrared absorption spectrum, crystallinity and hydrogen content were examined respectively in the same manner as in Film Formation Example 1.

As a result, the following were found. That is, the film thickness distribution: within 5%; the deposition rate: 65 Å/sec on the average; the infrared absorption spectrum: a distinguishable peak at 2000 $cm^{-1}$ and at 630 $cm^{-1}$ which indicate a-Si:H:F:P film; the crystallinity: halo pattern which indicates an amorphous film; and the hydrogen content: 20±2 atomic %.

Film Formation Example 6

In this example, the procedures of Film Formation Example 1 were repeated, except that the substrate web was replaced by a polyethyleneterephthalate substrate web (hereinafter referred to as "PET substrate web") of 50 mm in width, 0.8 mm in thickness and 100 mm in length, and the circumferential wall of the film-forming chamber which comprises said PET substrate web was maintained at a temperature of 220° C., to thereby form an amorphous silicon film on the PET substrate web.

The resultant film was taken out in the same manner as in Film Formation Example 1.

For the resultant film, the film thickness distribution in the width direction and in the longitudinal direction, deposition rate, infrared absorption spectrum, crystallinity and hydrogen content were examined respectively in the same manner as in Film Formation Example 1.

As a result, the following were found. That is, the film thickness distribution: within 5%; the deposition rate: 105 Å/sec on the average; the infrared absorption spectrum: a distinguishable peak at 2000 $cm^{-1}$ and at 630 $cm^{-1}$ which indicate a-Si:H:F film; the crystallinity: halo pattern which indicates an amorphous film; and the hydrogen content: 24±2 atomic %.

The resultant film formed on the PET substrate web was cut to obtain 20 film specimens.

Each specimen was applied with an aluminum comb-shaped gap electrode of 250 μm in width and 5 mm in length by a conventional heat resistance evaporation method. For the resultant, a value of photocurrent under irradiation of AM-1 light (100 m $W/cm^2$) and a value of dark current in dark were measured using a HP 4140 B to obtain a light conductivity σ p (S/cm) and a dark conductivity σ d (S/cm). As a result, the light conductivity of each of the 20 specimens was within the range of $(6.0\pm0.5)\times10^{-5}$ S/cm and the dark conductivity of each of the 20 specimens was within the range of $(2.0\pm0.5)\times10^{-11}$ S/cm.

Film Formation Example 7

Figure 16:
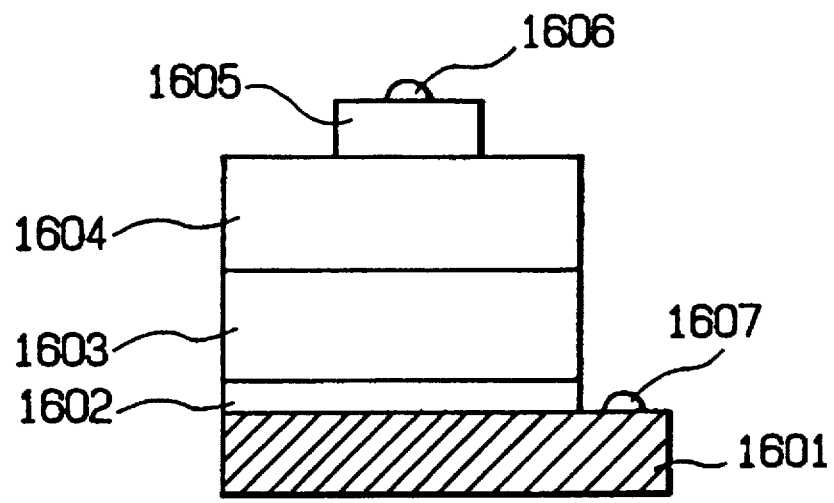
FIG. 16 is a schematic cross-section view of a Schottky diode prepared by the present invention.

In this example, there was prepared a Schottky junction type diode of the configuration shown in FIG. 16, using the MW-PCVD apparatus shown in FIG. 10 which has a microwave applicator means of Applicator No. 13 shown in Table 6. The size of the columnar portion to be the circumferential wall of the film-forming chamber, the foregoing spacings $L_1$, $L_2$ and $L_3$, and the conditions concerning the microwave applicator means were made as shown in Table 19.

The Schottky junction type diode shown in FIG. 16 comprises substrate 1601, lower electrode 1602, n+-type semiconductor layer 1603, non-doped semiconductor layer 1604, metallic layer 1605, and a pair of current outputting terminals 1606 and 1607.

There was provided a continuous sputtering apparatus. A SUS 430 BA substrate web was set to said apparatus in the same manner as in Film Formation Example 1, wherein a Cr target (99.98% purity) was used to deposit a 1500 Å thick Cr film to be the lower electrode 1602 on the surface of the substrate web.

Then, the substrate web having said Cr layer thereon was placed in the MW-PCVD apparatus shown in FIG. 10 in the same manner as in Film Formation Example 1, wherein said substrate web was set such that the Cr layer formed thereon was faced downward.

The substrate feed chamber 1001, the isolating vessel 500, and the unload chamber 1002 were provisionally evacuated respectively by means of a rotary vacuum pump (not shown). These three vessels were then evacuated respectively by means of a mechanical booster pump (not shown) to a vacuum of about $10^{-3}$ Torr.

The substrate was heated to and maintained at a temperature of about 250° C. by the temperature controlling mechanisms 106 and 107 in the isolating vessel 500.

The inner pressure of the isolating vessel was regulated to a vacuum of less than $5\times10^{-6}$ Torr by means of an oil diffusion pump (not shown).

Thereafter, $SiH_4$ gas, $SiF_4$ gas, $PH_3/H_2$ gas (=1%), and $H_2$ gas were fed through the gas feed pipe 112 to the film-forming space at respective flow rates of 350 sccm, 5 sccm, 60 sccm and 30 sccm. The gas pressure of the film-forming space was controlled to and maintained at about 12 m Torr by regulating the opening of the slot valve 1009 of the exhaust pipe 1020.

After the flow rates of the four gases and the gas pressure became stable, respectively, a microwave power source (not shown) was switched on to radiate a microwave energy (2.45 GHz) through the microwave applicator means 108 into the film-forming space with an effective power of 2.0 KW, wherein discharge was caused to provide a plasma region in the film-forming space. Then, the initial and terminal supportingly transporting rollers 102 and 103 and the pair of the supportingly transporting rings 104 and 105 were started rotating respectively by a driving mechanism (not shown) to transport the substrate web at a speed of 65 cm/min. from the left side to the right side in the FIG. 10 for 5 minutes. In this case, $H_2$ gas as the gate gas was fed into the gas gates 1021 and 1022 through the gate gas supply pipes 1016 and 1017 at a flow rate of 50 sccm. And the gas gates 1021 and 1022 were evacuated through the exhaust pipes 1018 and 1019 by means of an oil diffusion pump (not shown) to bring their insides to and maintain at a vacuum of 2 m Torr.

As a result, there was formed an n+-type a-Si:H:F film doped with P as the n+-type semiconductor layer on the Cr layer as the lower electrode 1602 previously formed on the substrate web. Thereafter, the application of the microwave energy and the introduction of the film-forming raw material gases were suspended. And, the transportation of substrate web was stopped.

Then, the isolated vessel 500 was evacuated to a vacuum of less than $5\times10^{-6}$ Torr.

Following the procedures in the above film formation, $SiH_4$ gas, $SiF_4$ gas and $H_2$ gas were fed into the film-forming space at respective flow rates of 350 sccm, 10 sccm and 50 sccm. The gas pressure of the film-forming space was maintained at about 8 m Torr. Then, a microwave energy (2.45 GHz) was radiated into the film-forming space with an effective power of 1.8 KW. Upon generation of microwave plasma, the substrate web was transported from the right side to the left side at a transportation speed of 60 cm/min. Film formation was performed for 5.5 minutes.

As a result, there was formed a non-doped a-Si:H:F film as the non-doped semiconductor layer 1604 on the previously formed n+-type a-Si:H:F film.

After the above film formation was completed, the application of the microwave energy, the introduction of the film-forming raw material gases, and the transportation of the substrate web were all terminated. The residual gas in the isolated vessel 500 was exhausted. After the substrate web was cooled to room temperature, the substrate web was taken out from the substrate feed chamber 1001 which served as the unload chamber in the case of the last film formation.

The substrate web having the foregoing three layers being laminated thereon was randomly cut off to obtain ten specimens of the same size.

Each of the ten specimens was applied with a 80 Å thick Au film as the metallic layer 1605 by an electron beam evaporation method. Then, a pair of current outputting terminals 1606 and 1607 were provided thereto by using a wire bonder.

Each of the resultants was examined with respect to diode characteristics by using a HP 4140 B.

As a result, each of the ten specimens exhibited a desirable diode factor (n=1.1±0.05) and about 6 digits for the rectification ratio at ±1 V. From the results obtained, it was found that any of the ten specimens excels in the diode characteristics desired for the Schottky junction type diode.

Film Formation Example 8

In this example, there was prepared a pin junction photovoltaic element of the configuration shown in FIG. 17(a), using the three film-forming chambered MW-PCVD apparatus shown in FIG. 12.

There was used a PET substrate web as the substrate web 101 in FIG. 12.

The PET substrate web was set to a continuous sputtering apparatus, wherein a 1000 Å thick Ag film as an electroconductive layer was formed on said substrate web by sputtering an Ag target (99.99%). Successively, a 1.2 um thick ZnO film as the lower electrode 1702 was formed on the previously formed Ag film by sputtering a ZnO target (99.999%).

The substrate web having the Ag thin film and the ZnO thin film being laminated thereon was set to the three film-forming chambered MW-PCVD apparatus having the constitution shown in FIG. 12 in the same manner as in Film Formation Example 1.

In this case, the size of the columnar portion provided in the isolated vessel 500 was made to be 18 cm in inside diameter as shown in Table 20. Likewise, the size of the columnar portion in the isolated chamber 500a and the size of the columnar portion in the isolated chamber 500b were made to be 12 cm and 12 cm respectively in inside diameter as shown in Table 21.

Other conditions concerning the MW-PCVD apparatus encapsuled in the isolating vessel 500 were made as shown in Table 20. Likewise, other conditions concerning the MW-PCVD apparatus encapsuled in the isolating vessel 500a and other conditions concerning the MW-PCVD apparatus encapsuled in the isolating vessel 500b were made respectively as shown in Table 21.

There was caused microwave discharge in each of the three film-forming chambers under the respective conditions shown in Table 20 for the isolating vessel 500 and in Table 21 for the isolating chambers 500a and 500b. After the state of the discharge in each of the three film-forming chambers became stable, the substrate web was started moving at a transportation speed of 54 cm/min. from the left side to the right side in FIG. 12. Thus, there were continuously formed an n-type a-Si:H:F film doped with P to be the n-type semiconductor layer 1703 in the film-forming chamber of the isolated chamber 500a under the film-forming conditions shown in Table 21, a non-doped a-Si:H:F film to be the i-type semiconductor layer 1704 in the film-forming chamber of the isolating vessel 500 under the film-forming conditions shown in Table 20, and a p+-type microcrystal Si:H:F film doped with B to be the p-type semiconductor layer 1705 in the film-forming chamber of the isolating vessel 500b under the film-forming conditions shown in Table 21 respectively on the moving substrate in the same manner as in Film Formation Example 7.

The substrate web having the foregoing n-type, i-type and p+-type semiconductor layers being laminated on the lower electrode comprising the foregoing ZnO thin film was cooled to room temperature in the unload chamber 1202 and it was taken out therefrom. This substrate web was set to a reactive sputtering apparatus, wherein a 700 Å thick ITO film as the transparent electrode 1706 was formed thereon. Then, the resultant was cut off to obtain a plurality of specimens respectively of 40 cm×80 cm in size. Each of the specimens thus obtained was applied with a comb-shaped collecting electrode comprising an about 1 um thick Ag film onto the surface thereof by an electron beam evaporation method.

Thus, there were obtained a plurality of solar cell modules respectively of the pin junction type.

For each of them, the photovoltaic characteristics were evaluated under irradiation of AM 1.5 light (100 mW/cm$^2$). As a result, every module exhibited a photoelectric conversion efficiency of more than 8.5%. The unevenness with respect to the characteristics among the modules was within 5%.

Further, each module was irradiated with AM 1.5 light (100 mW/cm$^2$) continuously for 500 hours, and its photoelectric conversion efficiency was examined. As a result, the difference between the initial photoelectric conversion efficiency and the last photoelectric conversion efficiency after light irradiation for 500 hours with respect to all the modules was within 10%.

These modules were properly combined to obtain a power supply system. It was found that the resultant system outputs a power of about 3 KW.

Film Formation Example 9

There was prepared a pin junction photovoltaic element of the configuration shown in FIG. 17(a) by repeating the procedures of Film Formation Example 8, except that instead of the a-Si:H:F film as the i-type semiconductor layer, there was formed a non-doped a-SiGe:H:F film in the same manner as in Film Formation Example 2 while maintaining the substrate web at 200° C. and the substrate web was moved at a transportation speed of 40 cm/min.

The resultant was processed in the same manner as in Film Formation Example 8 to thereby obtain a plurality of solar cell modules.

For each of them, the photovoltaic characteristics were evaluated under irradiation of AM 1.5 light (100 mW/cm$^2$). As a result, every module exhibited a photoelectric conversion efficiency of more than 7.5%. The unevenness with respect to the characteristics among the modules was within 5%.

Further, each module was irradiated with AM 1.5 light (100 mW/cm$^2$) continuously for 500 hours, and its photoelectric conversion efficiency was examined. As a result, the difference between the initial photoelectric conversion efficiency and the last photoelectric conversion efficiency after light irradiation for 500 hours with respect to all the modules was within 10%.

These modules were properly combined to obtain a power supply system. It was found that the resultant system outputs a power of about 3 KW.

Film Formation Example 10

There was prepared a pin junction photovoltaic element of the configuration shown in FIG. 17(a) by repeating the procedures of Film Formation Example 8, except that instead of the a-Si:H:F film as the i-type semiconductor layer, there was formed a non-doped a-SiC:H:F film in the same manner as in Film Formation Example 3 wherein the substrate web was moved at a transportation speed of 45 cm/min.

The resultant was processed in the same manner as in Film Formation Example 8 to thereby obtain a plurality of solar cell modules.

For each of them, the photovoltaic characteristics were evaluated under irradiation of AM 1.5 light (100 mW/cm$^2$). As a result, every module exhibited a photoelectric conversion efficiency of more than 6.5%. The unevenness with respect to the characteristics among the modules was within 5%.

Further, each module was irradiated with AM 1.5 light (100 mW/cm$^2$) continuously for 500 hours, and its photoelectric conversion efficiency was examined. As a result, the difference between the initial photoelectric conversion efficiency and the last photoelectric conversion efficiency after light irradiation for 500 hours with respect to all the modules was within 10%.

These modules were properly combined to obtain a power supply system. It was found that the resultant system outputs a power of about 3 KW.

Film Formation Example 11

In this example, there was prepared a photovoltaic element of the configuration shown in FIG. 17(c), using a modification of the three film-forming chambered MW-PCVD apparatus shown in FIG. 12 wherein a first isolating vessel 500a' equivalent to the isolation vessel 500a, a second isolating vessel 500' equivalent to the isolating vessel 500 and a third isolating vessel 500b' equivalent to the isolating vessel 500b are additionally arranged between the isolating vessel 500b and the unload chamber 1002 and those three isolating vessels are connected to each other by means of gas gates (not shown).

As a substrate web 101, there was used a substrate web made of SUS 430 BA which is the same as used in Film Formation Example 1.

Firstly, the substrate web was applied with a 1.2 μm thick ZnO film as the lower electrode 1702 to the surface thereof in the same manner as in Film Formation Example 8.

Then, the substrate web was set to the foregoing modified six film-forming chambered MW-PCVD apparatus. The lower cell 1711 was formed using the first unit comprising the isolating vessels 500a, 500 and 500b in the same manner as in Film Formation Example 9 and under the conditions shown in Table 22, and the upper cell 1712 was formed using the second unit comprising the isolating vessels 500a', 500' and 500b' in the same manner as in Film Formation Example 8 under the conditions shown in Table 22.

The resultant was applied with an ITO thin film as the transparent electrode 1706 to the surface of the top layer thereof in the same manner as in Film Formation Example 8.

The product thus obtained was cut off to obtain a plurality of specimens respectively of 40 cm×80 cm in size.

Each of the specimens was applied with a comb-shaped Ag film as the collecting electrode 1707 to the surface of the ITO film as the transparent electrode 1706 in the same manner as in Film Formation Example 8.

Thus, there were obtained a plurality of solar cell modules respectively of the pin junction type.

For each of them, the photovoltaic characteristics were evaluated under irradiation of AM 1.5 light (100 mW/cm²). As a result, every module exhibited a photoelectric conversion efficiency of more than 10.2%. The unevenness with respect to the characteristics among the modules was within 5%.

Further, each module was irradiated with AM 1.5 light (100 mW/cm²) continuously for 500 hours, and its photoelectric conversion efficiency was examined. As a result, the difference between the initial photoelectric conversion efficiency and the last photoelectric conversion efficiency after light irradiation for 500 hours with respect to all the modules was within 9%.

These modules were properly combined to obtain a power supply system. It was found that the resultant system outputs a power of about 3 KW.

Film Formation Example 12

In this example, there was prepared a photovoltaic element of the configuration shown in FIG. 17(c), using the same six film-forming chambered MW-PCVD apparatus as used in Film Formation Example 11.

As the substrate web 101, there was used a substrate web made of SUS 430 BA which is the same as used in Film Formation Example 1.

Firstly, the substrate web was applied with a 1.2 μm thick ZnO film as the lower electrode 1702 to the surface thereof in the same manner as in Film Formation Example 8.

Then, the substrate web was set to the six film-forming chambered MW-PCVD apparatus. The lower cell 1711 was formed using the first unit comprising the isolating vessels 500a, 500 and 500b in the same manner as in Film Formation Example 8 and under the conditions shown in Table 23, and the upper cell 1712 was formed using the second unit comprising the isolated vessels 500a', 500' and 500b' in the same manner as in Film Formation Example 10 under the conditions shown in Table 23.

The resultant was applied with an ITO thin film as the transparent electrode 1706 to the surface of the top layer thereof in the same manner as in Film Formation Example 8.

The product thus obtained was cut off to obtain a plurality of specimens respectively of 40 cm×80 cm in size.

Each of the specimens was applied with a comb-shaped Ag film as the collecting electrode 1707 to the surface of the ITO film as the transparent electrode 1706 in the same manner as in Film Formation Example 8.

Thus, there were obtained a plurality of solar cell modules respectively of the pin junction type.

For each of them, the photovoltaic characteristics were evaluated under irradiation of AM 1.5 light (100 mW/cm²). As a result, every module exhibited a photoelectric conversion efficiency of more than 10.3%. The unevenness with respect to the characteristics among the modules was within 5%.

Further, each module was irradiated with AM 1.5 light (100 mW/cm²) continuously for 500 hours, and its photoelectric conversion efficiency was examined. As a result, the difference between the initial photoelectric conversion efficiency and the last photoelectric conversion efficiency after light irradiation for 500 hours with respect to all the modules was within 9%.

These modules were properly combined to obtain a power supply system. It was found that the resultant system outputs a power of about 3KW.

Film Formation Example 13

In this example, there was prepared a triple cell type photovoltaic element of the configuration shown in FIG. 17(d), using a modification of the six film-forming chambered MW-PCVD apparatus used in Film Formation Example 11, wherein a first isolating vessel 500a" equivalent to the isolating vessel 500a, a second isolating vessel 500 equivalent to the isolating vessel 500 and a third isolating vessel 500b" equivalent to the isolating vessel 500b are additionally arranged between the isolating vessel 500b' and the unload chamber 1002 and these three isolating vessels are connected to each other by means of gas gates (not shown).

As the substrate web 101, there was used a substrate web made of SUS 430 BA which is the same as used in Film Formation Example 1.

Firstly, the substrate web was applied with a 1.2 μm thick ZnO film as the lower electrode 1702 to the surface thereof in the same manner as in Film Formation Example 8.

Then, the substrate web was set to the foregoing modified nine film-forming chambered MW-PCVD apparatus. The lower cell 1720 was formed using the first unit comprising the isolating vessels 500a, 500 and 500b in the same manner as in Film Formation Example 9 and under the conditions shown in Table 24. The middle cell 1721 was formed using the second unit comprising the isolating vessels 500a', 500' and 500b' in the same manner as in Film Formation Example 8 under the conditions shown in Table 24. And the upper cell 1722 was formed using the third unit comprising the isolating vessels 500a", 500" and 500b" in the same manner as in Film Formation Example 10 and under the conditions shown in Table 24.

The product thus obtained was cut off to obtain a plurality of specimens respectively of 40 cm×80 cm in size.

Each of the specimens was applied with a comb-shaped Ag film as the collecting electrode 1707 to the surface of the ITO film as the transparent electrode 1706 in the same manner as in Film Formation Example 8. Thus, there were obtained a plurality of solar cell modules respectively of the pin junction type.

For each of them, the photovoltaic characteristics were evaluated under irradiation of AM 1.5 light (100 mW/cm²). As a result, every module exhibited a photoelectric conversion efficiency of more than 10.5%. The unevenness with respect to the characteristics among the modules was within 5%.

Further, each module was irradiated with AM 1.5 light (100 mW/cm²) continuously for 500 hours, and its photoelectric conversion efficiency was examined. As a result, the difference between the initial photoelectric conversion efficiency and the last photoelectric conversion efficiency after light irradiation for 500 hours with respect to all the modules was within 8.5%.

These modules were properly combined to obtain a power supply system. It was found that the resultant system outputs a power of about 3 KW.

Film Formation Example 14

An amorphous silicon film was continuously formed on a large area and lengthy substrate web, using the MW-PCVD apparatus (shown in FIG. 11) described in the foregoing Apparatus Embodiment 30. As the microwave applicator means 208, there was used a microwave applicator means of Applicator No. 13 shown in Table 6.

A pay-out reel 1103 having a cleaned substrate web 201 made of SUS 430 BA of 60 cm in width, 0.2 mm in thickness and 100 m in length wound thereon was placed in the substrate feed chamber 1101. The substrate web 201 was paid out from the pay-out reel 1103, it was passed through the gas gate 1121, the transportation mechanism of the isolating vessel 600 and the gas gate 1122, and fixed to the take-up reel 1104 of the unload chamber 1102. The substrate web 201 was adjusted not to have any loose part.

The size of the columnar portion to be the circumferential wall of the film-forming chamber 1123 and the foregoing spacings $L_1$, $L_2$ and $L_3$ were made as shown in Table 25. Likewise, the conditions concerning the microwave applicator means and other related conditions were made as shown in Table 25.

The substrate feed chamber 1101, the isolating vessel 600, and the unload chamber 1102 were provisionally evacuated respectively by means of a mechanical booster pump (not shown) to a vacuum of about $10^{-3}$ Torr. The substrate web 201 situated in the isolating vessel 600 was heated and maintained at a temperature of about 250° C. by the temperature controlling mechanisms 206 and 207. The inner pressure of the isolating chamber 600 was controlled to a vacuum of less than $5\times10^{-6}$ Torr by means of an oil diffusion pump (not shown).

Thereafter, through a bias voltage applying pipe 212 made of nickel which serves also as a gas feed pipe, $SiH_4$ gas, $SiF_4$ gas and $H_2$ gas were fed into the film-forming space at respective flow rates of 550 sccm, 8 sccm and 40 sccm. The gas pressure of the film-forming space was controlled to and maintained at about 8.5 m Torr by regulating the opening of a slot valve 1109 of an exhaust pipe 1120. In this case, the gas pressure in the space between the exterior of the film-forming chamber and the circumferential wall of the isolating vessel was 1.5 m Torr. After the flow rates of the three gases and said gas pressure of the film-forming space became stable respectively, a microwave power source (not shown) was switched on to radiate a microwave energy (2.45 GHz) through the microwave applicator means 208 into the film-forming space with an effective power of 1.7 KW, wherein discharge was caused to provide a plasma region in the film-forming space. In this case, no plasma region was leaked out of the film-forming space. And any leakage of microwave out of the isolating vessel 600 was not detected.

Then, a bias voltage power source 218 was switched on to apply a DC voltage of +90 V onto the bias voltage applying pipe 212, wherein a bias current of 7.5 A flowed and a certain increase in the luminance of plasma was observed by eyes.

Successively, the initial and terminal supportingly transporting rollers 202 and 203 and the pair of the supportingly transporting rings 204 and 205 were started rotating respectively by a driving mechanism (not shown) to thereby transport the substrate web 201 at a speed of 1.2 cm/min, wherein plasma was stable and no change was observed for the bias voltage and the bias current.

In the above, $H_2$ gas as the gate gas was fed into the gas gates 1121 and 1122 through gate gas supply pipes 1116 and 1117 at a flow rate of 50 sccm. And the gas gates 1121 and 1122 were evacuated through exhaust pipes 1118 and 1119 by means of an oil diffusion pump (not shown) to bring their insides to and maintain at a vacuum of 1 m Torr.

Film formation was performed for 30 minutes. Since there was used a lengthy substrate web, next film formation was successively performed after finishing the film formation of this example. After the film formation of this example, the substrate web 201 taken up on the take-up reel 1104 while being cooled by the temperature controlling mechanism 1113 in the unload chamber 1102 was taken out from the unload chamber 102.

Then, the film deposited on the substrate web 201 in this example was examined with respect to the thickness distribution in the width direction and also in the longitudinal direction in the same manner as in Film Formation Example 1. As a result, it was found that the thickness distribution was within 5%. As a result of examining the deposition rate, it was found to be 86 Å/sec on the average. Further, as a result of examining an infrared absorption spectrum for a film specimen cut off from the resultant by a conventional reflection method, a distinguishable peak was found at 2000 $cm^{-1}$ and also at 630 $cm^{-1}$ which indicate a-Si:H:F film. Likewise, as a result of examining the crystallinity of said film specimen by a RHEED (trade name: JEM-100 SX, product by JEOL, Ltd.), the film specimen showed a halo pattern, and it was found to be amorphous. Further, the amount of hydrogen atoms contained in the film specimen was examined by a hydrogen content analyzer EMGA-1100 (product by Horiba Seisakusho Kabushiki Kaisha). As a result, it was found to be 23±2 atomic %.

Further, about 5 $cm^2$ square of the amorphous silicon film formed on the substrate web 201 was mechanically removed. The resultant was measured with respect to its volume, and it was set to an ESR device JES-RE2X (product by JEOL, Ltd.) to measure its spin density. As a result, it was found that its spin density is $2.8\times10^{15}$ spins/$cm^2$, which means that the film is accompanied with few defects.

In addition, the substrate web having the amorphous silicon film thereon was cut off to obtain 5 specimens respectively of 1 cm×1 cm in size.

Each of the specimens was applied with a 1500 Å thick ITO ($In_2O_3+SnO_2$) film to the surface thereof by a reactive sputtering method.

Each of the resultants was set to a constant photocurrent device (product by CANON KABUSHIKI KAISHA), wherein light was impinged from the side of the ITO film to measure the inclination of an Urbach tail. Any of the 5 specimens showed a value of 49±1 meV.

From this result, it was found that the film is accompanied with few defects.

Film Formation Example 15

After the film formation of Film Formation Example 14 was completed, the introduction of the gases used therein was terminated. In this example, the procedures of Film Formation Example 14 were repeated, except that the foregoing Applicator No. 13 was replaced by a microwave applicator means of Applicator No. 11 shown in Table 6. The isolating vessel 600 was evacuated in the same manner as in Film Formation Example 14 to bring the inside to a vacuum of less than $5\times10^{-6}$ Torr. The film-forming procedures of Film Formation Example 14 were repeated, except that $SiH_4$ gas, $GeH_4$ gas, $SiF_4$ gas and $H_2$ gas were fed into the film-forming space at respective flow rates of 160 sccm, 130 sccm, 5 sccm and 25 sccm; the gas pressure of the film-forming space was maintained at 14.5 m Torr; and the power of a microwave energy was set to be 0.95 KW in terms of effective power, to thereby form an amorphous silicon germanium film on the substrate web.

In the above, a DC bias voltage of +50 V was applied onto the bias voltage applying pipe 212, wherein a bias current of 7.1 A flowed and a certain increase in the luminance of plasma was observed by eye.

The resultant film was taken out in the same manner as in Film Formation Example 14.

For the resultant film, the film thickness distribution in the width direction and in the longitudinal direction, deposition rate, infrared absorption spectrum, crystallinity and hydrogen content were examined respectively in the same manner as in Film Formation Example 1.

As a result, the following were found. That is, the film thickness distribution: within 5%; the deposition rate: 40 Å/sec on the average; the infrared absorption spectrum: a distinguishable peak at 2000 cm$^{-1}$, at 1880 cm$^{-1}$, and at 630 cm$^{-1}$ which indicate a SiGe:H:F film; the crystallinity: halo pattern which indicates an amorphous film; and the hydrogen content: 15±2 atomic %.

Further, the spin density and the inclination of an Urback tail of the resultant film were examined in the same manner as in Film Formation Example 14.

As a result, the following were found. That is, the spin density: 4.4×10$^{15}$ spins/cm$^3$ which means that the film is accompanied with few defects; and the Urback tail inclination: 53±1,eV which also means that the film is accompanied with few defects.

Film Formation Example 16

After the film formation of Film Formation Example 15 was completed, the introduction of the gases used therein was terminated. In this example, the procedures of Film Formation Example 14 were repeated. The microwave applicator means of Applicator No. 11 was replaced by a microwave applicator means of Applicator No. 13 shown in Table 6. The isolating vessel 600 was evacuated in the same manner as in Film Formation Example 14 to bring the inside to a vacuum of less than 5×10$^{-6}$ Torr. The film-forming procedures of Film Formation Example 14 were repeated, except that SiH$_4$ gas, CH$_4$ gas, SiF$_4$ gas and H$_2$ gas were fed into the film-forming space at respective flow rates of 260 sccm, 38 sccm, 5 sccm and 80 sccm and the gas pressure of the film-forming space was maintained at 24 m Torr, to thereby form an amorphous silicon carbide film on the substrate web.

In the above, a DC bias voltage of +60 V was applied onto the bias voltage applying pipe 213, wherein a bias current of 7.3 A flowed and a certain increase in the luminance of plasma was observed by eye.

The resultant film was taken out in the same manner as in Film Formation Example 14.

For the resultant film, the film thickness distribution in the width direction and in the longitudinal direction, deposition rate, infrared absorption spectrum, crystallinity and hydrogen content were examined respectively in the same manner as in Film Formation Example 1.

As a result, the following were found. That is, the film thickness distribution: within 5%; the deposition rate: 43 Å/sec on the average; the infrared absorption spectrum: a distinguishable peak at 2080 cm$^{-1}$, at 1250 cm$^{-1}$, at 960 cm$^{-1}$, at 777 cm$^{-1}$ and at 660 cm$^{-1}$ which indicate a SiC:H:F film; the crystallinity: halo pattern which indicates an amorphous film; and the hydrogen content: 13±2 atomic %.

Further, the spin density and the inclination of an Urback tail of the resultant film were examined in the same manner as in Film Formation Example 14.

As a result, the following were found. That is, the spin density: 7.9×10$^{15}$ spins/cm$^3$ which means that the film is accompanied with few defects; and the Urback tail inclination: 55±1 meV which also means that the film is accompanied with few defects.

Film Formation Example 17

After the film formation of Film Formation Example 16 was completed, the introduction of the gases used therein was terminated. In this example, the procedures of Film Formation Example 14 were repeated. The microwave applicator means of Applicator No. 13 used in Film Formation Example 16 was replaced by a microwave applicator means of a microwave applicator means of Applicator No. 3 shown in Table 1. The isolating vessel 600 was evacuated in the same manner as in Film Formation Example 14 to bring the inside to a vacuum of less than 5×10$^{-6}$ Torr. The film-forming procedures of Film Formation Example 14 were repeated, except that SiH$_4$ gas, BF$_3$/H$_2$ gas (=3000 ppm), SiF$_4$ gas and H$_2$ gas were fed into the film-forming space at respective flow rates of 270 sccm, 55 sccm, 48 sccm and 45 sccm; the gas pressure of the film-forming space was maintained at 19 m Torr; and the power of a microwave energy was set to be 2.8 KW in terms of effective power, to thereby form a p-type microcrystal silicon filmed doped with B on the substrate web.

In the above, a DC bias voltage of +125 V was applied onto the bias voltage applying pipe 212, wherein a bias current of 8.6 A flowed and a certain increase in the luminance of plasma was observed by eye.

The resultant film was taken out in the same manner as in Film Formation Example 14.

For the resultant film, the film thickness distribution in the width direction and in the longitudinal direction, deposition rate, infrared absorption spectrum, crystallinity and hydrogen content were examined respectively in the same manner as in Film Formation Example 1.

As a result, the following were found. That is, the film thickness distribution: within 5%; the deposition rate: 42 Å/sec on the average; the infrared absorption spectrum: a distinguishable peak at 2100 cm$^{-1}$ at 630 cm$^{-1}$ which indicate a microcrystal Si:H:F film; the crystallinity: ring pattern which indicates a non-oriented polycrystalline film; and the hydrogen content: 4±1 atomic %.

In addition, the substrate web of the foregoing film formed thereon was randomly cut off to obtain 5 specimens respectively of 5 mm×5 mm in size.

The surface state of each of the 5 specimens was observed by an ultra-high resolution low-accelerating FE-SEM S-900 type (product by Hitachi, Ltd.)

As a result, it was found that any of the 5 specimens has a desirably smooth surface without having any undesirable irregularities.

Film Formation Example 18

After the film formation of Film Formation Example 17 was completed, the introduction of the gases used wherein was terminated. In this example, the same procedures as in Film Formation Example 14 were employed. The isolated vessel 600 was evacuated in the same manner as in Film Formation Example 14 to bring the inside to a vacuum of less than 5×10$^{-6}$ Torr. The film-forming procedures of Film Formation Example 14 were repeated, except that SiH$_4$ gas, PH$_3$H$_2$ gas (=1%), SiF$^4$ gas and H$_2$ gas were fed into the film-forming space at respective flow rates of 380 sccm, 32 sccm, 5 sccm and 25 sccm; the gas pressure of the film-forming space was maintained at 11 m Torr; the power of a microwave energy was made to be 1.1 KW in terms of effective power, to thereby form an n-type amorphous silicon film doped with P on the substrate web.

In the above, a DC bias voltage of +90 V was applied onto the bias voltage applying pipe 212, wherein a bias current of 7.1 A flowed and a certain increase in the luminance of plasma was observed by eye.

The resultant film was taken out in the same manner as in Film Formation Example 14.

For the resultant film, the film thickness distribution in the width direction and in the longitudinal direction, deposition rate, infrared absorption spectrum, crystallinity and hydrogen content were examined respectively in the same manner as in Film Formation Example 1.

As a result, the following were found. That is, the film thickness distribution: within 5%; the deposition rate: 60 Å/sec on the average; the infrared absorption spectrum: a distinguishable peak at 2000 cm$^{-1}$ and at 630 cm$^{-1}$ which indicate an a-Si:H:F film; the crystallinity; halo pattern which indicates an amorphous film; and the hydrogen content: 22±2 atomic %.

In addition, the substrate web of the foregoing film formed thereon was randomly cut off to obtain 5 specimens respectively of 5 mm×5 mm in size.

The surface state of each of the 5 specimens was observed by an ultra-high resolution low-accelerating FE-SEM S-900 type (product by Hitachi Ltd.)

As a result, it was found that any of the 5 specimens has a desirably smooth surface without having any undesirable irregularities.

Film Formation Example 19

The procedures of Film Formation Example 14 were repeated except that the SUS 430 BA substrate web was replaced by a PET substrate web processed in the way as will be described below: and said substrate web was maintained at a temperature of 250° C. upon film formation, to whereby continuously form an amorphous silicon film on said substrate web.

That is, there was provided a PET substrate web of 60 cm in width, 0.8 mm in thickness and 100 m in length, and it was applied with a 2 μm thick Al film to the surface thereof on which a film is to be formed, wherein at part of which a plurality of comb-shaped gap electrodes respectively of 70 μm in width and 10 mm in length were formed at the interval of 20 cm in the longitudinal direction. This was used as the substrate web.

During the film formation, a DC bias voltage of +90 V was applied onto the bias voltage applying pipe 212, wherein a bias current of 7.0 A flowed and a certain increase in the luminance of plasma was observed by eye.

The resultant film was taken out in the same manner as in Film Formation Example 14.

For the resultant film, the film thickness distribution in the width direction and in the longitudinal direction, deposition rate, infrared absorption spectrum, crystallinity and hydrogen content were examined respectively in the same manner as in Film Formation Example 1.

As a result, the following were found. That is, the film thickness distribution: within 5%; the deposition rate: 84 Å/sec on the average; the infrared absorption spectrum: a distinguishable peak at 2000 cm$^{-1}$ and at 630 cm$^{-1}$ which indicate an a-Si:H:F film; the crystallinity: halo pattern which indicates an amorphous film; and the hydrogen content: 23±2 atomic %.

The resultant film formed on the plurality of gap electrodes was randomly cut to obtain 20 film specimens respectively containing a gap electrode. For each specimen, a value of photocurrent under irradiation of AM-1 light (100 mW/cm$^2$) and a value of dark current in dark were measured using HP 4140 B to obtain a light conductivity σp (S/cm) and a dark conductivity σd (S/cm). As a result, the light conductivity of each of the 20 specimens was within the range of (1.5±0.5)×10$^{-11}$ S/cm.

Further, the inclination of an Urback tail of the resultant film was examined in the same manner as in Film Formation Example 14.

As a result, the Urback tail inclination was 51±1 meV which means that the film is accompanied with few defects.

Film Formation Examples 20 to 24

In each of Film Formation Examples 14 to 18, the film formation was performed by changing the bias voltage as shown in Table 26.

The film obtained in each of the five cases was evaluated in the same manners as in Film Formation Examples 14 to 18.

The evaluated results obtained were collectively shown in Table 26.

In each of the five cases, plasma was stably maintained without causing abnormal discharge and a desirable semiconductor film excelling in the characteristics was obtained.

Film Formation Examples 25 to 29

In each of Film Formation Examples 14 to 18, the bias voltage applying means was replaced by the bias voltage applying means shown in FIG. 19(d), a DC voltage of +30 V was applied onto the first bias bar and a different bias voltage was applied onto the second bias bar as shown in Table 27.

The film obtained in each of the five cases was evaluated in the same manner as in Film Formation Examples 14 to 18.

The evaluated results obtained are collectively shown in Table 27.

In each of the five cases, plasma was stably maintained without causing abnormal discharge and a desirable semiconductor film excelling in the characteristics was obtained.

Film Formation Example 30

In this example, there was prepared a Schottky junction type diode of the configuration shown in FIG. 16, using the MW-PCVD apparatus shown in FIG. 11 which has a microwave applicator means of Applicator No. 13 shown in Table 6 as the microwave applicator means 208.

The size of the columnar portion to be the circumferential wall of the film-forming chamber 1123, the foregoing spacings L$_1$, L$_2$ and L$_3$, and other related conditions were made as shown in Table 25.

Firstly, there was provided a continuous sputtering apparatus, and a SUS 430 BA substrate web was set to said apparatus in the same manner as in Film Formation Example 14, wherein a Cr target (99.98% purity) was used to deposit a 1300 Å thick Cr film to be the lower electrode 1602 on the surface of the substrate web.

Then, the substrate web having said Cr layer thereon was placed in the MW-PCVD apparatus shown in FIG. 11 in the same manner as in Film Formation Example 14, wherein said substrate web was set such that the Cr layer formed thereon was faced downward.

The substrate feed chamber 1101, the isolating vessel 600, and the unload chamber 1102 were provisionally evacuated respectively by means of a rotary vacuum pump (not shown). These three vessels were then evacuated respectively by means of a mechanical booster pump (not shown) to a vacuum of about $10^{-3}$ Torr.

The substrate was heated to and maintained at a temperature of about 250° C. by the temperature controlling mechanisms 206 and 207 in the isolating vessel 600.

The inner pressure of the isolating vessel was regulated to a vacuum of less than $5 \times 10^{-6}$ Torr by means of an oil diffusion pump (not shown).

Thereafter, $SiH_4$ gas, $SiF_4$ gas, $PH_3/H_2$ gas (=1%), and $H_2$ gas were fed through the bias voltage applying pipe 212 capable of serving as the gas feed pipe into the film-forming space at respective flow rates of 340 sccm, 5 sccm, 55 sccm and 25 sccm. The gas pressure of the film-forming space was controlled to and maintained at about 11 m Torr by regulating the opening of the slot valve 1109 of the exhaust pipe 1120.

After the flow rates of the four gases and the gas pressure became stable respectively, a microwave power source (not shown) was switched on to radiate a microwave energy (2.45 GHz) through the microwave applicator means 208 into the film-forming space with an effective power of 1.8 KW. At the same time, a DC bias voltage of +80 V was applied onto the bias voltage applying pipe 212, wherein a bias current of 7.8 A flowed.

After plasma became stable, the initial and terminal supportingly transporting rollers 202 and 203 and the pair of the supportingly transporting rings 204 and 205 were started rotating respectively by a driving mechanism (not shown) to transport the substrate web at a speed of 53 cm/min. from the left side to the right side in the FIG. 11 for 5 minutes. In this case, $H_2$ gas as the gate gas was fed into the gas gates 1121 and 1122 through gate gas supply pipes 1116 and 1117 at a flow rate of 50 sccm. And the gas gates 1121 and 1122 were evacuated through the exhaust pipes 1118 and 1119 by means of an oil diffusion pump (not shown) to bring their insides to and maintain at a vacuum of 2 m Torr.

As a result, there was formed an n+-type a-Si:H:F film doped with P as the n+-type semiconductor layer 1603 on the Cr layer as the lower electrode 1602 previously formed on the substrate web. Thereafter, the application of the microwave energy and the introduction of the film-forming raw material gases were suspended. And the transportation of the substrate web was stopped.

Then, the isolating vessel 600 was evacuated to a vacuum of less than $5 \times 10^{-6}$ Torr.

Following the procedures in the above film formation, $SiH_4$ gas, $SiF_4$ gas and $H_2$ gas were fed into the film-forming space at respective flow rates of 360 sccm, 10 sccm and 45 sccm. The gas pressure of the film-forming space was maintained at about 7.5 m Torr. Then, a microwave energy (2.45 GHz) was radiated into the film-forming space with an effective power of 1.7 KW. At the same time, a DC bias voltage of +80 V was applied, wherein a bias current of 6.8 A flowed. After plasma generated became stable, the substrate web was transported from the right side to the left side reversely at a transportation speed of 56 cm/min. Film formation was performed for 5.2 minutes.

As a result, there was formed a non-doped a-Si:H:F film as the non-doped semiconductor layer 1604 on the previously formed n+-type a-Si:H:F film.

After the above film formation was completed, the application of the microwave energy, the introduction of the film-forming raw material gas, and the transportation of the substrate web were all terminated. The residual gas in the isolating vessel 600 was exhausted. After the substrate web was cooled to room temperature, the substrate web was taken out from the substrate feed chamber 1101 which served as the unload chamber in the case of the last film formation.

The substrate web having the foregoing three layers being laminated thereon was randomly cut off to obtain ten specimens of the same size.

Each of the ten specimens was applied with a 80 Å thick Au film by an electron beam evaporation method. Then, a pair of current outputting terminals 1606 and 1607 were provided thereto by using a wire bonder.

Each of the resultants was examined with respect to diode characteristics by using a HP 4140 B.

As a result, each of the ten specimens exhibited a desirable diode factor (n=1.08±0.05) and about 6 digits for the rectification ratio at ±1 V. From the results obtained, it was found that any of the ten specimens excels in the diode characteristics desired for the Schottky junction type diode.

Film Formation Example 31

In this example, there was prepared a pin junction photovoltaic element of the configuration shown in FIG. 17(a), using the three film-forming chambered MW-PCVD apparatus shown in FIG. 13.

There was used a PET substrate web as the substrate web 201.

The PET substrate web was set to a continuous sputtering apparatus, wherein a 1000 Å thick Ag film as a electroconductive layer was formed on said substrate web by sputtering an Ag target (99.99%). Successively, a 1.2 μm thick ZnO film as the lower electrode 1702 was formed on the previously formed Ag film.

The substrate web having the Ag thin film and the ZnO thin film being laminated thereon was set to the three film-forming chambered MW-PCVD apparatus having the constitution shown in FIG. 13 in the same manner as in Film Formation Example 14.

In this case, the size of the columnar portion provided in the isolating vessel 600 was made to be 20 cm in inside diameter as shown in Table 28. Likewise, the size of the columnar portion in the isolating vessel 600a and the size of the columnar portion in the isolating vessel 600b were made to be 13 cm and 13 cm in inside diameter as shown in Table 29.

Other conditions concerning the MW-PCVD apparatus encapsuled in the isolating vessel 600 were made as shown in Table 28. Likewise, other conditions concerning the MW-PCVD apparatus encapsuled in the isolating vessel 600a and other conditions concerning the MW-PCVD apparatus encapsuled in the isolating vessel 600b were made respectively as shown in Table 29.

There was caused microwave discharge in each of three film-forming chambers under the respective conditions shown in Table 28 for the isolating vessel 600 and in Table 29 for the isolating vessels 600a and 600b. In the film-forming chamber of the isolating vessel 600a, there was formed an n-type a-Si:H:F film to be the n-type semiconductor layer 1703 under the conditions shown in Table 29. In the film-forming chamber of the isolating vessel 600, there was formed a non-doped a-Si:H:F film to be the i-type semiconductor layer 1704 under the conditions shown in Table 28. In the film-forming chamber of the isolating vessel 600b, there was formed a p+-type microcrystal Si:H:F film to be the p-type semiconductor layer 1705 under the conditions in Table 29.

The substrate web having the foregoing n-type, i-type and p+-type semiconductor layer being laminated on the lower electrode comprising the foregoing ZnO thin film was cooled to room temperature in the unload chamber 1102 and it was taken out therefrom. This substrate web was set to a reactive sputtering apparatus, wherein a 700 Å thick ITO film as the transparent electrode 1706 was formed thereon. Then, the resultant was cut off to obtain a plurality of specimens respectively of 40 cm×80 cm in size. Each of the specimens thus obtained was applied with a comb-shaped collecting electrode 1707 comprising an about 1 μm thick Ag film onto the surface thereof by an electron beam evaporation method.

Thus, there were obtained a plurality of solar cell modules respectively of the pin junction type.

For each of them, the photovoltaic characteristics were evaluated under irradiation of AM 1.5 light (100 mW/cm$^2$). As a result, every module exhibited a photoelectric conversion efficiency of more than 8.6%. The unevenness with respect to the characteristics among the modules was within 5%.

Further, each module was irradiated with AM 1.5 light (100 mW/cm$^2$) continuously for 500 hours, and its photoelectric conversion efficiency was examined. As a result, the difference between the initial photoelectric conversion efficiency and the last photoelectric conversion efficiency after light irradiation for 500 hours with respect to all the modules was within 9.5%.

The ratio of defects to be caused by shorts, etc. was examined in comparison with the solar cell module prepared without applying any bias voltage. As a result, it was found that the solar cell module obtained in this example was superior to said solar cell module by more than 20%.

The above modules obtained in this example were properly combined to obtain a power supply system. It was found that the resultant system outputs a power of about 3 KW.

Film Formation Example 32

There was prepared a pin junction photovoltaic element of the configuration shown in FIG. 17(a) by repeating the procedures of Film Formation Example 31, except that instead of the a-Si:H:F film as the i-type semiconductor layer, there was formed a non-doped a-SiGe:H:F film in the manner similar to that of Film Formation Example 15 wherein the substrate web was moved at a transportation speed of 50 cm/min, and a rectangular wave bias voltage (1 KHz) of 180 Vp-p was applied upon film formation.

From the resultant, a plurality of solar cell modules were prepared in the same manner as in Film Formation Example 31.

For each of them, the photovoltaic characteristics were evaluated under irradiation of AM 1.5 light (100 mW/cm$^2$). As a result, every module exhibited a photoelectric conversion efficiency of more than 7.6%. The unevenness with respect to the characteristics among the modules was within 5%.

Further, each module was irradiated with AM 1.5 light (100 mW/cm$^2$) continuously for 500 hours, and its photoelectric conversion efficiency was examined. As a result, the difference between the initial photoelectric conversion efficiency and the last photoelectric conversion efficiency after light irradiation for 500 hours with respect to all the modules was within 9.5%.

The ratio of defects to be caused by shorts, etc. was examined in comparison with the solar cell module prepared without applying any bias voltage. As a result, it was found that the solar cell module obtained in this example was superior to said solar cell module by more than 20%.

The above modules obtained in this example were properly combined to obtain a power supply system. It was found that the resultant system outputs a power of about 3 KW.

Film Formation Example 33

There was prepared a pin junction photovoltaic element of the configuration shown in FIG. 17(a) by repeating the procedures of Film Formation Example 31, except that instead of the a-Si:H:F film as the i-type semiconductor layer, there was formed a non-doped a-SiC:H:F film in the manner similar to that of Film Formation Example 16 wherein the substrate web was moved at a transportation speed of 43 cm/min, and a sine wave bias voltage (500 Hz) of 170 Vp-p was applied upon film formation.

From the resultant, a plurality of solar cell modules were prepared in the same manner as in Film Formation Example 31.

For each of them, the photovoltaic characteristics were evaluated under irradiation of AM 1.5 light (100 mW/cm$^2$). As a result, every module exhibited a photoelectric conversion efficiency of more than 6.7%. The unevenness with respect to the characteristics among the modules was within 5%.

Further, each module was irradiated with AM 1.5 light (100 mW/cm$^2$) continuously for 500 hours, and its photoelectric conversion efficiency was examined. As a result, the difference between the initial photoelectric conversion efficiency and the last photoelectric conversion efficiency after light irradiation for 500 hours with respect to all the modules was within 9.5%.

The ratio of defects to be caused by shorts, etc. was examined in comparison with the solar cell module prepared without applying any bias voltage. As a result, it was found that the solar cell module obtained in this example was superior to said solar cell module by more than 20%.

The above modules obtained in this example were properly combined to obtain a power supply system. It was found that the resultant system outputs a power of about 3 KW.

Film Formation Example 34

In this example there was prepared a photovoltaic element Z of the configuration shown in FIG. 17(c), using a modification of the three film-forming chambered MW-PCVD apparatus shown in FIG. 13 wherein a first isolating vessel 600a' equivalent to the isolating vessel 600a, a second isolating vessel 600' equivalent to the isolating vessel 600 and a third isolating vessel 600b' equivalent to the isolating vessel 600b are additionally arranged between the isolating vessel 600b and the unload chamber 1102 and these three isolating vessels are connected to each other by means of gas gates (not shown).

As the substrate web 201, there was used a substrate web made of SUS 430 BA which is the same as used in Film Formation Example 14.

Firstly, the substrate web was applied with a 1.2 μm thick ZnO film as the lower electrode 1702 to the surface thereof.

Then, the substrate web was set to the foregoing modified six film-forming chambered MW-PCVD apparatus. The lower cell 1711 was formed using the first unit comprising the isolating vessels 600a, 600 and 600b in the same manner as in Film Formation Example 32 and under the conditions shown in Table 30. And the upper cell 1712 was formed using the second unit comprising the isolating vessels 600a', 600' and 600b' in the same manner as in Film Formation Example 31 under the conditions shown in Table 30.

The resultant was applied with an ITO thin film as the transparent electrode 1706 to the surface of the top layer thereof.

The product thus obtained was cut off to obtain a plurality of specimens respectively of 40 cm×80 cm in size.

Each of the specimens was applied with a comb-shaped Ag film as the collecting electrode 1707 to the surface of the ITC film as the transparent electrode.

For each of them, the photovoltaic characteristics were evaluated under irradiation of AM 1.5 light (100 mw/cm$^2$). As a result, every module exhibited a photoelectric conversion efficiency of more than 10.3%. The unevenness with respect to the characteristics among the modules was within 5%.

Further, each module was irradiated with AM 1.5 light (100 mw/cm$^2$) continuously for 500 hours, and its photoelectric conversion efficiency was examined. As a result, the difference between the initial photoelectric conversion efficiency and the last photoelectric conversion efficiency after light irradiation for 500 hours with respect to all the modules was within 9.0%.

The ratio of defects to be caused by shorts, etc. was examined in comparison with the solar cell module prepared without applying any bias voltage. As a result, it was found that the solar cell module obtained in this example was superior to said solar cell module by more than 20%.

The above modules obtained in this example were properly combined to obtain a power supply system. It was found that the resultant system outputs a power of about 3 KW.

Film Formation Example 35

In this example, there was prepared a photovoltaic element of the configuration shown in FIG. 17(c), using the same six film-forming chamber MW-PCVD apparatus as used in Film Formation Example 34.

As the substrate web 201, there was used a substrate web made of SUS 430 BA which is the same as used in Film Formation Example 14.

Firstly, the substrate web was applied with a 1.2 μm thick ZnO film as the lower electrode 1702 to the surface thereof.

Then, the substrate web was set to the foregoing modified six film-forming chambered MW-PCVD apparatus. The lower cell 1711 was formed using the first unit comprising the isolating vessels 600a, 600 and 600b in the same manner as in Film Formation Example 31 and under the conditions shown in Table 31. And the upper cell 1712 was formed using the second unit comprising the isolating vessels 600a', 600' and 600b' in the same manner as in Film Formation Example 33 under the condition shown in Table 31.

The resultant was applied with an ITO thin film as the transparent electrode 1706 to the surface of the top layer thereof.

The product thus obtained was cut off to obtain a plurality of specimens respectively of 40 cm×80 cm in size. Each of the specimens was applied with a comb-shaped Ag film as the collecting electrode 1707 to the surface of the ITO film as the transparent electrode 1706.

For each of them, the photovoltaic characteristics were evaluated under irradiation of AM 1.5 light (100 mW/cm$^2$). As a result, every module exhibited a photoelectric conversion efficiency of more than 10.4%. The unevenness with respect to the characteristics among the modules was within 5%.

Further, each module was irradiated with AM 1.5 light (100 mW/cm$^2$) continuously for 500 hours, and its photoelectric conversion efficiency was examined. As a result, the difference between the initial photoelectric conversion efficiency and the last photoelectric conversion efficiency after light irradiation for 500 hours with respect to all the modules was within 9%.

The ratio of defects caused by shorts, etc. was examined in comparison with the solar cell module prepared without applying any bias voltage. As a result, it was found that the solar cell module obtained in this example was superior to said solar cell module by more than 20%.

The above modules obtained in this example were properly combined to obtain a power supply system. It was found that the resultant system outputs a power of about 3 KW.

Film Formation Example 36

In this example, there was prepared a triple cell type photovoltaic element of the configuration shown in FIG. 17(d), using a modification of the six film-forming chambered MW-PCVD apparatus used in Film Formation Example 34, wherein a first isolating vessel 600a" equivalent to the isolating vessel 600a, a second isolating vessel 600" equivalent to the isolating vessel 600 and a third isolating vessel 600b" equivalent to the isolating vessel 600b are additionally arranged between the isolating vessel 600b' and the unload chamber 1102 and these three isolating vessels are connected to each other by means of gas gates (not shown).

As the substrate web 201, there was used a substrate web made of SUS 430 BA which is the same as used in Film Formation Example 14.

First, the substrate web was applied with a 1.2 μm thick ZnO film as the lower electrode 1702 to the surface thereof.

Then, the substrate web was set to the foregoing modified nine film-forming chambered MW-PCVD apparatus. The lower cell 1720 was formed using the first unit comprising the isolating vessels 600a, 600 and 600b in the same manner as in Film Formation Example 32 and under the conditions shown in Table 32. The middle cell 1721 was formed using the second unit comprising the isolating vessels 600a', 600' and 600b' in the same manner as in Film Formation Example 31 under the conditions shown in Table 32. And the upper cell 1722 was formed using the third unit comprising the isolating vessels 600a", 600" and 600b" in the same manner as in Film Formation Example 33 and under the conditions shown in Table 32.

The product thus obtained was cut off to obtain a plurality of specimens respectively of 40 cm×80 cm in size.

Each of the specimens was applied with a comb-shaped Ag film as the collecting electrode 1707 to the surface of the ITO film as the transparent electrode 1706.

For each of them, the photovoltaic characteristics were evaluated under irradiation of AM 1.5 light (100 mW/cm$^2$). As a result, every module exhibited a photoelectric conversion efficiency of more than 10.7%. The unevenness with respect to the characteristics among the modules was within 5%.

Further, each module was irradiated with AM 1.5 light (100 mW/cm$^2$) continuously for 500 hours, and its photoelectric conversion efficiency was examined. As a result, the difference between the initial photoelectric conversion efficiency and the last photoelectric conversion efficiency after light irradiation for 500 hours with respect to all the modules was within 8.5%.

The ratio of defects to be caused by shorts, etc. was examined in comparison with the solar cell module prepared without applying any bias voltage. As a result, it was found that the solar cell module obtained in this example was superior to said solar cell module by more than 20%.

The above modules obtained in this example were properly combined to obtain a power supply system. It was found that the resultant system outputs a power of about 3 KW.

TABLE 3

| Experiment No. | Applicator No. | Discharge State |
|---|---|---|
| 1 | 1 | stable but fairly localized in the side of the microwave power source |
| 2 | 2 | stable almost all over the surface |
| 3 | 3 | stable almost all over the surface |
| 4 | 4 | stable but fairly localized in the side of the microwave power source |
| 5 | 5 | stable almost all over the surface |
| 6 | 6 | stable but fairly localized in the side of the microwave power source |
| 7 | 7 | stable almost all over the surface |
| 8 | 8 | stable almost all over the surface |
| 9 | 9 | stable almost all over the surface |

TABLE 4

| | |
|---|---|
| raw material gas and its flow rate | SiH$_4$: 360 sccm<br>H$_2$: 40 sccm |
| microwave frequency and | 2.45 GHz |
| microwave power | 1.5 kW |
| spacing L$_4$ | 3 cm |
| internal diameter and width of curved portion | Ø 40 cm, 50 cm |
| inner pressure of the film-forming chamber | 9 m Torr |
| the material and the size of the isolating means | quartz tube (thickness 3 mm)<br>Ø 12 cm × 80 cm (inside diameter) |
| the kind of the substrate web and its thickness | SUS 430 BA |
| the punching board for confining the microwave plasma region | aperture size 8 mm, perforated proportion 45% made of a SUS 316L, applied with a Al$_2$O$_3$ film to the surface thereof |

Note:
spacing L$_4$ appears in FIG. 7(b) or FIG. 8(b).

TABLE 1

| Applicator No. | the standard of the waveguide used | aperture size (length × width) (mm) | number of apertures | the interval between every two apertures | the situation of the end | opening and/or closing states of the apertures |
|---|---|---|---|---|---|---|
| 1 | EIAJ, WCI-25 | 60 × 45 | 5 | 50 | closed | all open |
| 2 | the standard by Canon K.K. inside diameter Ø 90 mm | 50 × 40 | 6 | 40 | " | 4 apertures counted from the end were opened |
| 3 | the standard by Canon K.K. inside diameter Ø 100 mm | 35 × 55 | 7 | 40 | open | 5 apertures counted from the end were opened |
| 4 | IEC, R-32 | 60 × 50 | 5 | 50 | closed | all open |
| 5 | " | " | " | " | " | 4 apertures counted from the end were opened |
| 6 | " | 50 × 40 | 6 | 40 | " | all open |
| 7 | " | " | " | " | " | 4 apertures counted from the end were opened |
| 8 | IEC, R-26 | 30 × 70 | 8 | " | open | alternately closed from the end |
| 9 | the standard by Canon K.K. inside diameter (mm) 96 × 27 | 40 × 80 | 6 | 50 | closed | 5 apertures counted from the end were opened |

TABLE 2

| | |
|---|---|
| raw material gas and its flow rate | SiH$_4$: 360 sccm<br>H$_2$: 40 sccm |
| microwave frequency and | 2.45 GH$_2$ |
| microwave power | 2.0 kW |
| spacing L$_1$, L$_2$ | 2 cm, 2 cm |
| spacing L$_3$ | 12.5 cm |
| internal diameter and width of curved portion | Ø 20 cm, 50 cm |
| inner pressure of the film-forming chamber | 8 m Torr |
| the material and the size of the isolating means | quartz tube (thickness 3 mm)<br>Ø 12 cm × 80 cm (inside diameter) |
| the kind of the substrate web and its thickness | SUS 430 BA |
| the punching board for confining the microwave plasma region | aperture size 8 mm, perforated proportion 45% made of a SUS 316L, applied with an Al$_2$O$_2$ film to the surface thereof |

Note:
spacings L$_1$, L$_2$ and L$_3$ appear in FIG. 7(a) or FIG. 8(a).

TABLE 5

| Experiment No. | Applicator No. | Discharge State |
|---|---|---|
| 10 | 1 | stable but fairly localized in the side of the microwave power source |

TABLE 5-continued

| Experiment No. | Applicator No. | Discharge State |
|---|---|---|
| 11 | 2 | stable almost all over the surface |
| 12 | 3 | stable almost all over the surface |
| 13 | 4 | stable but fairly localized in the side of the microwave power source |
| 14 | 5 | stable almost all over the surface |
| 15 | 6 | stable but fairly localized in the side of the microwave power source |
| 16 | 7 | stable almost all over the surface |
| 17 | 8 | stable almost all over the surface |
| 18 | 9 | stable almost all over the surface |

TABLE 6

| Applicator No. | The Standard of the Waveguide Used | Aperture size (mm) [L × W] | The size of the shutter (mm) [L × W$_1$, W$_2$]*[3] | The Situation of the end | Perforated Proportion (%) |
|---|---|---|---|---|---|
| 10 | EIAJ, WCI-25 | 480 × 70 | 530 × 45, 65*[1] | open | 40 |
| 11 | EIAJ, WCI-25 | 480 × 70 | 530 × 45, 65*[2] R = 42 | open | 45 |
| 12 | the standard by Canon K.K. inside diameter ⌀ 90 mm | 480 × 75 | 530 × 50, 70*[1] | closed | 40 |
| 13 | the standard by Canon K.K. inside diameter ⌀ 100 mm | 470 × 80 | 530 × 55, 75*[2] R = 45 | open | 45 |
| 14 | IEC, R-32 | 470 × 72 | 520 × 55 | open | 45 |
| 15 | IEC, R-32 | 470 × 72 | 520 × 45, 55 | closed | 50 |
| 16 | IEC, R-32 | 450 × 86 | 520 × 45, 55*[4] R = 40 | open | 55 |
| 17 | IEC, R-26 | 450 × 86 | 480 × 50, 60 | open | 45 |
| 18 | the standard by Canon K.K. inside size (mm) 96 × 27 | 420 × 95 | 460 × 55, 65 | closed | 50 |
| 19 | the standard by Canon K.K. inside size (mm) 96 × 27 | 420 × 95 | 460 × 55, 65*[4] R = 45 | open | 55 |

*[1] FIG. 3(c)
*[2] FIG. 3(d)
*[3] L × W$_1$: strip
L × W$_1$, W2: trapezoidal
*[4] having three portions respectively cut into a semicircular shape of a radius R at L × W$_1$ and W$_2$ respectively

TABLE 7

| Experiment No. | Applicator No. | Discharge State |
|---|---|---|
| 19 | 10 | stable almost all over the surface |
| 20 | 11 | stable all over the surface |
| 21 | 12 | stable almost all over the surface |
| 22 | 13 | stable all over the surface |
| 23 | 14 | stable but fairly localized in the side of the microwave power source |
| 24 | 15 | stable almost all over the surface |
| 25 | 16 | stable all over the surface |
| 26 | 17 | stable almost all over the surface |
| 27 | 18 | stable almost all over the surface |
| 28 | 19 | stable all over the surface |

TABLE 8

| Experiment No. | Applicator No. | Discharge State |
|---|---|---|
| 29 | 10 | stable almost all over the surface |
| 30 | 11 | stable all over the surface |
| 31 | 12 | stable almost all over the surface |
| 32 | 13 | stable all over the surface |
| 33 | 14 | stable but fairly localized in the side of the microwave power source |
| 34 | 15 | stable almost all over the surface |
| 35 | 16 | stable all over the surface |

TABLE 8-continued

| Experiment No. | Applicator No. | Discharge State |
|---|---|---|
| 36 | 17 | stable almost all over the surface |
| 37 | 18 | stable almost all over the surface |
| 38 | 19 | stable all over the surface |

TABLE 9

| Wave Form | Frequency (Hz) | | | | | | | | | | Maximum amplitude voltage (Vp-p) |
|---|---|---|---|---|---|---|---|---|---|---|---|
| | 60 | 400 | 500 | 1.5K | 2K | 500K | 900K | 2M | 2.5M | 4M | |
|  (sine wave) | O | O | O | O | O | O | O | O | X | X | 200 |
| 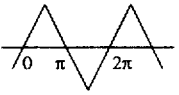 (triangular wave) | O | O | O | O | O | O | O | O | X | X | 230 |
| 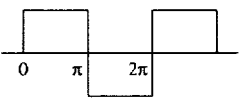 (square wave) | O | O | O | O | O | O | O | O | X | X | 250 |
| 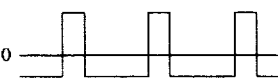 (pulse) | O | O | O | O | O | O | O | O | X | X | 190 |
| 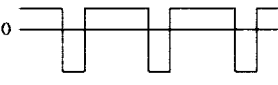 (pulse) | Δ | Δ | Δ | Δ | Δ | Δ | Δ | Δ | X | X | 190 |
| 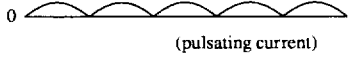 (pulsating current) | O | O | O | O | O | O | O | O | Δ | Δ | 80 |
|  (sine wave) | O | O | O | O | O | O | O | O | Δ | Δ | 220 |

O: good
Δ: practically effective
X: not effective

TABLE 10

| Comparative Experiment No. | Inner Pressure (m Torr) | | | | | | | | |
|---|---|---|---|---|---|---|---|---|---|
| | 0.5 | 1 | 3 | 10 | 30 | 50 | 100 | 200 | 500 |
| 4 | X | Δ*⁾ | O | ⊙ | ⊙ | ⊙ | O | O | Δ**⁾ |
| 5 | X | Δ*⁾ | O | ⊙ | ⊙ | ⊙ | O | O | Δ**⁾ |
| 6 | X | Δ*⁾ | O | ⊙ | ⊙ | ⊙ | O | O | Δ**⁾ |
| 7 | X | Δ*⁾ | O | ⊙ | ⊙ | ⊙ | ⊙ | O | Δ**⁾ |

*⁾ uneven discharge was present.
**⁾ abnormal centralization of discharge was present.

TABLE 11

| Comparative Experiment No. | microwave power (W) | | | | | | |
|---|---|---|---|---|---|---|---|
| | 200 | 300 | 700 | 1000 | 1500 | 3000 | 5000 |
| 8 | X | Δ*⁾ | O | ⊙ | ⊙ | O | Δ**⁾ |
| 9 | X | Δ*⁾ | ⊙ | ⊙ | ⊙ | ⊙ | Δ**⁾ |
| 10 | X | Δ*⁾ | O | ⊙ | ⊙ | O | Δ**⁾ |
| 11 | X | Δ*⁾ | ⊙ | ⊙ | ⊙ | O | Δ**⁾ |

*⁾uneven discharge was present.
**⁾abnormal centralization of discharge was present.

TABLE 12

| Comparative Experiment No. | spacing $L_1$, $L_2$ (cm) | | | | | | | |
|---|---|---|---|---|---|---|---|---|
| | 0.5, 0.5 | 1, 1 | 1, 2.5 | 2, 3 | 3, 3 | 3, 5 | 5, 5 | 8, 8 |
| 12 | O | O | ⊙ | ⊙ | ⊙ | O | Δ**⁾ | X |
| 13 | O | O | ⊙ | ⊙ | ⊙ | O | Δ**⁾ | X |
| 14 | O | O | ⊙ | ⊙ | ⊙ | O | Δ**⁾ | X |
| 15 | O | O | ⊙ | ⊙ | ⊙ | Δ*⁾ | Δ**⁾ | X |

*⁾uneven discharge was present, microwave leakage was somewhat present.
**⁾uneven discharge was present, microwave leakage was large.
Note: spacing $L_1$ and $L_2$ appear in FIG. 7(a) or FIG. 8(a).

TABLE 13

| Comparative experiment No. | spacing $L_3$ (cm) | | | | |
|---|---|---|---|---|---|
| | 3 | 5 | 8 | 10 | 14 |
| 16 | X*⁾ | Δ**⁾ | O | ⊙ | ⊙ |
| 17 | X*⁾ | Δ**⁾ | O | ⊙ | ⊙ |
| 18 | X*⁾ | Δ**⁾ | O | ⊙ | ⊙ |
| 19 | Δ**⁾ | Δ**⁾ | O | ⊙ | ⊙ |

TABLE 13-continued

| Comparative experiment No. | spacing $L_3$ (cm) | | | | |
|---|---|---|---|---|---|
| | 3 | 5 | 8 | 10 | 14 |

*) no discharge.
**) uneven discharge was present.
Note: spacing $L_3$ appears in FIG. 7(a) or FIG. 8(a).

TABLE 14

| Comparative experiment No. | inside diameter of curved portion (cm) | | | | | | |
|---|---|---|---|---|---|---|---|
| | 12 | 16 | 20 | 25 | 30 | 35 | 45 |
| 20 | ⊙ | ⊙ | ⊙ | ⊙ | ○ | Δ*) | Δ*) |
| 21 | ⊙ | ⊙ | ⊙ | ⊙ | ⊙ | ○ | Δ*) |
| 22 | ⊙ | ⊙ | ⊙ | ⊙ | ○ | Δ*) | Δ*) |
| 23 | ⊙ | ⊙ | ⊙ | ⊙ | ○ | ○ | Δ*) |

*) uneven discharge was present.

TABLE 15

| Comparative Experiment No. | inner pressure (m Torr) | | | | | | | | |
|---|---|---|---|---|---|---|---|---|---|
| | 0.5 | 1 | 3 | 10 | 30 | 50 | 100 | 200 | 500 |
| 24 | X | Δ*) | ○ | ⊙ | ⊙ | ⊙ | ⊙ | ○ | Δ**) |
| 25 | X | Δ*) | ⊙ | ⊙ | ⊙ | ⊙ | ⊙ | ○ | Δ**) |
| 26 | X | Δ*) | ○ | ⊙ | ⊙ | ⊙ | ⊙ | ○ | Δ**) |
| 27 | X | Δ*) | ○ | ⊙ | ⊙ | ⊙ | ⊙ | ○ | Δ**) |

*) uneven discharge was present.
**) abnormal centralization of discharge was present.

TABLE 16

| Comparative Experiment No. | microwave power (W) | | | | | | |
|---|---|---|---|---|---|---|---|
| | 200 | 300 | 700 | 1000 | 1500 | 3000 | 5000 |
| 28 | X | Δ*) | ⊙ | ⊙ | ⊙ | ○ | Δ**) |
| 29 | X | Δ*) | ⊙ | ⊙ | ⊙ | ⊙ | Δ**) |
| 30 | X | Δ*) | ⊙ | ⊙ | ⊙ | ○ | Δ**) |
| 31 | X | Δ*) | ⊙ | ⊙ | ⊙ | ○ | Δ**) |

*) uneven discharge was present.
**) abnormal centralization of discharge was present.

TABLE 17

| Comparative Experiment No. | spacing $L_4$ (cm) | | | | | | | |
|---|---|---|---|---|---|---|---|---|
| | 1 | 1.5 | 2 | 3 | 5 | 8 | 10 | 14 |
| 32 | ○ | ⊙ | ⊙ | ⊙ | ⊙ | ○ | Δ**) | X |
| 33 | ○ | ⊙ | ⊙ | ⊙ | ⊙ | ○ | Δ**) | X |
| 34 | ○ | ⊙ | ⊙ | ⊙ | ○ | Δ*) | Δ**) | X |
| 35 | ○ | ⊙ | ⊙ | ⊙ | ⊙ | ○ | Δ**) | X |

*) uneven discharge was present, microwave leakage was present.
**) microwave leakage was large.
Note: spacing $L_4$ appears in FIG. 7(b) or FIG. 8(b).

TABLE 18

| Comparative experiment No. | inside diameter of curved portion (cm) | | | | | | |
|---|---|---|---|---|---|---|---|
| | 16 | 20 | 30 | 45 | 50 | 60 | 70 |
| 36 | ○ | ⊙ | ⊙ | ⊙ | ○ | Δ | Δ*) |
| 37 | ○ | ⊙ | ⊙ | ⊙ | ⊙ | ○ | Δ*) |
| 38 | ○ | ⊙ | ⊙ | ⊙ | ○ | Δ | Δ*) |

TABLE 18-continued

| Comparative experiment No. | inside diameter of curved portion (cm) | | | | | | |
|---|---|---|---|---|---|---|---|
| | 16 | 20 | 30 | 45 | 50 | 60 | 70 |
| 39 | ○ | ⊙ | ⊙ | ⊙ | ○ | ○ | Δ*) |

*) uneven discharge was present.

TABLE 19

| | |
|---|---|
| inside diameter of curved portion | φ 22 cm |
| spacing $L_1$, $L_2$ | 2 cm, 2 cm |
| spacing $L_3$ | 12.5 cm |
| the material and the size of the isolating means | quartz tube (thickness 3 mm) φ 12 cm × 100 cm (inside diameter) |
| the punching board for confining the microwave plasma region | aperture size 10 mm, perforated proportion 40% made of a SUS 316L, applied with a $Al_2O_3$ film to the surface thereof |

Note: spacings $L_1$, $L_2$ and $L_3$ appear in FIG. 7(a) or FIG. 8(a).

TABLE 20

| parameter | isolated vessel 500 | |
|---|---|---|
| film-forming raw material gas and its flow rate (sccm) | $SiH_4$ | 350 |
| | $H_2$ | 100 |
| | $SiF_4$ | 10 |
| inner pressure of the film-forming chamber (m Torr) | 9 | |
| microwave power (k W) | 1.2 | |
| inside diameter of curved portion (cm) | φ 18 | |
| spacing $L_1$, $L_2$ (cm) | 1.5, 1.5 | |
| spacing $L_3$ (cm) | 12.5 | |
| applicator No. | 13 | |
| the material and the size of the isolating means | quartz tube (thickness 3 mm) φ 12 × 100 cm (inside diameter) | |
| the punching board for confining the microwave plasma region | aperture size 5 mm, perforated proportion 45%, SUS316L, applied with a $Al_2O_3$ film to the surface thereof | |

Note: spacings $L_1$, $L_2$ and $L_3$ appear in FIG. 7(a) or FIG. 8(a).

TABLE 21

| parameter | isolated vessel | |
|---|---|---|
| | 500-a | 500-b |
| film-forming raw material gas and its flow rate (sccm) | $SiH_4$ 55 | $SiH_4$ 20 |
| | $H_2$ 100 | $H_2$ 200 |
| | $PH_3/H_2$ 8 (diluted to 1% by $H_2$ gas) | $B_2H_6/H_2$ 10 (diluted to 3000 ppm by $H_2$ gas) |
| | $SiF_4$ 5 | $SiF_4$ 5 |
| inner pressure (m Torr) | 15 | 20 |
| microwave power (k W) | 0.85 | 1.2 |
| inside diameter of curved portion (cm) | φ 12*) | φ 12*) |
| spacing $L_1$, $L_2$ (cm) | 1.0, 1.0 | 1.0, 1.0 |
| spacing $L_3$ (cm) | 10 | 10 |
| applicator No. | 11 | 11 |
| the material and the size of the isolating means | quartz tube (thickness 3 mm) φ 10 cm × 100 cm (inside diameter) | quartz tube (thickness 3 mm) φ 10 cm × 100 cm (inside diameter) |
| the punching board for confining the microwave | aperture size 5 mm, perforated | aperture size 5 mm, |

TABLE 21-continued

| parameter | isolated vessel | |
|---|---|---|
| | 500-a | 500-b |
| plasma region | proportion 45%, made of a SUS 316L, applied with a $Al_2O_3$ film to the surface thereof | perforated proportion 45%, made of a SUS 316L, applied with a $Al_2O_3$ film to the surface thereof |

*) a substrate cover for finely controlling the thickness of a film to be formed was provided in the curved structure.
Note: spacings $L_1$, $L_2$ and $L_3$ appear in FIG. 7(a) or FIG. 8(a).

TABLE 22

| parameter | semiconductor layer | | |
|---|---|---|---|
| | Lower Cell | | |
| | 500-a | 500 | 500-b |
| film-forming raw material gas and its flow rate (sccm) | $SiH_4$ 55<br>$H_2$ 100<br>$PH_3/H_2$ 8<br>(diluted to 1% by $H_2$ gas)<br>$SiF_4$ 5 | $SiH_4$ 160<br>$GeH_4$ 125<br>$H_2$ 30<br>$SiF_4$ 5 | $SiH_4$ 20<br>$H_2$ 200<br>$BF_3/H_2$ 10<br>(diluted to 3000 ppm by $H_2$ gas)<br>$SiF_4$ 5 |
| inner pressure of the film-forming chamber (m Torr) | 14 | 15 | 18 |
| microwave power (k W) | 0.85 | 1.0 | 1.2 |
| inside diameter of curved portion (cm) | φ 12*) | φ 18 | φ 12*) |
| spacing $L_1$, $L_2$ (cm) | 1.0, 1.0 | 1.5, 1.5 | 1.0, 1.0 |
| spacing $L_3$ (cm) | 10 | 12 | 10 |
| applicator No. | 2 | 12 | 2 |
| the material and the size of the isolating means | quartz tube (thickness 3 mm) φ 10 cm × 100 cm (inside diameter) | quartz tube (thickness 3 mm) φ 12 cm × 100 cm (inside diameter) | same as in the case of the 500-a |
| the punching board for confining the microwave plasma region | aperture size 8 mm, perforated proportion 45% made of a SUS 316L, applied with a $Al_2O_3$ film to the surface thereof | | |
| transportation speed | 40 cm/min | | |

| | Upper Cell | | |
|---|---|---|---|
| | 500-a' | 500' | 500-b' |
| film-forming raw material gas and its flow rate (sccm) | $SiH_4$ 52<br>$H_2$ 100<br>$PH_3/H_2$ 7<br>(diluted to 1% by $H_2$ gas)<br>$SiF_4$ 5 | $SiH_4$ 110<br>$H_2$ 30<br>$SiF_4$ 10 | $SiH_4$ 18<br>$H_2$ 200<br>$BF_3/H_2$ 10<br>(diluted to 3000 ppm by $H_2$ gas)<br>$SiF_4$ 4 |
| inner pressure of the film-forming chamber (m Torr) | 15 | 8 | 20 |
| microwave power (k W) | 0.85 | 0.95 | 1.1 |
| inside diameter of curved portion (cm) | φ 12*) | φ 18 | φ 12*) |
| spacing $L_1$, $L_2$ (cm) | 1.0, 1.0 | 1.5, 1.5 | 1.0, 1.0 |
| spacing $L_3$ (cm) | 10 | 12 | 10 |
| applicator No. | 10 | 12 | 10 |
| the material and the size of the isolating means | same as in the case of the 500-a | same as in the case of the 500 | same as in the case of the 500-a |
| the punching board for confining the microwave plasma region | aperture size 8 mm, perforated proportion 45% made of a SUS 316L, applied with a $Al_2O_3$ film to the surface thereof | | |
| transportation speed | 40 cm/min | | |

*) a substrate cover for finely controlling the thickness of a film to be formed was provided in the curved structure.
Note: spacings $L_1$, $L_2$ and $L_3$ appear in FIG. 7(a) or FIG. 8(a).

TABLE 23

| parameter | semiconductor layer Lower Cell | | |
|---|---|---|---|
| | 500-a | 500 | 500-b |
| film-forming raw material gas and its flow rate (sccm) | $SiH_4$ 55<br>$H_2$ 100<br>$PH_3/H_2$ 8<br>(diluted to 1% by $H_2$ gas)<br>$SiF_4$ 5 | $SiH_4$ 130<br>$H_2$ 35<br>$SiF_4$ 10 | $SiH_4$ 20<br>$H_2$ 200<br>$BF_3/H_2$ 10<br>(diluted to 3000 ppm by $H_2$ gas)<br>$SiF_4$ 5 |
| inner pressure of the film-forming chamber (m Torr) | 14 | 8 | 18 |
| microwave power (k W) | 0.85 | 1.0 | 1.2 |
| inside diameter of curved portion (cm) | φ 12*) | φ 18 | φ 12*) |
| spacing $L_1$, $L_2$ (cm) | 1.0, 1.0 | 1.5, 1.5 | 1.0, 1.0 |
| spacing $L_3$ (cm) | 10 | 12 | 10 |

TABLE 23-continued

| | | | |
|---|---|---|---|
| applicator No. | 2 | 13 | 2 |
| the material and the size of the isolating means | quartz tube (thickness 3 mm) φ 10 cm × 100 cm (inside diamter) | quartz tube (thickness 3 mm) φ 12 cm × 100 cm (inside diameter) | same as in the case of the 500-a |
| the punching board for confining the microwave plasma region | aperture size 5 mm, perforated proportion 45% made of a SUS 316L, applied with a $Al_2O_3$ film to the surface thereof | | |
| transportation speed | 42 cm/min | | |

| | semiconductor layer Upper Cell | | |
|---|---|---|---|
| parameter | 500-a' | 500' | 500-b' |
| film-forming raw material gas and its flow rate (sccm) | $SiH_4$ 52<br>$H_2$ 90<br>$PH_3/H_2$ 7<br>(diluted to 1% by $H_2$ gas)<br>$SiF_4$ 4 | $SiH_4$ 260<br>$CH_4$ 36<br>$H_2$ 50<br>$SiF_4$ 5 | $SiH_4$ 18<br>$H_2$ 220<br>$BF_3/H_2$ 10<br>(diluted to 3000 ppm by $H_2$ gas)<br>$SiF_4$ 5 |
| inner pressure of the film-forming chamber (m Torr) | 15 | 24 | 20 |
| microwave power (k W) | 0.85 | 1.8 | 1.15 |
| inside diameter of curved portion (cm) | φ 12*) | φ 18 | φ 12*) |
| spacing $L_1$, $L_2$ (cm) | 1.0, 1.0 | 1.5, 1.5 | 1.0, 1.0 |
| spacing $L_3$ (cm) | 10 | 12 | 10 |
| applicator No. | 2 | 13 | 2 |
| the material and the size of the isolating means | same as in the case of the 500-a | same as in the case of the 500 | same as in the case of the 500-a |
| the punching board for confining the microwave plasma region | aperture size 5 mm, perforated proportion 45% made of a SUS 316L, applied with a $Al_2O_3$ film to the surface thereof | | |
| transportation speed | 42 cm/min | | |

*) a substrate cover for finely controlling the thickness of a film to be formed was provided in the curved structure.
Note:
spacings $L_1$, $L_2$ and $L_3$ appear in FIG. 7(a) or FIG. 8(a).

TABLE 24

| | semiconductor layer Lower Cell | | |
|---|---|---|---|
| parameter | 500-a | 500 | 500-b |
| film-forming raw material gas and its flow rate (sccm) | $SiH_4$ 55<br>$H_2$ 100<br>$PH_3/H_2$ 8<br>(diluted to 1% by $H_2$ gas)<br>$SiF_4$ 5 | $SiH_4$ 165<br>$GeH_4$ 130<br>$H_2$ 35<br>$SiF_4$ 6 | $SiH_4$ 20<br>$H_2$ 200<br>$BF_3/H_2$ 10<br>(diluted to 3000 ppm by $H_2$ gas)<br>$SiF_4$ 5 |
| inner pressure of the film-forming chamber (m Torr) | 14 | 15 | 18 |
| microwave power (k W) | 0.85 | 1.0 | 1.2 |
| inside diameter of curved portion (cm) | φ 12*) | φ 18 | φ 12*) |
| spacing $L_1$, $L_2$ (cm) | 1.0, 1.0 | 1.5, 1.5 | 1.0, 1.0 |
| spacing $L_3$ (cm) | 10 | 12 | 10 |
| applicator No. | 2 | 19 | 2 |
| the material and | quartz tube | quartz tube | same as in the case |

TABLE 24-continued

| | | | |
|---|---|---|---|
| the size of the isolating means | (thickness 3 mm) φ 10 cm × 100 cm (inside diameter) | (thickness 3 mm) φ 12 cm × 100 cm (inside diameter) | of the 500-a |
| the punching board for confining the microwave plasma region | aperture size 5 mm, perforated proportion 45% made of a SUS 316L, applied with a $Al_2O_3$ film to the surface thereof | | |
| transportation speed | 41 cm/min | | |

| | semiconductor layer Middle Cell | | |
|---|---|---|---|
| parameter | 500-a' | 500' | 500-b' |
| film-forming raw material gas and its flow rate (sccm) | $SiH_4$ 52<br>$H_2$ 100<br>$PH_3/H_2$ 7<br>(diluted to 1% by $H_2$ gas)<br>$SiF_4$ 5 | $SiH_4$ 135<br>$H_2$ 40<br>$SiF_4$ 10 | $SiH_4$ 18<br>$H_2$ 200<br>$BF_3/H_2$ 10<br>(diluted to 3000 ppm by $H_2$ gas)<br>$SiF_4$ 4 |
| inner pressure of the film-forming chamber (m Torr) | 15 | 8 | 18 |
| microwave power (k W) | 0.85 | 0.95 | 1.05 |
| inside diameter of curved portion (cm) | φ 12*) | φ 18 | φ 12*) |
| spacing $L_1$, $L_2$ (cm) | 1.0, 1.0 | 1.5, 1.5 | 1.0, 1.0 |
| spacing $L_3$ (cm) | 10 | 12 | 10 |
| applicator No. | 16 | 13 | 16 |
| the material and the size of the isolating means | same as in the case of the 500-a | same as in the case of the 500 | same as in the case of the 500-a |
| the punching board for confining the microwave plasma region | aperture size 5 mm, perforated proportion 45% made of a SUS 316L, applied with a $Al_2O_3$ film to the surface thereof | | |
| transportation speed | 41 cm/min | | |

| | semiconductor layer Upper Cell | | |
|---|---|---|---|
| parameter | 500-a" | 500" | 500-b" |
| film-forming raw material gas and its flow rate (sccm) | $SiH_4$ 52<br>$H_2$ 100<br>$PH_3/H_2$ 7<br>(diluted to 1% by $H_2$ gas)<br>$SiF_4$ 4 | $SiH_4$ 260<br>$CH_4$ 35<br>$H_2$ 50<br>$SiF_4$ 4 | $SiH_4$ 18<br>$H_2$ 220<br>$BF_3/H_2$ 10<br>(diluted to 3000 ppm by $H_2$ gas)<br>$SiF_4$ 5 |
| inner pressure of the film-forming chamber (m Torr) | 14 | 24 | 20 |
| microwave power | 0.85 | 1.8 | 1.15 |
| inside diameter of curved portion (cm) | φ 12*) | φ 18 | φ 12*) |
| spacing $L_1$, $L_2$ (cm) | 1.0, 1.0 | 1.5, 1.5 | 1.0, 1.0 |
| spacing $L_3$ (cm) | 10 | 12 | 10 |
| applicator No. | 3 | 13 | 3 |
| the material and the size of the isolating means | same as in the case of the 500-a | same as in the case of the 500 | same as in the case of the 500-a |
| the punching board for confining the microwave plasma region | aperture size 5 mm, perforated proportion 45% made of a SUS 316L, applied with a $Al_2O_3$ film to the surface thereof | | |
| transportation speed | 41 cm/min | | |

*) a substrate cover for finely controlling the thickness of a film to be formed was provided in the curved structure.

TABLE 24-continued

Note:
spacings $L_1$, $L_2$ and $L_3$ appear in FIG. 7(a) or FIG. 8(a).

TABLE 25

| | |
|---|---|
| inside diameter of curved portion | φ 25 cm |
| spacing $L_1$, $L_2$ | 2 cm, 2 cm |
| spacing $L_3$ | 12.5 cm |
| the material and the size of the isolating means | quartz tube (thickness 3 mm) φ 12 cm × 100 cm (inside diameter) |
| the punching board for | aperture size 10 mm, perforated |
| confining the microwave plasma region | proportion 40% made of a SUS 316L, applied with a $Al_2O_3$ film to the surface thereof |

Note:
spacings $L_1$, $L_2$ and $L_3$ appear in FIG. 7(a) or FIG. 8(a).

TABLE 26

| Production Example No. | Bias Voltage wave form | Bias Voltage frequency (Hz) | Bias Voltage maximum amplitude voltage ($V_{p-p}$) | film-forming conditions (other than the bias voltage) | the manner of applying a bias voltage | evaluated results |
|---|---|---|---|---|---|---|
| 20 | triangular wave | 5K | 190 | same as in the case of Production Example 14 | the manner shown in FIG. 19(b) | a few abnormal growth, excellent characteristics |
| 21 | pulse | 500 | 150 (reference voltage −30 V) | same as in the case of Production Example 15 | the manner shown in FIG. 19(c) | a few abnormal growth, excellent characteristics |
| 22 | sine wave | 2K | 220 | same as in the case of Production Example 16 | the manner shown in FIG. 19(a) | a few abnormal growth, excellent characteristics |
| 23 | pulsating current | 100 | 70 | same as in the case of Production Example 17 | the manner shown in FIG. 19(c) | excellent characteristics |
| 24 | sine wave | 10K | 140 (reference voltage 0V) | same as in the case of Production Example 18 | the manner shown in FIG. 19(b) | a few abnormal growth, excellent characteristics |

Note:
a nickel bar was used as the bias bar.

TABLE 27

| Production Example No. | Bias Voltage wave form | Bias Voltage frequency (Hz) | Bias Voltage maximum amplitude voltage ($V_{p-p}$) | film-forming conditions (other than the bias voltage) | the manner of applying a bias voltage | evaluated results |
|---|---|---|---|---|---|---|
| 25 | pulse | 1.5K | 160 (reference voltage −30 V) | same as in the case of Production Example 14 | the manner shown in FIG. 19(d) | a few abnormal growth, excellent characteristics |
| 26 | triangular wave | 1K | 180 | same as in the case of Production Example 15 | the manner shown in FIG. 19(d) | a few abnormal growth, excellent characteristics |
| 27 | pulsating current | 500 | 80 | same as in the case of Production Example 16 | the manner shown in FIG. 19(d) | excellent characteristics |

TABLE 27-continued

| Production Example No. | Bias Voltage | | | film-forming | | |
|---|---|---|---|---|---|---|
| | wave form | frequency (Hz) | maximum amplitude voltage ($V_{p-p}$) | conditions (other than the bias voltage) | the manner of applying a bias voltage | evaluated results |
| 28 | sine wave | 900 | 200 | same as in the case of Production Example 17 | the manner shown in FIG. 19(d) | a few abnormal growth, excellent characteristics |
| 29 | square wave | 3K | 200 | same as in the case of Production Example 18 | the manner shown in FIG. 19(d) | a few abnormal growth, excellent characteristics |

Note:
a nickel bar was used as the bias bar

TABLE 28

| semiconductor layer parameter | 600 | |
|---|---|---|
| film-forming raw material gas and its flow rate (sccm) | $SiH_4$ | 360 |
| | $H_2$ | 110 |
| | $SiF_4$ | 10 |
| inner pressure of the film-forming chamber (m Torr) | 8.5 | |
| microwave power (k W) | 1.1 | |
| inside diameter of curved portion (cm) | $\phi$ 20 | |
| spacing $L_1$, $L_2$ (cm) | 1.5, 1.5 | |
| spacing $L_3$ (cm) | 12.5 | |
| applicator No. | 13 | |
| the material and the size of the isolating means | quartz tube (thickness 3 mm) $\phi$ 12 × 100 cm (inside diameter) | |
| the punching board for confining the microwave plasma region | aperture size 5 mm, perforated proportion 45%, SUS316L, applied with a $Al_2O_3$ film to the surface thereof | |
| bias voltage | triangular wave, 1 kHz 200 $V_{p\,p}$ | |

Note:
(1) as the bias voltage applying means, one shown in FIG. 19(b) was used.
(2) spacings $L_1$, $L_2$ and $L_3$ appear in FIG. 7(a) or FIG. 8(a).

TABLE 29

| semiconductor layer parameter | 600-a | | 600-b | |
|---|---|---|---|---|
| film-forming raw material gas and its flow rate (sccm) | $SiH_4$ | 60 | $SiH_4$ | 22 |
| | $H_2$ | 100 | $H_2$ | 200 |
| | $PH_3/H_2$ | 10 | $B_2H_6/H_2$ | 11 |
| | (diluted to 1% by $H_2$ gas) | | (diluted to 3000 ppm by $H_2$ gas) | |
| | $SiF_4$ | 5 | $SiF_4$ | 5 |
| inner pressure of the film-forming chamber (m Torr) | 14 | | 19 | |
| microwave power (k W) | 0.8 | | 1.1 | |
| inside diameter of curved portion (cm) | $\phi$ 13*) | | $\phi$ 13*) | |
| spacing $L_1$, $L_2$ (cm) | 1.0, 1.0 | | 1.0, 1.0 | |
| spacing $L_3$ (cm) | 10 | | 10 | |
| applictor No. | 11 | | 11 | |
| the material and the size of the isolating means | quartz tube (thickness 3 mm) $\phi$ 10 cm × 100 cm (inside diameter) | | quartz tube (thickness 3 mm) $\phi$ 10 cm × 100 cm (inside diamter) | |
| the punching board for confining the microwave plasma region | aperture size 5 mm, perforated proportion 45% made of a SUS 316L, applied with a $Al_2O_3$ film to the surface thereof | | aperture size 5 mm, perforated proportion 45% made of a SUS 316L, aplied with a $Al_2O_3$ film to the surface thereof | |

TABLE 29-continued

| DC bias voltage | 90 V/7.1 A | 95 V/8.2 A |
|---|---|---|

*) a substrate cover for finely controlling the thickness of a film to be formed was provided in the curved structure.
Note:
spacings $L_1$, $L_2$ and $L_3$ appear in FIG. 7(a) or FIG. 8(a).

TABLE 30

| semiconductor layer | Lower Cell | | | | | |
|---|---|---|---|---|---|---|
| parameter | 600-a | | 600 | | 600-b | |
| film-forming raw material gas and its flow rate (sccm) | $SiH_4$ | 58 | $SiH_4$ | 175 | $SiH_4$ | 24 |
| | $H_2$ | 100 | $GeH_4$ | 135 | $H_2$ | 200 |
| | $PH_3/H_2$ | 8 | $H_2$ | 40 | $BF_3/H_2$ | 10 |
| | (diluted to 1% by $H_2$ gas) | | $SiF_4$ | 5 | (diluted to 3000 ppm by $H_2$ gas) | |
| | $SiF_4$ | 5 | | | $SiF_4$ | 5 |
| inner pressure of the film-forming chamber (m Torr) | 14 | | 15 | | 18 | |
| microwave power (k W) | 0.82 | | 0.95 | | 1.1 | |
| inside diameter of curved portion (cm) | φ 13*) | | φ 20 | | φ 13*) | |
| spacing $L_1$, $L_2$ (cm) | 1.0, 1.0 | | 1.5, 1.5 | | 1.0, 1.0 | |
| spacing $L_3$ (cm) | 10 | | 12 | | 10 | |
| applicator No. | 2 | | 12 | | 2 | |
| the material and the size of the isolating means | quartz tube (thickness 3 mm) φ 10 cm × 100 cm (inside diamter) | | quartz tube (thickness 3 mm) φ 12 cm × 100 cm (inside diameter) | | same as in the case of the 600-a | |
| the punching board for confining the microwave plasma region | aperture size 5 mm, perforated proportion 45% made of a SUS 316L, applied with a $Al_2O_3$ film to the surface thereof | | | | | |
| surface temperature of the substrate web (°C.) | 260 | | 260 | | 250 | |
| bias voltage transportation speed | DC, 90 V/6.9 A | | DC, 60 V/7.5 A 43 cm/min | | DC, 120 V/8.0 A | |

| semiconductor layer | Upper Cell | | | | | |
|---|---|---|---|---|---|---|
| parameter | 600-a' | | 600' | | 600-b' | |
| film-forming raw material gas and its flow rate (sccm) | $SiH_4$ | 56 | $SiH_4$ | 160 | $SiH_4$ | 20 |
| | $H_2$ | 100 | $H_2$ | 45 | $H_2$ | 200 |
| | $PH_3/H_2$ | 7 | $SiF_4$ | 10 | $BF_3/H_2$ | 10 |
| | (diluted to 1% by $H_2$ gas) | | | | (diluted to 3000 ppm by $H_2$ gas) | |
| | $SiF_4$ | 5 | | | $SiF_4$ | 4 |
| inner pressure of the film-forming chamber (m Torr) | 15 | | 8 | | 20 | |
| microwave power (k W) | 0.82 | | 0.92 | | 1.05 | |
| inside diameter of curved portion (cm) | φ 13*) | | φ 20 | | φ 13*) | |
| spacing $L_1$, $L_2$ (cm) | 1.0, 1.0 | | 1.5, 1.5 | | 1.0, 1.0 | |
| spacing $L_3$ (cm) | 10 | | 12 | | 10 | |
| applicator No. | 10 | | 12 | | 10 | |
| the material and the size of the isolating means | same as in the case (of the 600-a | | same as in the case of the 600 | | same as in the case of the 600-a | |
| the punching board for confining the microwave plasma region | aperture size 5 mm, perforated proportion 45% made of a SUS 316L, applied with a $Al_2O_3$ film to the surface thereof | | | | | |
| surface temperature of the substrate web (°C.) | 250 | | 240 | | 240 | |

TABLE 30-continued

| | | | |
|---|---|---|---|
| bias voltage | DC, 90 V/6.9 A | 700 Hz sine wave 180 $V_{p\cdot p}$ | DC, 120 V/7.9 A |
| transportation speed | | 43 cm/min | |

*) a substrate cover for finely controlling the thickness of a film to be formed was provided in the curved structure.
Note:
spacings $L_1$, $L_2$ and $L_3$ appear in FIG. 7(a) or FIG. 8(a).

TABLE 31

| semiconductor layer | Lower Cell | | | | | |
|---|---|---|---|---|---|---|
| parameter | 600-a | | 600 | | 600-b | |
| film-forming raw material gas and its flow rate (sccm) | $SiH_4$ $H_2$ $PH_3/H_2$ (diluted to 1% by $H_2$ gas) $SiF_4$ | 50 100 8 5 | $SiH_4$ $H_2$ $SiF_4$ | 270 45 10 | $SiH_4$ $H_2$ $BF_3/H_2$ (diluted to 3000 ppm by $H_2$ gas) $SiF_4$ | 18 200 10 5 |
| inner pressure of the film-forming chamber (in Torr) | 13 | | 7.5 | | 17 | |
| microwave power (k W) | 0.82 | | 0.95 | | 1.1 | |
| inside diameter of curved portion (cm) | ⌀ 13*) | | ⌀ 20 | | ⌀ 13*) | |
| spacing $L_1$, $L_2$ (cm) | 1.0, 1.0 | | 1.5, 1.5 | | 1.0, 1.0 | |
| spacing $L_3$ (cm) | 10 | | 12 | | 10 | |
| applicator No. | 2 | | 13 | | 2 | |
| the material and the size of the isolating means | quartz tube (thickness 3 mm) ⌀ 10 cm × 100 cm (inside diameter) | | quartz tube (thickness 3 mm) ⌀ 12 cm × 100 cm (inside diameter) | | same as in the case of the 600-a | |
| the punching board for confining the microwave plasma region | aperture size 5 mm, perforated proportion 45% made of a SUS 316L, applied with a $Al_2O_3$ film to the surface thereof | | | | | |
| surface temperature of the substrate web (°C.) | 260 | | 260 | | 250 | |
| bias voltage | DC, 90 V/6.9 A | | 800 Hz square wave 190 $V_{p\,p}$ | | DC, 120 V/8.1 A | |
| transportation speed | | | 40 cm/min | | | |

| semiconductor layer | Upper Cell | | | | | |
|---|---|---|---|---|---|---|
| parameter | 600-a' | | 600' | | 600-b' | |
| film-forming raw material gas and its flow rate (sccm) | $SiH_4$ $H_2$ $PH_3/H_2$ (diluted to 1% by $H_2$ gas) $SiF_4$ | 48 90 7 4 | $SiH_4$ $CH_4$ $H_2$ $SiF_4$ | 270 38 50 5 | $SiH_4$ $H_2$ $BF_3/H_2$ (diluted to 3000 ppm by $H_2$ gas) $SiF_4$ | 17 230 10 5 |
| inner pressure of the film-forming chamber (in Torr) | 14 | | 23 | | 19 | |
| microwave power (k W) | 0.82 | | 1.7 | | 1.12 | |
| inside diameter of curved portion (cm) | ⌀ 13*) | | ⌀ 20 | | ⌀ 13*) | |
| spacing $L_1$, $L_2$ (cm) | 1.0, 1.0 | | 1.5, 1.5 | | 1.0, 1.0 | |
| spacing $L_3$ (cm) | 10 | | 12 | | 10 | |
| applicator No. | 2 | | 12 | | 2 | |
| the material and the size of the isolating means | same as in the case of the 600-a | | same as in the case of the 600 | | same as in the case of the 600-a | |
| the punching board | aperture size 5 mm, perforated proportion 45% made of a SUS | | | | | |

TABLE 31-continued

| | | | |
|---|---|---|---|
| for confining the microwave plasma region | 316L, applied with a $Al_2O_3$ film to the surface thereof | | |
| surface temperature of the substrate web (°C.) | 250 | 240 | 240 |
| bias voltage | DC, 90 V/6.9 A | 1.5 MHz pulse 140 $V_{p\,p}$ (reference voltage 0V) | DC, 120 V/8.0 A |
| transportation speed | | 40 cm/min | |

*) a substrate cover for finely controlling the thickness of a film to be formed was provided in the curved structure.
Note:
spacings $L_1$, $L_2$ and $L_3$ appear in FIG. 7(a) or FIG. 8(a).

TABLE 32

| semiconductor layer | Lower Cell | | | | | |
|---|---|---|---|---|---|---|
| parameter | 600-a | | 600 | | 600-b | |
| film-forming raw material gas and its flow rate (sccm) | $SiH_4$ $H_2$ $PH_3/H_2$ (diluted to 1% by $H_2$ gas) $SiF_4$ | 58 100 8 5 | $SiH_4$ $GeH_4$ $H_2$ $SiF_4$ | 170 140 35 6 | $SiH_4$ $H_2$ $BF_3/H_2$ (diluted to 3000 ppm by $H_2$ gas) $SiF_4$ | 22 200 10 5 |
| inner pressure of the film-forming chamber (m Torr) | 13 | | 14 | | 17 | |
| microwave power (k W) | 0.82 | | 0.95 | | 1.1 | |
| inside diameter of curved portion (cm) | ⌀ 12*) | | ⌀ 19 | | ⌀ 12*) | |
| spacing $L_1$, $L_2$ (cm) | 1.0, 1.0 | | 1.5, 1.5 | | 1.0, 1.0 | |
| spacing $L_3$ (cm) | 10 | | 12 | | 10 | |
| applicator No. | 2 | | 19 | | 2 | |
| the material and the size of the isolating means | quartz tube (thickness 3 mm) ⌀ 10 cm × 100 cm (inside diameter) | | quartz tube (thickness 3 mm) ⌀ 12 cm × 100 cm (inside diameter) | | same as in the case of the 600-a | |
| the punching board for confining the microwave plasma region | aperture size 5 mm, perforated proportion 45% made of a SUS 316L, applied with a $Al_2O_3$ film to the surface thereof | | | | | |
| surface temperature of the substrate web (°C.) | 280 | | 270 | | 270 | |
| bias voltage | 500 Hz pulse 200 $V_{p\,p}$ (reference voltage −30 V) | | DC, 60 V/7.2 A | | DC, 120 V/7.9 A | |
| transportation speed | | | 43 cm/min | | | |

| semiconductor layer | Lower Cell | | | | | |
|---|---|---|---|---|---|---|
| parameter | 600-a | | 600 | | 600-b | |
| film-forming raw material gas and flow rate (sccm) | $SiH_4$ $H_2$ $PH_3/H_2$ (diluted to 1% by Hz gas) $SiF_4$ | 50 100 8 5 | $SiH_4$ $H_2$ $SiF_4$ | 270 45 10 | $SiH_4$ $H_2$ $BF_3/H_2$ (diluted to 3000 ppm by $H_2$ gas) $SiF_4$ | 18 200 10 5 |
| inner pressure of the film-forming chamber (in Torr) | 13 | | 7.5 | | 17 | |
| microwave power (k W) | 0.82 | | 0.95 | | 1.1 | |
| inside diameter of curved portion | ⌀ 13*) | | ⌀ 20 | | ⌀ 13*) | |

TABLE 32-continued

| (cm) | | | |
|---|---|---|---|
| spacing $L_1$, $L_2$ (cm) | 1.0, 1.0 | 1.5, 1.5 | 1.0, 1.0 |
| spacing $L_3$ (cm) | 10 | 12 | 10 |
| applicator No. | 2 | 13 | 2 |
| the material and the size of the isolating means | quartz tube (thickness 3 mm) ⌀10 cm × 100 cm (inside diameter) | quartz tube (thickness 3 mm) ⌀12 cm × 100 cm (inside diameter) | same as in the case of the 600-a |
| the punching board for confining the microwave plasma region | aperture size 5 mm, perforated proportion 45% made of a SUS 316L, applied with a $Al_2O_3$ film to the surface thereof | | |
| surface temperature of the substrate web (°C.) | 280 | 270 | 270 |
| bias voltage | 500 Hz pulse 200 $V_{p-p}$ (reference voltage −30 V) | DC, 60 V/7.2 A | DC, 120 V/7.9 A |
| transportation speed | | 40 cm/min | |

| semiconductor layer | Middle Cell | | |
|---|---|---|---|
| parameter | 600-a' | 600' | 600-b' |
| film-forming raw material gas and its flow rate (sccm) | SiH₄  50<br>H₂  100<br>PH₃/H₂  7<br>(diluted to 1% by H₂ gas)<br>SiF₄  5 | SiH₄  280<br>H₂  80<br>SiF₄  10 | SiH₄  20<br>H₂  200<br>BF₃/H₂  10<br>(diluted to 3000 ppm by H₂ gas)<br>SiF₄  4 |
| inner pressure of the film-forming chamber (m Torr) | 14 | 7.5 | 17 |
| microwave power (k W) | 0.82 | 0.92 | 1.0 |
| inside diameter of curved portion (cm) | ⌀12*) | ⌀19 | ⌀12*) |
| spacing $L_1$, $L_2$ (cm) | 1.0, 1.0 | 1.5, 1.5 | 1.0, 1.0 |
| spacing $L_3$ (cm) | 10 | 12 | 10 |
| applicator No. | 16 | 13 | 16 |
| the material and the size of the isolating means | same as in the case of the 600-a | same as in the case of the 600 | same as in the case of the 600-a |
| the punching board for confining the microwave plasma region | aperture size 5 mm, perforated proportion 45% made of a SUS 316L, applied with a $Al_2O_3$ film to the surface thereof | | |
| surface temperature of the substrate web (°C.) | 260 | 260 | 250 |
| bias voltage | 500 Hz pulse 200 $V_{p-p}$ (reference voltage −30 V) | DC, 90 V/7.8 A | 900 HZ square wave 170 $V_{p\,p}$ |
| transportation speed | | 43 cm/min | |

| semiconductor layer | Upper Cell | | |
|---|---|---|---|
| parameter | 600-a" | 600" | 600-b" |
| film-forming raw material gas and its flow rate (sccm) | SiH₄  54<br>H₂  100<br>PH₃/H₂  7<br>(diluted to 1% by H₂ gas)<br>SiF₄  4 | SiH₄  270<br>CH₄  40<br>H₂  50<br>SiF₄  4 | SiH₄  20<br>H₂  220<br>BF₃/H₂  10<br>(diluted to 3000 ppm by H₂ gas)<br>SiF₄  5 |
| inner pressure of the film-forming chamber (in Torr) | 13 | 23 | 19 |
| microwave power (k W) | 0.82 | 1.7 | 1.1 |
| inside diameter of curved portion | ⌀12*) | ⌀19 | ⌀12*) |

TABLE 32-continued

| (cm) | | | |
|---|---|---|---|
| spacing L₁, L₂ (cm) | 1.0, 1.0 | 1.5, 1.5 | 1.0, 1.0 |
| spacing L₃ (cm) | 10 | 12 | 10 |
| applicator No. | 3 | 13 | 3 |
| the material and the size of the isolating means | same as in the case of the 600-a | same as in the case of the 600 | same as in the case of the 600-a |
| the punching board for confining the microwave plasma region | aperture size 5 mm, perforated proportion 45% made of a SUS 316L, applied with a Al₂O₃ film to the surface thereof | | |
| surface temperature of the substrate web (°C.) | 250 | 240 | 240 |
| bias voltage | DC, 90 V/6.9 A | 1 MHz sine wave 180 $V_{p-p}$ | 1.5 MHz pulse 170 $V_{p-p}$ (reference voltage −10 V) |
| transportation speed | | 43 cm/min | |

*) a substrate cover for finely controlling the thickness of a film to be formed was provided in the curved structure.
Note:
spacings L₁, L₂ and L₃ appear in FIG. 7(a) or FIG. 8(a).

What we claim is:

1. A microwave plasma CVD apparatus suitable for continuously forming a large area and lengthy functional deposited film, said apparatus comprising:

a substantially enclosed columnar film-forming chamber having a curved circumferential wall formed by curving and projecting a substrate web as the substrate web is moving in the longitudinal direction from a pay-out mechanism to a take-up mechanism by a pair of supporting and curving means capable of transporting the substrate web while supporting and curving the substrate web, said film-forming chamber having a film-forming space, said pair of supporting and curving means being arranged while leaving a predetermined space between said pair of supporting and curving means in the longitudinal direction;

a pair of transporting means capable of transporting the substrate web while supporting the substrate web, each of said pair of supporting means being arranged to support one of the side end portions of the curved circumferential wall so as to maintain the columnar shape of said curved circumferential wall;

microwave applicator means disposed under said space between said pair of supporting and curving means while leaving a space having a crosswise width of less than ¼ of one wavelength of a microwave used between each of said pair of supporting and curving means and the exterior of said microwave applicator means, said microwave applicator means being encapsulated in an isolating means made of a microwave transmissive material, said microwave applicator means being capable of radiating or propagating microwave energy into said film-forming space with a directivity substantially only in one direction perpendicular to the direction of microwave propagation to generate microwave plasma in the film-forming space;

means for evacuating the inside of said film-forming chamber;

means for introducing a film-forming raw material gas into said film-forming chamber; and means for heating or cooling said substrate web.

2. The apparatus according to claim 1 which further comprises means for applying a bias voltage into the film-forming chamber.

3. The apparatus according to claim 1, wherein the microwave applicator means is arranged in the film-forming space in parallel to the curved circumferential wall in the width direction thereof.

4. The apparatus according to claim 3 which further comprises means for applying a bias voltage into the film-forming chamber.

5. The apparatus according to claim 1, wherein said microwave applicator means is arranged under the pair of supporting and curving means and in vicinity to the spacing.

6. The apparatus according to claim 5 which further comprises means for applying a bias voltage into the film-forming chamber.

7. A microwave plasma CVD apparatus suitable for continuously forming a large area and lengthy functional deposited film, said apparatus comprising:

a substantially enclosed columnar film-forming chamber having a curved circumferential wall formed by curving and projecting a substrate web as the substrate web is moving in the longitudinal direction from a pay-out mechanism to a take-up mechanism by a pair of supporting and curving means capable of transporting the substrate web while supporting and curving the substrate web, said film-forming chamber having a film-forming space, said pair of supporting and curving means being arranged while leaving a predetermined space between the pair of supporting and curving means in the longitudinal direction;

a pair of transporting means capable of transporting the substrate web while supporting the substrate web, each of said pair of supporting means being arranged to support one of the side end portions of the curved circumferential wall so as to maintain the columnar shape of said curved circumferential wall;

microwave applicator means disposed under said space between said pair of supporting and curving means while leaving a space having a crosswise width of less than ¼ of one wavelength of a microwave used between each of said pair of supporting and curving means and the exterior of said microwave applicator means, said microwave applicator means being encapsulated in an isolating means made of a microwave transmissive material, said microwave applicator means being capable of radiating or propagating evanescent microwave into the film-forming space with a directivity substantially only in one direction perpendicular to the direction of microwave propagation to generate microwave plasma in the film-forming space;

means for evacuating the inside of said film-forming chamber;

means for introducing-a film-forming raw material gas into said film-forming chamber; and means for heating or cooling the substrate web.

8. The apparatus according to claim 7 which further comprises means for applying a bias voltage into the film-forming chamber.

9. The apparatus according to claim 1, wherein the pair of supporting curving means comprise a pair of rollers.

10. The apparatus according to claim 1, wherein the pair of transporting means comprise a pair of rotary rings.

11. The apparatus according to claim 7, wherein the pair of supporting curving means comprise a pair of rollers.

12. The apparatus according to claim 7, wherein the pair of transporting means comprise a pair of rotary rings.

* * * * *

UNITED STATES PATENT AND TRADEMARK OFFICE
CERTIFICATE OF CORRECTION

PATENT NO. : 5,520,740

DATED : May 28, 1996

INVENTORS : MASAHIRO KANAI ET AL.

It is certified that error appears in the above-identified patent and that said Letters Patent is hereby corrected as shown below:

COLUMN 1

Line 39, "or" should read --of--.

COLUMN 3

Line 24, "whereby" should read --thereby--.

COLUMN 8

Line 40, "a high" should read --a desirable high--.

COLUMN 12

Line 67, "comprise" should read --comprises--.

UNITED STATES PATENT AND TRADEMARK OFFICE
CERTIFICATE OF CORRECTION

PATENT NO. : 5,520,740

DATED : May 28, 1996

INVENTORS : MASAHIRO KANAI ET AL.

It is certified that error appears in the above-identified patent and that said Letters Patent is hereby corrected as shown below:

COLUMN 13

Line 23, "providing" should read --provided--.

COLUMN 16

Line 25, "cf" should read --of--.

COLUMN 18

Line 8, "in-thickness" should read --in thickness--.

COLUMN 19

Line 2, "these" should read --those--.

COLUMN 20

Line 42, "lowered" should read --lowered,--.

UNITED STATES PATENT AND TRADEMARK OFFICE
CERTIFICATE OF CORRECTION

PATENT NO. : 5,520,740

DATED : May 28, 1996

INVENTORS : MASAHIRO KANAI ET AL.

Page 3 of 7

It is certified that error appears in the above-identified patent and that said Letters Patent is hereby corrected as shown below:

COLUMN 21

Line 17, "deference" should read --difference--;
Line 39, "non" should read --not--.

COLUMN 30

Line 44, "by supportingly curving and" should be deleted;
Line 45, "projecting said substrate web" should be deleted.

COLUMN 37

Line 22, "as" should read --is--.

COLUMN 39

Line 7, "am" should read --at--;
Line 8, "in" should read --it--.

COLUMN 41

Line 52, "to" should read --is to be--.

UNITED STATES PATENT AND TRADEMARK OFFICE
CERTIFICATE OF CORRECTION

PATENT NO. : 5,520,740

DATED : May 28, 1996

INVENTORS : MASAHIRO KANAI ET AL.

It is certified that error appears in the above-identified patent and that said Letters Patent is hereby corrected as shown below:

COLUMN 42

Line 66, "shown" should read --shown in--.

COLUMN 43

Line 45, "U" should be deleted;
Line 46, "mOn" should read --upon--.

COLUMN 44

Line 17, "making-up" should read --taking up--;
Line 49, "gastight" should read --gas-tight--;
Line 61, "atmospheric." should read --the atmosphere--.

COLUMN 61

Line 30, "1701. The" should read --1701. ¶ The--.

UNITED STATES PATENT AND TRADEMARK OFFICE
CERTIFICATE OF CORRECTION

PATENT NO. : 5,520,740

DATED : May 28, 1996

INVENTORS : MASAHIRO KANAI ET AL.

It is certified that error appears in the above-identified patent and that said Letters Patent is hereby corrected as shown below:

COLUMN 64

Line 57, "in" should read --and--.

COLUMN 66

Line 9, "a" should be deleted.

COLUMN 75

Line 50, "by eyes." should read --by eye.--

COLUMN 76

Line 5, "chamber 102." should read --chamber 1102.--.

COLUMN 87

Table 2 "2.45 $GH_2$" should read --2.45 GHz--.

UNITED STATES PATENT AND TRADEMARK OFFICE
CERTIFICATE OF CORRECTION

PATENT NO. : 5,520,740

DATED : May 28, 1996

INVENTORS : MASAHIRO KANAI ET AL.

It is certified that error appears in the above-identified patent and that said Letters Patent is hereby corrected as shown below:

COLUMN 89

Table 6 "16  IEC, R-32   450 X 86" should read --16 IEC, R-32  470 X 72--.

COLUMN 97

Table 23 "applicator No. 2   13   2" should read --applicator No. 2   12   2--.

COLUMN 109

Table 32 "H$_z$ gas)" should read --H$_2$ gas)--.

COLUMN 111

Table 32 "50" should read --55--.

COLUMN 113

Line 38, "predetermined" should be deleted.

COLUMN 114

Line 26, "claim 1" should read --claim 1,--;
Line 32, "claim 3" should read --claims 3,--;

UNITED STATES PATENT AND TRADEMARK OFFICE
CERTIFICATE OF CORRECTION

PATENT NO. : 5,520,740

DATED : May 28, 1996

INVENTORS : MASAHIRO KANAI ET AL.

It is certified that error appears in the above-identified patent and that said Letters Patent is hereby corrected as shown below:

COLUMN 114

Line 38  "claim 5" should read --claim 5,--
  Line 54, "predetermined" should be deleted.

COLUMN 115

Line 15, "introducing-a" should read --introducing a--.

COLUMN 116

Line 2,  "claim 7" should read --claim 7,--;
  Line 6,  "comprise" should read --comprises--;
  Line 9,  "comprise" should read --comprises--;
  Line 11, "comprise" should read --comprises--;
  Line 14, "comprise" should read --comprises--.

Signed and Sealed this

Tenth Day of December, 1996

Attest:

BRUCE LEHMAN

Attesting Officer    Commissioner of Patents and Trademarks